(12) United States Patent
Yazami et al.

(10) Patent No.: US 9,551,759 B2
(45) Date of Patent: Jan. 24, 2017

(54) DEVICES FOR TESTING A BATTERY AND METHODS FOR TESTING A BATTERY

(71) Applicant: Nanyang Technological University, Singapore (SG)

(72) Inventors: Rachid Yazami, Singapore (SG); Kenza Maher, Singapore (SG)

(73) Assignee: Nanyang Technological University, Singapore (SG)

( * ) Notice: Subject to any disclaimer, the term of this patent is extended or adjusted under 35 U.S.C. 154(b) by 0 days.

(21) Appl. No.: 14/345,632

(22) PCT Filed: Sep. 19, 2012

(86) PCT No.: PCT/SG2012/000342
§ 371 (c)(1),
(2) Date: Mar. 18, 2014

(87) PCT Pub. No.: WO2013/043123
PCT Pub. Date: Mar. 28, 2013

(65) Prior Publication Data
US 2014/0354233 A1    Dec. 4, 2014

Related U.S. Application Data

(60) Provisional application No. 61/536,239, filed on Sep. 19, 2011.

(51) Int. Cl.
| | |
|---|---|
| H02J 7/00 | (2006.01) |
| G01R 31/36 | (2006.01) |
| H01M 10/42 | (2006.01) |
| H01M 10/615 | (2014.01) |
| H01M 10/613 | (2014.01) |

(52) U.S. Cl.
CPC ....... *G01R 31/3634* (2013.01); *G01R 31/3648* (2013.01); *G01R 31/3679* (2013.01);
(Continued)

(58) Field of Classification Search
CPC ... Y02E 60/12; Y02E 60/122; G01R 31/3634; G01R 31/3679; H02J 7/0052; H02J 7/0063
(Continued)

(56) References Cited

U.S. PATENT DOCUMENTS 6,265,844 B1 * 7/2001 Wakefield ........... H04M 1/0262
                                                    320/107
7,126,310 B1 * 10/2006 Barron ................. H02J 7/0016
                                                    320/108
(Continued)

FOREIGN PATENT DOCUMENTS

EP    1 107 344 A1    6/2001

OTHER PUBLICATIONS

McMenamin et al., "Using Electrochemical Thermodynamic Measurements to Detect Effects of Battery Aging," Lithium Mobile Power, Las Vegas, Dec. 8, 2008, 22 pages.
(Continued)

*Primary Examiner* — Paul Dinh
(74) *Attorney, Agent, or Firm* — Seed IP Law Group LLP

(57) ABSTRACT

In various embodiments, a device for testing a battery may be provided. The device for testing a battery may include: a determination circuit configured to determine at least one of a differential enthalpy of the battery and a differential entropy of the battery; and an evaluation circuit configured to evaluate a health state of the battery based on the determined at least one of the differential enthalpy and the differential entropy.

30 Claims, 51 Drawing Sheets

(52) U.S. Cl.
CPC ... *H01M 10/4257* (2013.01); *H01M 10/4285* (2013.01); *H02J 7/0052* (2013.01); *H02J 7/0063* (2013.01); *G01R 31/3627* (2013.01); *H01M 10/613* (2015.04); *H01M 10/615* (2015.04)

(58) Field of Classification Search
USPC ............... 320/127, 137, 143–144, 148–151, 320/161–162; 324/426–427
See application file for complete search history.

(56) References Cited

U.S. PATENT DOCUMENTS

| | | |
|---|---|---|
| 7,595,611 B2 | 9/2009 | Reynier et al. |
| 2005/0093512 A1* | 5/2005 | Mader ............... H01M 10/42 320/116 |
| 2008/0316665 A1* | 12/2008 | Masiuk ............. H02J 7/0031 361/89 |
| 2010/0090650 A1 | 4/2010 | Yazami et al. |

OTHER PUBLICATIONS

Reynier et al., "The entropy and enthalpy of lithium intercalation into graphite," *Journal of Power Sources* 119-121:850-855, 2003.
Reynier et al., "Entropy of Li intercalation in $Li_xCoO_2$," *Physical Review B* 70(17):2004, 7 pages.
Reynier et al., "Evolution of lithiation thermodynamics with the graphitization of carbons," *Journal of Power Sciences* 165(2):552-558, 2007.
Reynier et al. "Thermodynamics of Lithium Intercalation into Graphites and Disordered Carbons," *Journal of the Electrochemical Society* 151(3):A422-A426, 2004.

* cited by examiner

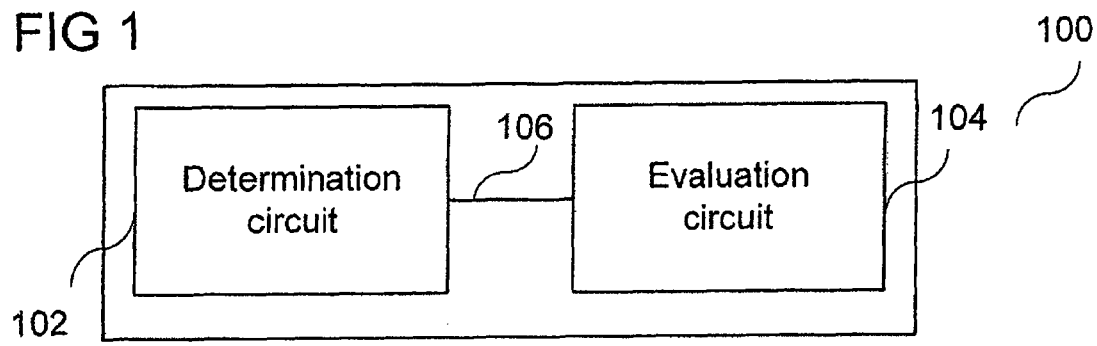
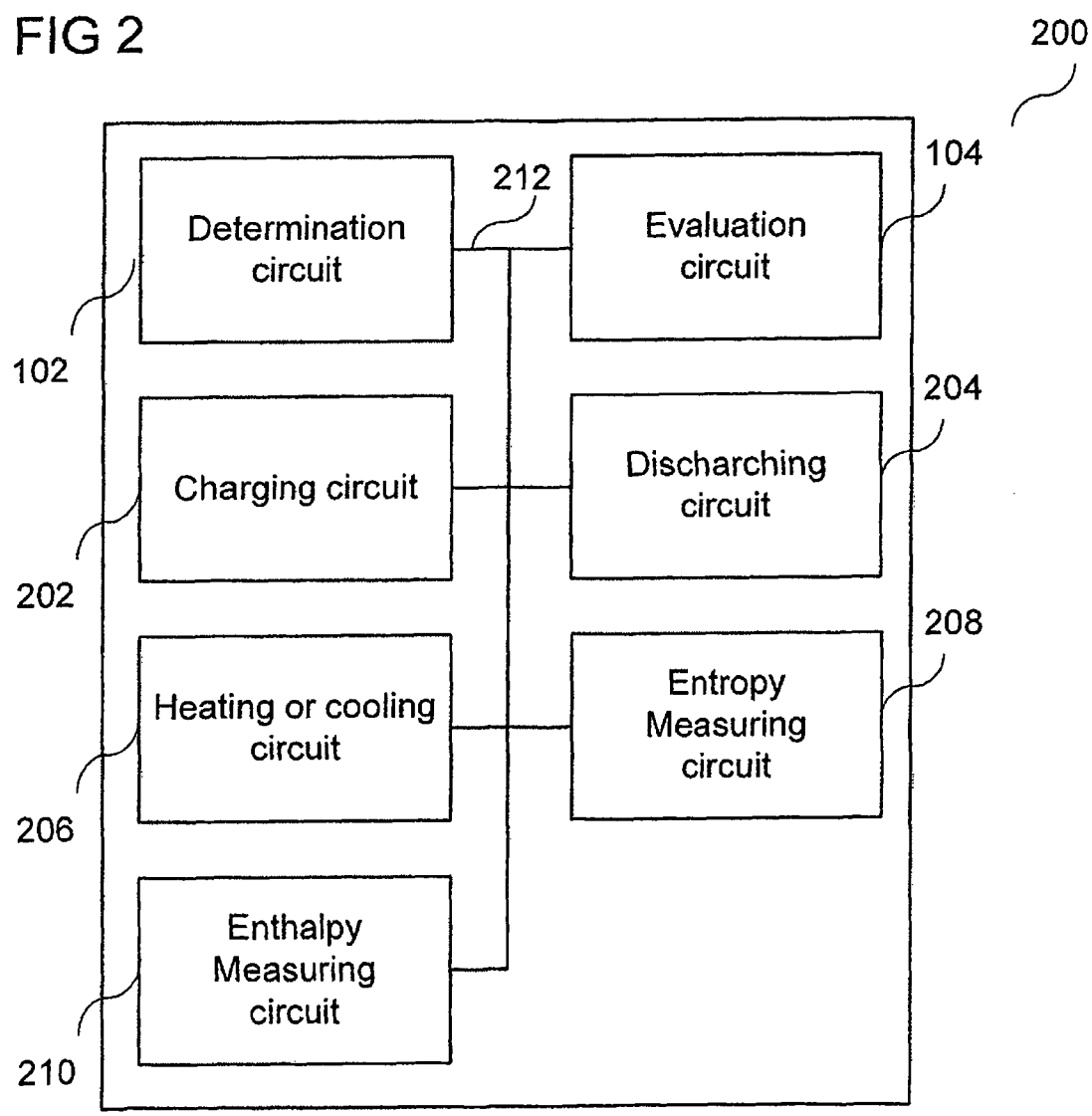

FIG 13A
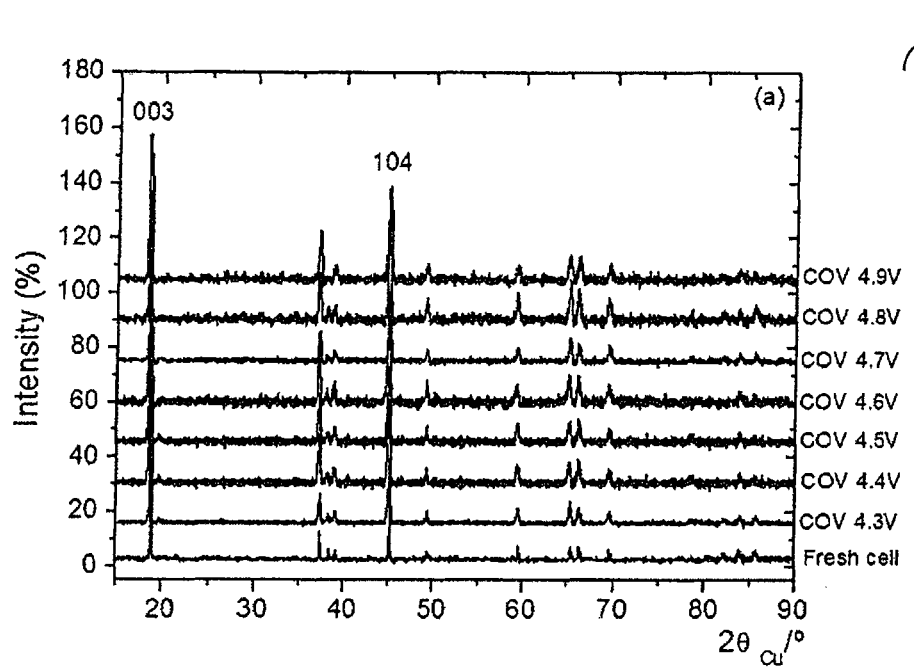
FIG 13B
FIG 13C
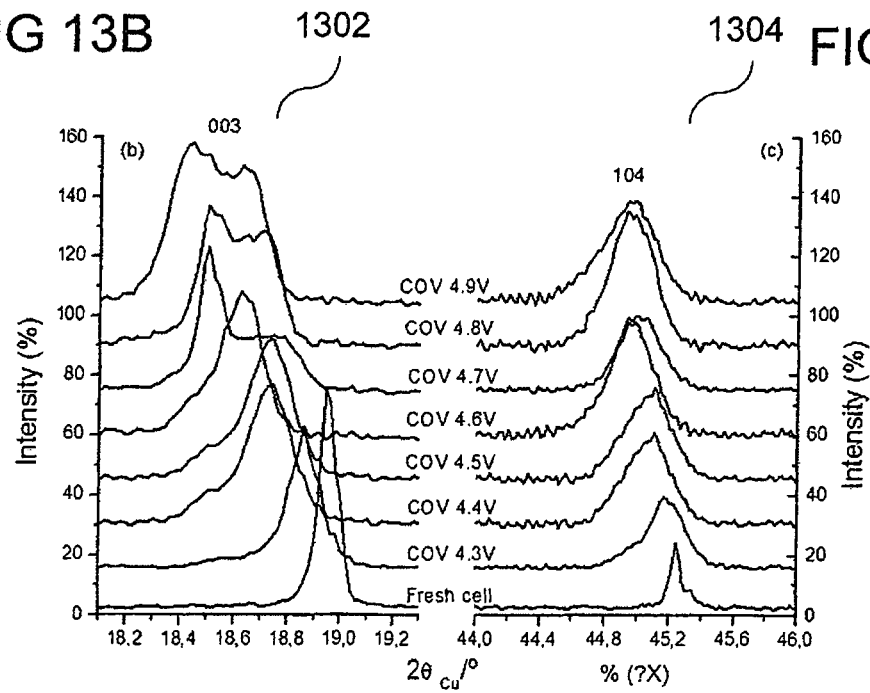

3800

3900

DEVICES FOR TESTING A BATTERY AND METHODS FOR TESTING A BATTERY

CROSS-REFERENCE TO RELATED APPLICATIONS

The present application claims the benefit of the U.S. Provisional Patent Application No. 61/536,239 filed on 19 Sep. 2011, the entire contents of which are incorporated herein by reference for all purposes.

TECHNICAL FIELD

Embodiments relate to devices for testing a battery and methods for testing a battery.

BACKGROUND

Batteries are key components in electrical energy storage and power sources in mobile electronics, electric cars, smart grids, and many more. The worldwide battery market is expanding due to increasing demand. Lithium ion batteries (LIBs) are the choice system in most applications due to higher performance compared to other batteries. However, LIB may undergo thermal runaway and eventually catch fire and explode under special conditions, posing serious safety issues. Batteries with deteriorated state of heath may be more prone to thermal runaways. Thus, it may be crucial to know the SOH (state of health) of a battery in the course of cycle life. Current Battery Management Systems (BMS) may not allow the SOH of batteries to be assessed accurately, therefore there are more and more reports on batteries thermal events including in laptop computers, cell phones and electric cars. Thus, there is a need for an improved battery testing.

SUMMARY

In various embodiments, a device for testing a battery may be provided. The device for testing a battery may include: a determination circuit configured to determine at least one of a differential enthalpy of the battery and a differential entropy of the battery; and an evaluation circuit configured to evaluate a health state of the battery based on the determined at least one of the differential enthalpy and the differential entropy.

In various embodiments, a method for testing a battery may be provided. The method for testing a battery may include: determining at least one of a differential enthalpy of the battery and a differential entropy of the battery; and evaluating a health state of the battery based on the determined at least one of the differential enthalpy and the differential entropy.

BRIEF DESCRIPTION OF THE DRAWINGS

In the drawings, like reference characters generally refer to the same parts throughout the different views. The drawings are not necessarily to scale, emphasis instead generally being placed upon illustrating the principles of various embodiments. In the following description, various embodiments of the invention are described with reference to the following drawings, in which:

FIG. 1 shows a device for testing a battery according to various embodiments;

FIG. 2 shows a device for testing a battery according to various embodiments;

FIG. 13A show a full pattern of X-ray diffraction patterns of $LiCoO_2$ before and after overcharge;

FIG. 13B shows diffraction patterns of FIG. 13 A with a peak area;

FIG. 13C shows diffraction patterns of FIG. 13 A with another peak area;

DESCRIPTION

Figure 3:
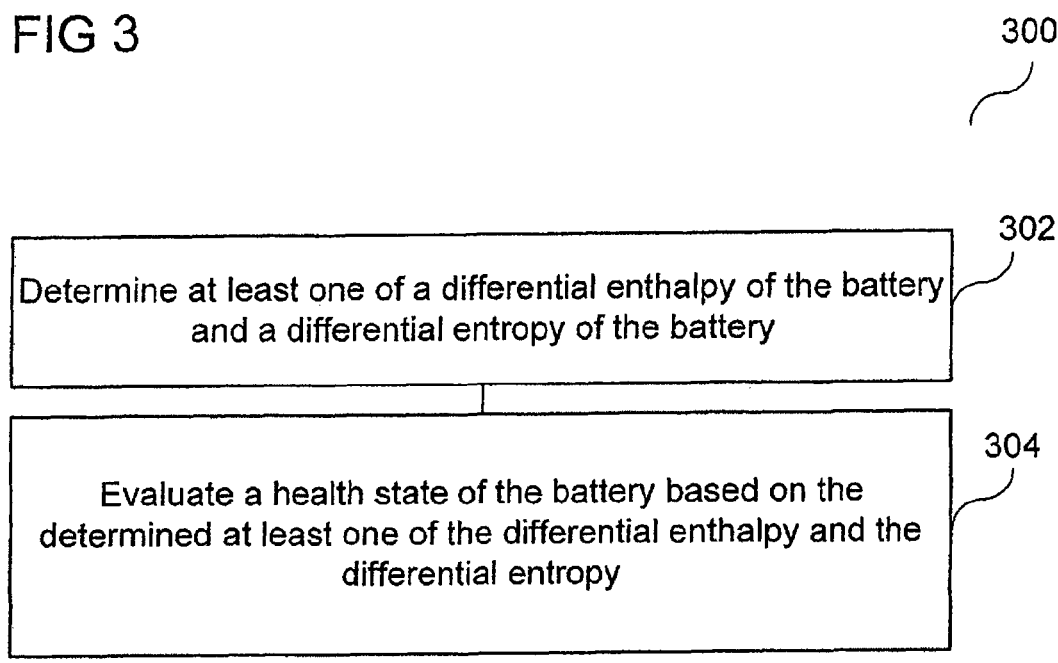
FIG. 3 shows a flow diagram illustrating a method for testing a battery according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments may be combined with one or more other embodiments to form new embodiments.

The device for testing a battery may include a memory which is for example used in the processing carried out by the device for testing a battery. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In an embodiment the device is a chip imbedded in the battery.

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. A circuit may also be an imbedded chip inside the battery cell or the battery pack. Any other kind of implementation of the respective functions which will be described in more detail below may also be understood as a "circuit" in accordance with an alternative embodiment.

It will be understood that the terms "battery" and "cell" may be used interchangeable herein.

A "battery" may consist of a single cell or of cells arrangement in series and in parallel to form a battery module or a battery pack.

A "battery" may include a primary (non rechargeable) and a secondary (rechargeable) battery, including but not limited to lithium primary batteries such as $Li/MnO_2$ and $Li/CFx$, $Zn/MnO_2$ saline and alkaline battery, Zinc-Silver battery, Zinc-nickel battery, nickel-metal hydride battery, nickel-cadmium battery, lithium ion battery and lead acid battery. High temperature and reserve batteries such as sodium sulfur, sodium-$NiCl_2$ and magnesium batteries also apply in this embodiment.

The word "exemplary" is used herein to mean "serving as an example, instance, or illustration". Any embodiment or design described herein as "exemplary" is not necessarily to be construed as preferred or advantageous over other embodiments or designs.

Various embodiments are described for devices, and various embodiments are described for methods. It will be understood that a property described for a method may also hold for the respective device, and vice versa.

FIG. 1 shows a device 100 for testing a battery in accordance with various embodiments. The device 100 may include a determination circuit 102 configured to determine at least one of a differential enthalpy of the battery and a differential entropy of the battery. The device 100 may further include an evaluation circuit 104 configured to evaluate a health state of the battery based on the determined at least one of the differential enthalpy and the differential entropy. The determination circuit 102 and the evaluation circuit 104 may be coupled by a coupling 106, for example by an electrical coupling or by an optical coupling, for example a cable or a bus.

FIG. 2 shows device 200 for testing a battery in accordance with various embodiments. The device 200 may, similar to the device 100 of FIG. 1, include a determination circuit 102 configured to determine at least one of a differential enthalpy of the battery and a differential entropy of the battery. The device 100 may, similar to the device 100 of FIG. 1, further include an evaluation circuit 104 configured to evaluate a health state of the battery based on the determined at least one of the differential enthalpy and the differential entropy. The device 200 may further include a charging circuit 202, like will be described in more detail below. The device 200 may further include a discharging circuit 204, like will be described in more detail below. The device 200 may further include a heating and/or cooling circuit 206, like will be described in more detail below. The device 200 may further include an entropy measuring circuit 208, like will be described in more detail below. The device 200 may further include an enthalpy measuring circuit 210, like will be described in more detail below. The determination circuit 102, the evaluation circuit 104, the charging circuit 202, the discharging circuit 204, the heating circuit 206, the entropy measuring circuit 208, and the enthalpy measuring circuit 210 may be coupled by a coupling 212, for example by an electrical coupling or by an optical coupling, for example a cable or a bus.

According to various embodiments, the charging circuit 202 may be configured to charge the battery.

According to various embodiments, the discharging circuit 204 may be configured to discharge the battery.

According to various embodiments, the heating circuit 206 may be configured to heat the battery.

According to various embodiments, the entropy measuring circuit 208 may be configured to measure an entropy of the battery.

According to various embodiments, the enthalpy measuring circuit 210 may be configured to measure an enthalpy of the battery.

According to various embodiments, the entropy measuring circuit 208 may be configured to measure an entropy of a new battery and to measure an entropy of a used battery. According to various embodiments, the determination circuit 102 may further be configured to determine the differential entropy of the battery based on the measurement of the entropy of the new battery and the measurement of the entropy of the used battery.

According to various embodiments, the enthalpy measuring circuit 210 may be configured to measure an enthalpy of a new battery and to measure an enthalpy of a used battery. According to various embodiments, the determination circuit 102 may further be configured to determine the differential enthalpy of the battery based on the measurement of the enthalpy of the new battery and the measurement of the enthalpy of the used battery.

According to various embodiments, the determination circuit 102 may be configured to determine derivative enthalpies of the battery for a plurality of charging states of the battery. According to various embodiments, the evaluation circuit 104 may be configured to evaluate the health state of the battery based on the determined derivative enthalpies of the battery for the plurality of charging states of the battery.

According to various embodiments, the determination circuit 102 may be configured to determine derivative entropies of the battery for a plurality of charging states of the battery. According to various embodiments, the evaluation circuit 104 may be configured to evaluate the health state of the battery based on the determined derivative entropies of the battery for the plurality of charging states of the battery.

According to various embodiments, the determination circuit 102 may be configured to determine differential enthalpies of the battery for a plurality of charging states of the battery. According to various embodiments, the evaluation circuit 104 may be configured to evaluate the health state of the battery based on the determined differential enthalpies of the battery for the plurality of charging states of the battery.

According to various embodiments, the determination circuit 102 may be configured to determine differential entropies of the battery for a plurality of charging states of the battery. According to various embodiments, the evaluation circuit 104 may be configured to evaluate the health state of the battery based on the determined differential entropies of the battery for the plurality of charging states of the battery.

According to various embodiments, the device may include or may be a chip.

According to various embodiments, the chip may be embedded (or imbedded) in the battery (in other words: in the cell).

According to various embodiments, the chip may be embedded (or imbedded) in a battery module, for example a battery module including the battery.

According to various embodiments, the chip may be embedded (or imbedded) in a battery pack, for example a battery pack including the battery.

FIG. 3 shows a flow diagram 300 illustrating a method for testing a battery according to various embodiments. In 302, at least one of a differential enthalpy of the battery and a differential entropy of the battery may be determined. In 304, a health state of the battery may be evaluated based on the determined at least one of the differential enthalpy and the differential entropy.

According to various embodiments, the method may further include charging the battery.

According to various embodiments, the method may further include discharging the battery.

According to various embodiments, the method may further include heating the battery.

According to various embodiments, the method may further include measuring an entropy of the battery.

According to various embodiments, the method may further include measuring an enthalpy of the battery.

According to various embodiments, the method may further include measuring an entropy of a new battery, measuring an entropy of a used battery, and determining the differential entropy of the battery based on the measurement of the entropy of the new battery and the measurement of the entropy of the used battery.

According to various embodiments, the method may further include measuring an enthalpy of a new battery, measuring an enthalpy of a used battery, and determining the differential enthalpy of the battery based on the measurement of the enthalpy of the new battery and the measurement of the enthalpy of the used battery.

According to various embodiments, the method may further include determining derivative enthalpies of the battery for a plurality of charging states of the battery and evaluating the health state of the battery based on the determined derivative enthalpies of the battery for the plurality of charging states of the battery.

According to various embodiments, the method may further include determining derivative entropies of the battery for a plurality of charging states of the battery and evaluating the health state of the battery based on the determined derivative entropies of the battery for the plurality of charging states of the battery.

According to various embodiments, the method may further include determining differential enthalpies of the battery for a plurality of charging states of the battery and evaluating the health state of the battery based on the determined differential enthalpies of the battery for the plurality of charging states of the battery.

According to various embodiments, the method may further include determining differential entropies of the battery for a plurality of charging states of the battery and evaluating the health state of the battery based on the determined differential entropies of the battery for the plurality of charging states of the battery.

According to various embodiments, devices and methods may be provided for determining an effect of overcharge on entropy and enthalpy of lithium-ion batteries (LIB).

According to various embodiments, the evolution of the thermodynamics behavior and of the crystal structure of electrodes materials of lithium-ion batteries based on graphite anode and lithium cobalt oxide (LCO) cathode may be investigated after applying high voltage charging between 4.2 V and 4.9 V cut-off voltages (COV). It may be found that the entropy and enthalpy profiles may vary dramatically with the applied COV. These changes may correlate well with the anode and the cathode crystal structure degradation as evidenced by post-mortem x-ray diffractometry and Raman scattering spectrometry.

Furthermore, according to various embodiments, it may be found that thermodynamics measurements may be used as a new and non-destructive investigation tool to characterize the degradation level of electrode materials and consequently assess the cell's state of health (SOH). It will be understood that the terms "state of health" and "health state" may be used interchangeably herein.

According to various embodiments, devices and methods may be related to thermodynamics, entropy, enthalpy, high voltage charge, and lithium ion batteries.

Electrochemical thermodynamics measurements (ETM) methods and tools have been developed which have been applied to lithium battery half-cells to analyze anode and cathode materials. The method may include monitoring the evolution of the cell open-circuit voltage (OCV), '$E_0$', with the cell temperature, 'T', at different states of charge (SOC). The later may correspond to the lithium stoichiometry in the anode and the cathode, 'x', in $Li_xC_6$ and $Li_{1-x}CoO_2$, respectively. The entropy $\Delta S(x)$ and enthalpy $\Delta H(x)$ state functions may be computed from the general thermodynamics laws, wherein F may be the Faraday number:

$$\Delta S(x) = F \frac{\partial E_0(x)}{\partial T} \quad \text{Eq. 1}$$

$$\Delta H(x) = -F\left(E_0 + T\frac{\partial E_0(x)}{\partial T}\right) \quad \text{Eq. 2}$$

Full lithium ion batteries (coin cells 2032) have been subjected to overcharge between 4.3V and 4.9V COV, a process which may accelerate the cell's storage performances resulting from electrodes and electrolyte materials degradation.

The cells ageing and the changes in the ΔS(x) and ΔH(x) profiles have been followed as function of the COV. Results show that important changes took place in the cell's thermodynamics behavior which may correlate well with increased anode and cathode materials degradation with COV. These results are supported by post-mortem x-ray diffraction (XRD) and Raman spectrometry analyses.

In the following, experimental results according to various embodiments will be described.

Lithium ion coin cells (LIR 2032) rated about 40 mAh were subjected to the following test steps: high voltage ageing and thermodynamics measurements.

In the first step of high voltage ageing, a first set of cells were cycled with an Arbin Instruments battery cycler at the ambient temperatures in two steps:

(i) discharge at C/4-rate (wherein C may be the capacity of the cell, for example 40 mAh; then a C/4-rate may be a current of ¼ of the capacity divided by hours, for example 10 mA for a 40 mAh cell) to 2.75 V and, (ii) charge to a set COV at C/4-rate. For each test cell, the COV was incremented by 100 mV from 4.2 V to 4.9 V. Once the COV reached, the cell is set to rest.

This first set of test cells will be designed hereafter "COV1".

The second set of cells were subjected to steps (i) and (ii), except at the end of step (ii), constant COV was maintained for 1 hour for further cells ageing. This second set of cells will be denoted "COV2".

In step (iii), cells of COV1 and COV2 sets were further discharged to 2.75V at C/4 rate. Then in step (iv), the cells were charged to 4.2V and re-discharged to 2.75V at the same C/4 rate.

The charge (C) and discharge (D) capacities achieved in steps (ii), (iii) and (iv) are hereafter designed $q_{C2}$, $q_{D3}$ and $q_{D4}$, respectively.

In the second step of thermodynamics measurements, discharged cells after step (iv) were transferred to the Electrochemical Thermodynamics Measurements System (ETMS, BA-1000®, KVI PTE LTD, Singapore). Cells may undergo a "conditioning" cycle in which they are charged to 4.2V and discharged to 2.75V to determine their actual capacity. Then the cells may be charged step-by-step up to 4.2V. At each increment the SOC was increased by 5% by applying a constant current (for example about 6 mA) for an appropriate duration time (for example about 20 min). The actual current and time are fixed by the ETMS according to the number of data points set by the user and the cell rated capacity determined in the conditioning step. For example, the number of data points may be fixed, for example to 21; thus covering the full range of SOC from 0 to 100% by 5% increments.

At each SOC, the cell temperature T may automatically be cooled from the ambient temperature of about 25° C. to 10° C. by about 5° C. increments while the OCV may be monitored until it stabilized at a set T. The BA-1000 instrument may convert $E_0(x,T)$ data to ΔS(x) and ΔH(x) data according to Eq. (1) and (2), respectively.

In all COV1 and COV2 tests, two test cells may be used to check for reproducibility.

At the end of the ETM tests described above, cells may be discharged to 2.75V. Selected cells at their discharge state may be opened in a glove box filled with argon; the anode and the cathode may be retrieved and washed with DMC, and then they may be dried in argon and in vacuum at the ambient temperatures. Electrode materials may then be analyzed by XRD and by Raman scattering spectrometry.

In the following, electrochemical cycling data will be described.

Figure 4:
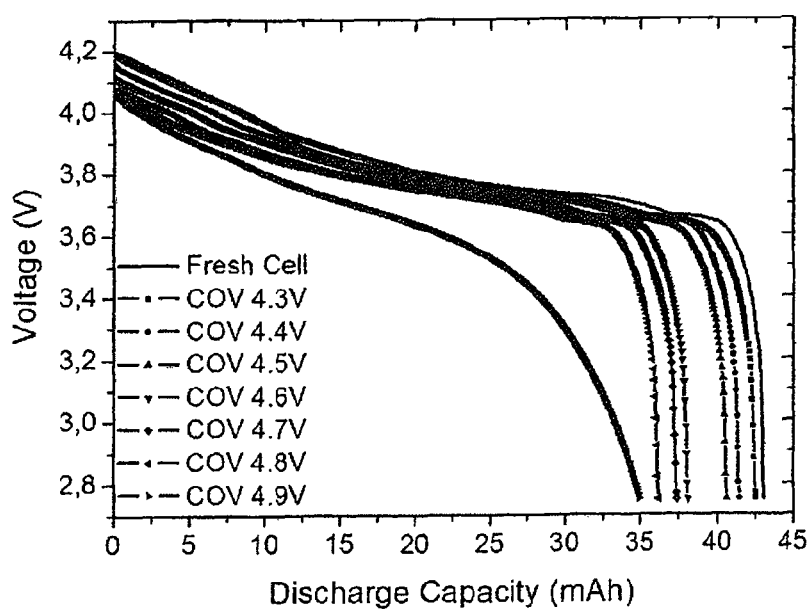
FIG. 4 shows discharge profiles of battery cells subjected to different charge cut-off voltages.

FIG. 4 shows discharge profiles 400 of LIB cells subjected to different charge cut-off voltages (COV). FIG. 4 shows the discharge profiles at step (iv) of COV2 test cells between 4.2V and 2.75V under C/4 rate (10 mA). Both the discharge voltage and the discharge capacity decreased as result of overcharging suggesting increased cells' polarization and electrodes structure degradation. Table 1 displays the charge and discharge test results including $q_{C2}$, $q_{D3}$, $q_{D4}$ together with $<e_{C2}>$ and $<e_{D4}>$, the average charge and discharge voltages of steps (ii) and (iv), respectively. Table 1 also shows the discharge capacity loss (%) between step (i) and step (iv) for the COV2 tests cells.

| COV (V) | $q_{C2}$ (mAh) | $<e_{C2}>$ (V) | $q_{D3}$ (mAh) | $q_{D4}$ (mAh) | $<e_{D4}>$ (V) | $q_{CL}$ (%) |
|---|---|---|---|---|---|---|
| 4.2 | 43.91 | 3.88 | 43.60 | 43.07 | 3.82 | 0 |
| 4.3 | 46.67 | 3.93 | 45.47 | 42.51 | 3.81 | 1.30 |
| 4.4 | 49.37 | 3.97 | 47.54 | 41.44 | 3.80 | 3.78 |
| 4.5 | 53.13 | 4.01 | 50.43 | 40.62 | 3.78 | 5.69 |
| 4.6 | 64.44 | 4.11 | 59.94 | 38.09 | 3.77 | 11.56 |
| 4.7 | 72.99 | 4.17 | 65.71 | 37.35 | 3.76 | 13.28 |
| 4.8 | 72.78 | 4.20 | 64.35 | 36.16 | 3.77 | 16.04 |
| 4.9 | 72.53 | 4.28 | 63.86 | 34.90 | 3.62 | 18.97 |

Table-1:
LIB cells charge and discharge data vs. COV where $q_{C2}$, $q_{D3}$, $q_{D4}$ refer to charge (C) and discharge (D) capacity during steps (ii), (iii) and (iv), respectively, $<e_{C2}>$ and $<e_{D4}>$ may refer to the average charge and discharge voltage at steps (ii) and (iv), respectively, and $q_{CL}$ refer to the discharge capacity loss (in %) between step (i) and step (iv).

The charge capacity $q_{C2}$ increased dramatically between 4.2V and 4.9V COV. This may denote a partial delithiation of the LCO cathode and most likely some electrolyte oxidative decomposition. Similarly the discharge capacity $q_{D3}$ increased with COV. Moreover, the cycle efficiency between $q_{C2}$ and $q_{D3}$ deceased significant to reach 88% at 4.9V.

The discharge capacity loss $q_{CL}$ shown in Table 1 also increased with COV to reach about 19% at 4.9V. At 19% capacity loss may occur, which may correlate with the cell' end of life.

The capacity loss $q_{CL}$ has been fitted vs. the COV with an empirical polynomial function and found a 99.2% good fit with the following equation:

$$q_{CL}(\%) = 35.47 - 40.12(COV) + 7.56(COV)^2 \qquad \text{Eq. 3}$$

Noteworthy is the about 100% increase in $q_{CL}$ between 4.5V and 4.6V COV.

In the following, thermodynamics will be described, starting with open circuit voltage (OCV).

Figure 5:
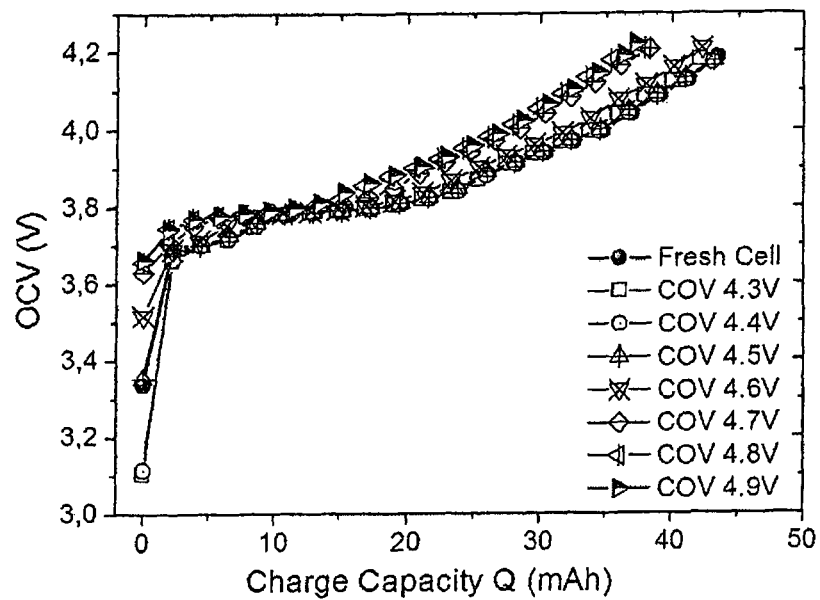
FIG. 5 shows open-current voltage profiles of battery cells versus the charge capacity during charge, wherein the cells were subjected to different cut-off voltages.

FIG. 5 shows OCV profiles 500 of LIB cells versus the charge capacity during charge. Cells were subjected to different COV. FIG. 5 shows the OCV profiles versus the charge capacity during step (iv). Differences in OCV values can be seen at the zero state of charge and for cells charged between 4.2V and 4.6V COV on one hand and for those charged between 4.7V and 4.9V on the other hand.

The initial OCV at zero state of charge increased with the COV. This may indicate the presence of a partly de-lithiated cobalt oxide phase ($Li_{1-x}CoO_2$) in the cathode material, despite cells were discharged to 2.75 V. The rate of lithium deficiency 'x' probably increases with COV thus leading to higher initial OCV. Accordingly, even when aged cells are discharged to 2.75V, there should be a residual delithiated phase in the cobalt oxide cathode and associated lithiated phase in the graphite anode. This statements will be later supported by ex-situ XRD and Raman analyses.

The OCV traces in FIG. 5 may split in two sets; a first set where 4.2V≤COV≤4.6V and a second set where 4.7V≤COV≤4.9V, the later set exhibiting higher OCV values. This may indicate a higher heterogeneous character of degraded cathodes for COV equal to or higher than 4.7 V, which may correlate well with the striking decrease in the discharge capacity $q_{D4}$ above 4.6 V COV as showed in FIG. 4 and in Table 1.

In the following, entropy and enthalpy profiles will be described, starting with fresh cells (in other words: new cells).

Figure 6:
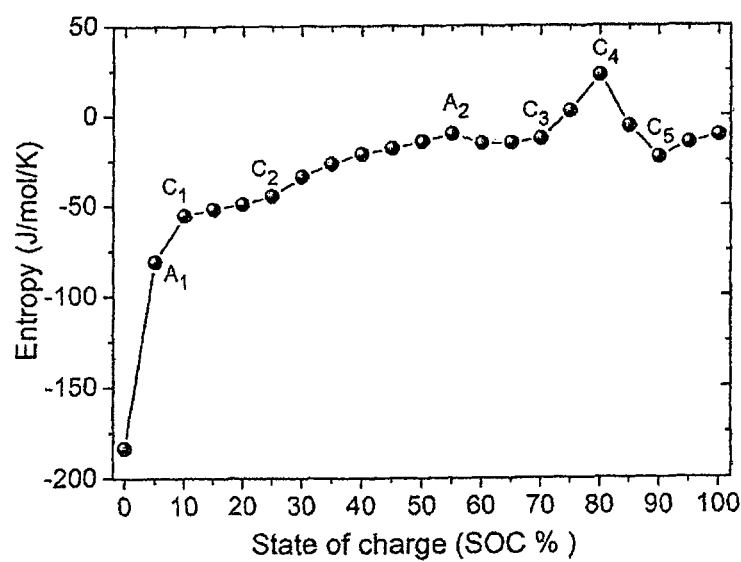
FIG. 6 shows a diagram illustrating entropy profile vs. state-of-charge of a fresh cell during $1^{st}$ charge.

FIG. 6 shows a diagram 600 illustrating an entropy profile vs. SOC of a fresh cell during $1^{st}$ charge. The $A_i$ and $C_i$ points correspond to phase transitions in the graphite anode and the lithium cobalt oxide cathode, respectively.

Figure 7:
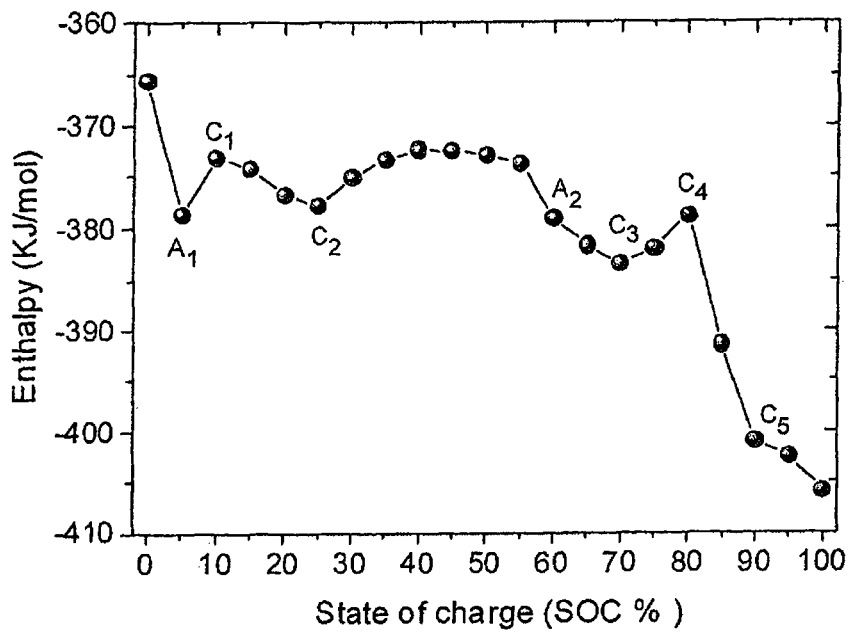
FIG. 7 shows diagram illustrating enthalpy profile vs. state-of-charge of a fresh cell during $1^{st}$ charge.

FIG. 7 shows a diagram 700 illustrating an enthalpy profile vs. SOC of a fresh cell during $1^{st}$ charge. The $A_i$ and $C_i$ points correspond to phase transitions in the graphite anode and the lithium cobalt oxide cathode, respectively. Typical entropy and enthalpy profiles of a cell cycled between 2.75 V and 4.2 V (fresh cells) are displayed in FIG. 6 and FIG. 7, respectively. The curves show changes in slope together with minima and maxima values. Those changes may be associated with onsets of electrode processes taking place at the anode and cathode materials, such as phase transitions.

Using previous thermodynamics data achieved in Li/Li$_x$C$_6$ (graphite) and in Li/Li$_x$CoO$_2$ half-cells, it may be found that the entropy and enthalpy profiles shown in FIG. 6 and FIG. 7, respectively, fit well with a full cell consisting of the graphite anode and a lithiated cobalt oxide cathode. The entropy and enthalpy of a full cell may result from the arithmetic difference between the corresponding states functions in the cathode and in the anode according to:

$$\Delta S(\text{full cell}) = \Delta S(\text{cathode}) - \Delta S(\text{anode}) \quad \text{Eq. 4}$$

and $$\Delta H(\text{full cell}) = \Delta H(\text{cathode}) - \Delta H(\text{anode}) \quad \text{Eq. 5}$$

Therefore, any change in ΔS and ΔH profiles that take place in the anode and the cathode may reflect in the ΔS and ΔH profile of the full cell. In the case of the graphite anode, changes in the ΔS and ΔH profiles may go together with staging in Li$_x$C$_6$, whereas as in the case of the lithiated cobalt oxide cathode, changes in thermodynamics data may relate to a succession of phase transitions involving hexagonal phases and the monoclinic phase. The onsets of phase transitions in the anode and the cathode are indicated in FIG. 6 and FIG. 7 by $A_i$ and $C_i$ letters, respectively. For example, the stage 2-stage1 transition in graphite that takes place at x=0.5 in Li$_x$C$_6$ may correspond to A$_2$, whereas the transition from hexagonal phase to a monoclinic phase that takes place at Li$_{0.55}$CoO$_2$ is marked C$_4$ in the Figures.

One aspect of accurate electrochemical thermodynamics (ETM) measurements is that they allow the anode and the cathode chemistry of a full cell to be determined without a need to open it and analyze the electrode materials. ETM is a non-destructive analysis tool that applies in much more convenient way to reveal cells chemistry as compared with other heavier and more expensive high energy diffraction and spectrometry techniques such as those using X-ray, gamma and neutron radiations.

In the following, aged cells will be described, starting with COV1 vs. COV2 tests, like will be described in more detail below.

Figure 8:
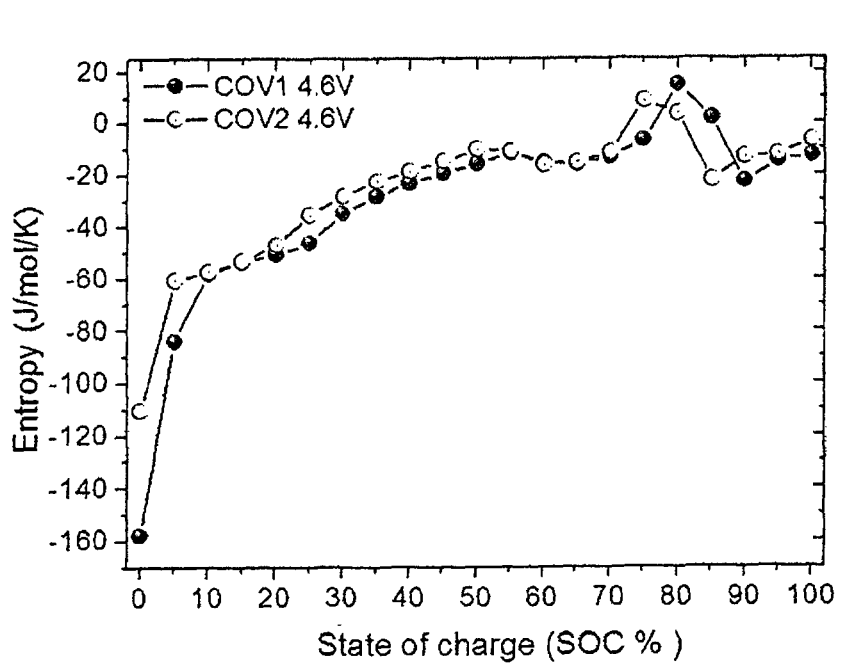
FIG. 8 shows a comparison of entropy profiles of cut-off-voltage tests at 4.6 V.

FIG. 8 shows a comparison 800 of entropy profiles of COV1 and COV2 tests at 4.6 V.

Figure 9:
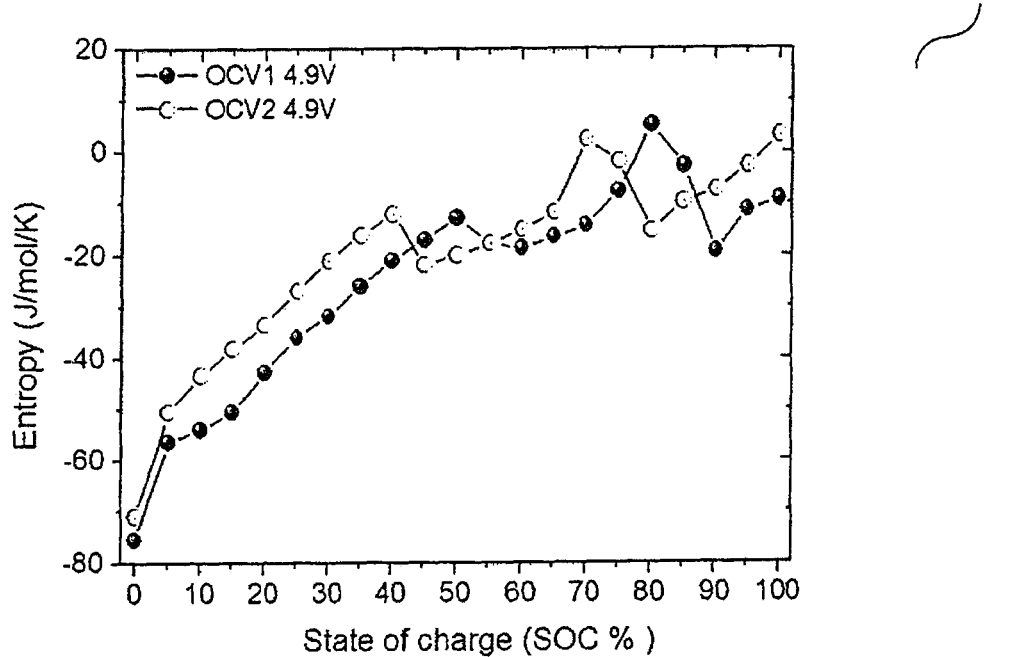
FIG. 9 shows a comparison of entropy profiles of cut-off-voltage tests at 4.9 V.

FIG. 9 shows a comparison 900 of entropy profiles of COV1 and COV2 tests at 4.9 V.

In order to evaluate the effect of extended cells exposure to high voltage on the thermodynamics properties, the entropy profiles of cells that have undergone COV1 and COV2 ageing protocols at COV of 4.6V and 4.9V, respectively, are shown in FIG. 8 and FIG. 9. FIG. 8 (COV=4.6V) shows only a minor change in the entropy profile consisting particularly of a slight shift in the peak position around 80% SOC. On contrast, the curves in FIG. 9 (COV=4.9V) show a much pronounced shift towards lower SOC values for the COV2 cells. A larger shift in COV2 vs. COV1 entropy curves denotes stronger electrode material degradation when cells are exposed to higher voltages for longer durations.

In the following, COV2 series will be described. Entropy and enthalpy results will be shown only for cells aged under the COV2 ageing protocol only.

Figure 10:
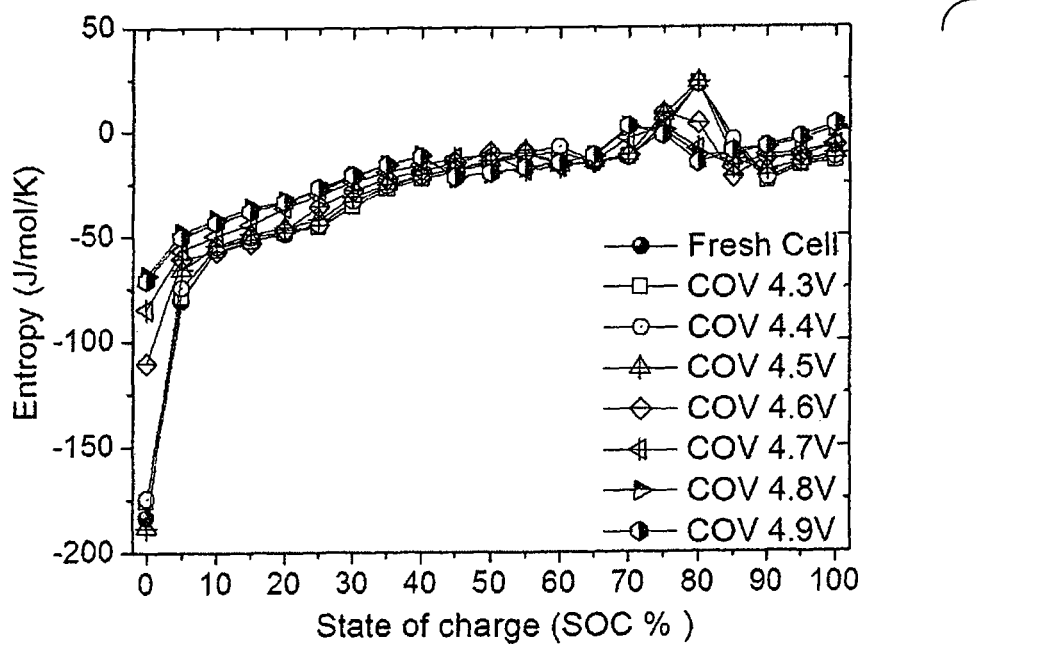
FIG. 10 shows entropy profiles at different charge cut-off voltages.

FIG. 10 shows entropy profiles 1000 at different charge cut-off voltages.

Figure 11:
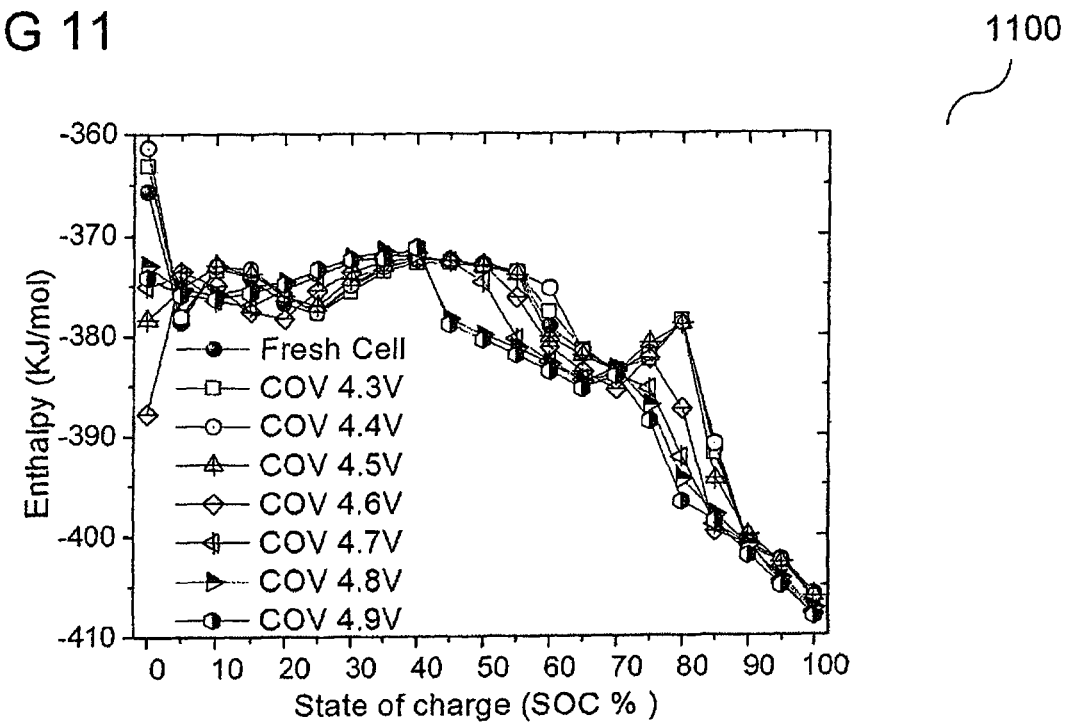
FIG. 11 shows enthalpy profiles at different charge cut-off voltages.

FIG. 11 shows enthalpy profiles 1100 at different charge cut-off voltages.

FIG. 10 and FIG. 11 compile the entropy and enthalpy profiles vs. SOC, respectively. Noticeable changes in the entropy and enthalpy profiles occur in the following SOC areas: 0%, about 5% and in about 60% to about 90%, in particular at the C$_2$ peak around 80% SOC. The higher resolution in the enthalpy profiles of FIG. 11 in the 40% to 70% SOC area as compared to the entropy ones of FIG. 10 are to be noted.

Figure 12:
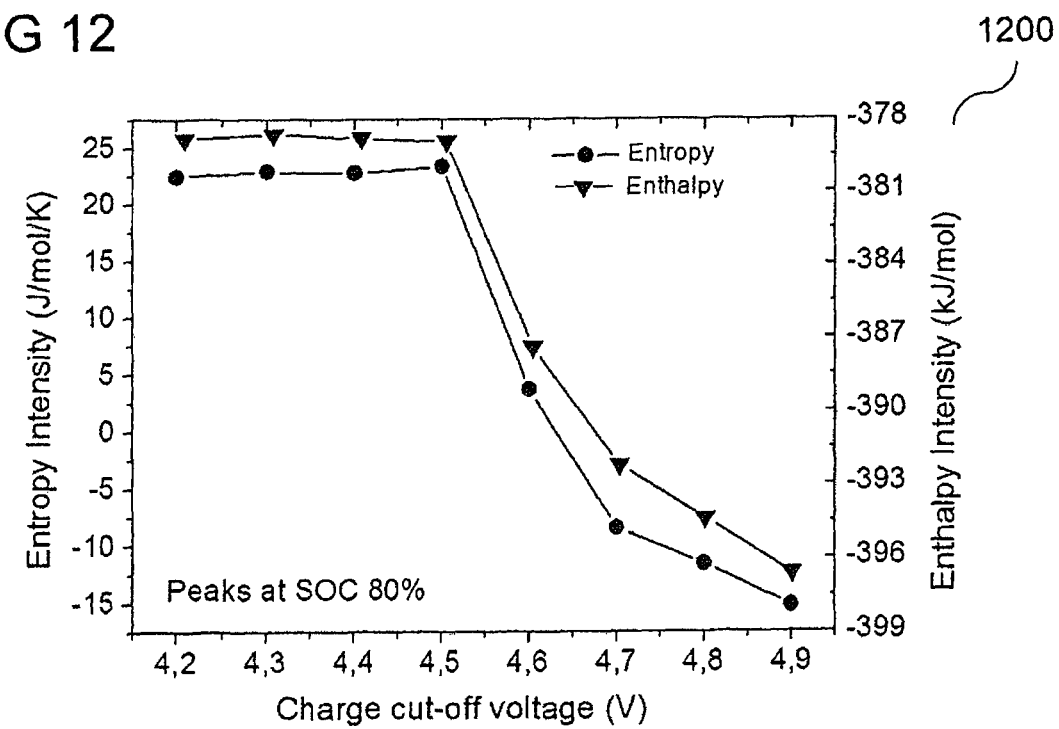
FIG. 12 shows an evolution of the entropy and enthalpy peaks intensity at 80% SOC with charge cut-off voltage.

FIG. 12 shows an evolution 1200 of the entropy and enthalpy peaks intensity at 80% SOC with charge cut-off voltage. For the C$_2$ peak at 80% SOC, the entropy and enthalpy peak intensity traces vs. COV are depicted in FIG. 12. In both entropy and enthalpy traces, the peaks intensity remained almost unchanged up to COV of 4.5 V. The peaks intensity then rapidly decreased. This may be consistent with the change in the OCV profiles of FIG. 5 and may denote a rapid degradation of the cathode material for COV above 4.5 V.

In the following, post-mortem electrode materials analyses will be described.

X-ray powder diffraction and Raman spectroscopy may be used to investigate the effect of high voltage charging under the COV2 protocol of the lithium cobalt oxide cathode and the graphite anode on crystal structure. The electrodes may be taken from cells discharged to 2.75V.

In the following, a lithium cobalt oxide (LCO) cathode will be described.

Figure 13D:
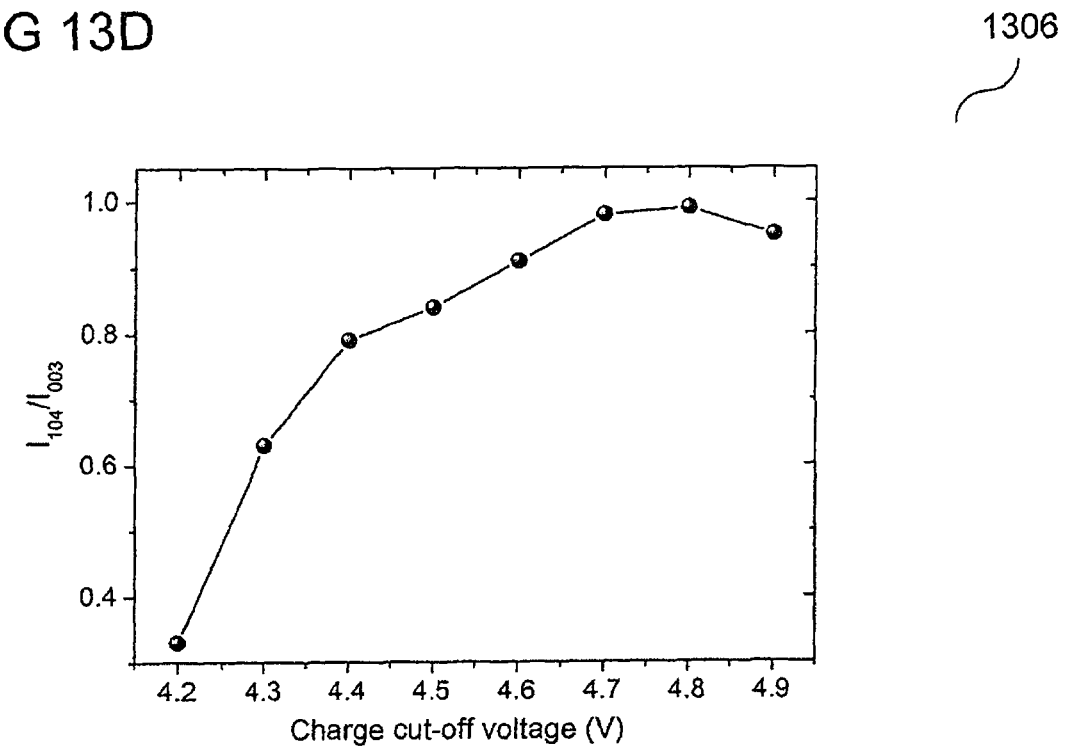
FIG. 13D shows an evolution of the 104/003 peaks intensity ratio with cut-off-voltage with respect to the pattern shown in FIG. 13A.

FIG. 13A show a full pattern 1300 of X-ray diffraction patterns of LiCoO$_2$ before and after overcharge. FIG. 13B shows diffraction patterns 1302 of FIG. 13 A with a peak area (003). FIG. 13C shows diffraction patterns 1304 of FIG. 13 A with a peak area (104). FIG. 13D shows an evolution 1306 of the 104/003 peaks intensity ratio with COV with respect to the pattern shown in FIG. 13A.

FIG. 13A shows the full XRD charts of LCO cathode materials at different COV. The diffraction angle areas where the 003 peak and the 104 peak appear are magnified in FIG. 13B and FIG. 13C, respectively. The relatively narrow peaks at 18.9° and 45.25° of the "fresh cell" in FIG. 13B and FIG. 13C correspond to the 003 and the 104 peak of fully lithiated LCO, respectively. As the COV increases the 003 and the 104 peaks shifted towards lower angles in the 2θ peak angular position and became broader. Such a shift in the peak position may result from residual lithium vacancies in $Li_{1-x}CoO_2$. The c-parameter of the hexagonal phase increases as lithium is extracted from LCO for 0<x<0.5 composition range in $Li_{1-x}CoO_2$. The other noticeable feature is the split of the 003 peak to two peaks for COV≥4.7V. This may relate to the formation of a disordered phase involving a Li and Co cation mixing. FIG. 13C shows the COV dependence of the $I_{104}/I_{003}$ peak intensity ratio. The later ratio increases with COV, which suggests an increase in the rate of the Li and Co cation mixing with the cathode overcharge ageing.

Figure 14:
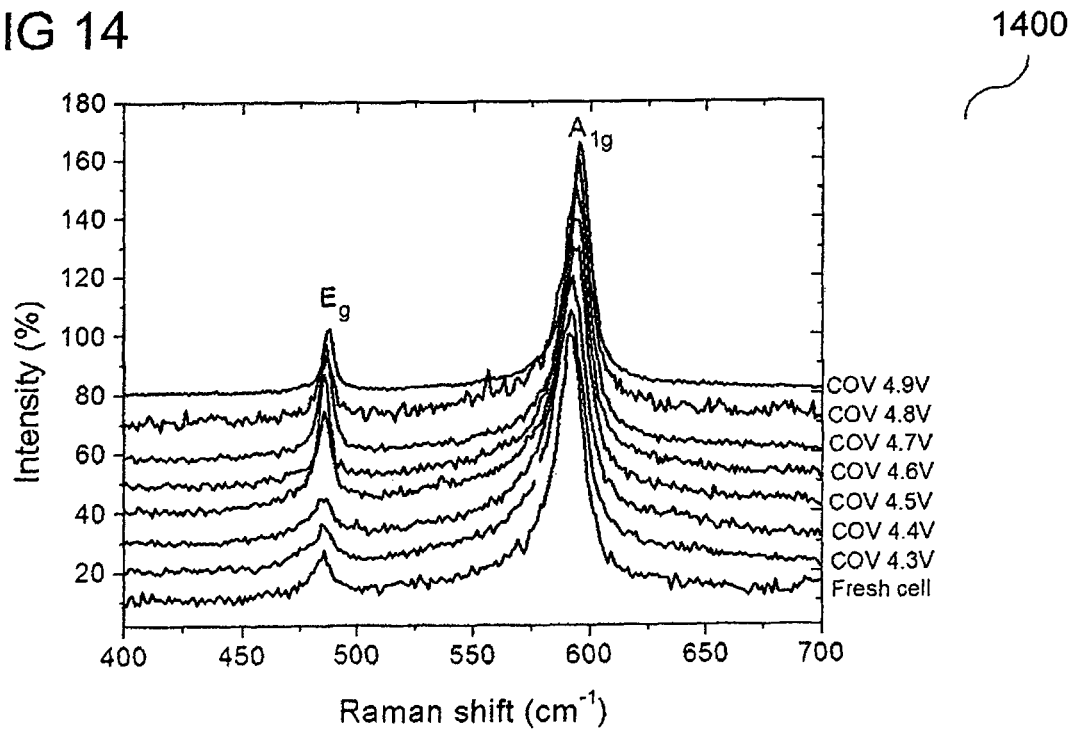
FIG. 14 shows Raman spectra of lithium cobalt oxide cathodes at different cut-off-voltages.

FIG. 14 shows Raman spectra 1400 of LCO cathodes at different COV. FIG. 14 shows the Raman scattering (RS) profiles of LCO cathodes of different COV. Two Raman modes are observed, at 485 and at 595 cm$^{-1}$, and may be attributed to the $E_g$ and $A_{1g}$ modes, respectively, of the spectroscopic space group ($D_{3d}^5$) corresponding to $Li_{1-x}CoO_2$ of the layered rock-salt structure (R$\bar{3}$m space group). However, there may be no RS evidence of the formation of a pure spinel structure (Fd3m space group), as the characteristic strongest peak 688 cm$^{-1}$ corresponding to the $F_{2g}$ mode is absent from the spectra. Accordingly, although cation mixing increased significantly with COV, a pure spinel phase didn't form.

In the following, a graphite anode will be described.

Figure 15:
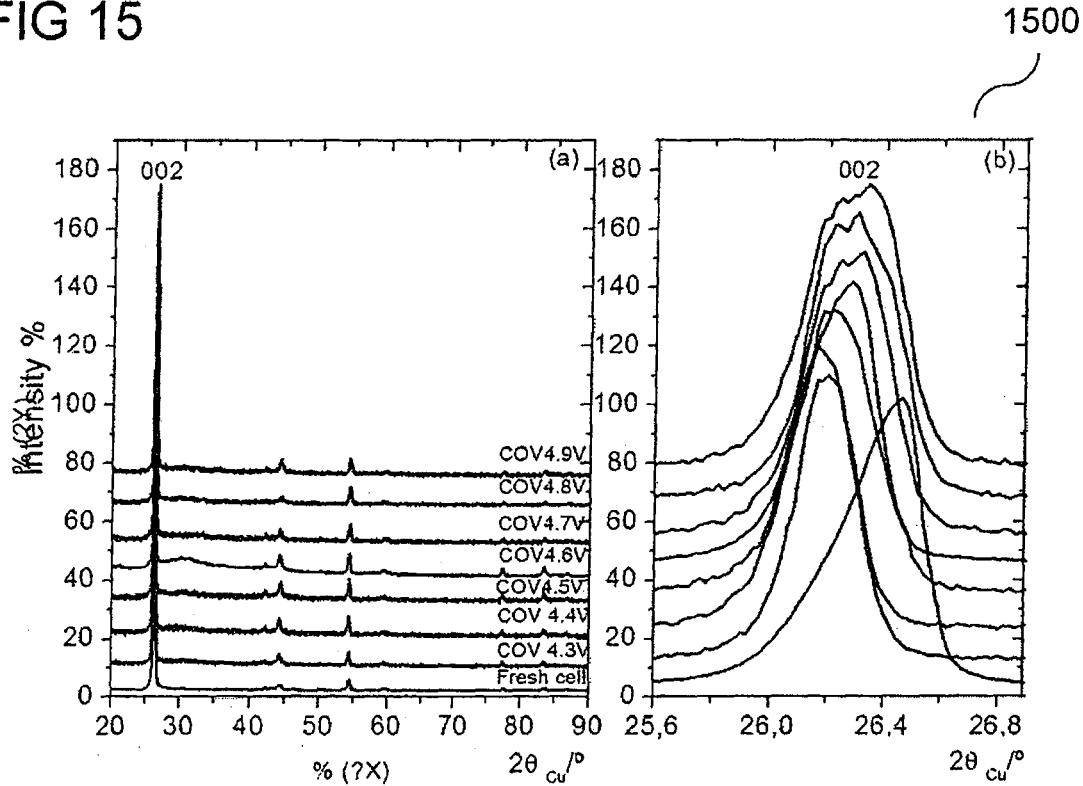
FIG. 15 shows X-ray diffraction patterns of the graphite anode before and after overcharge; (a) Full pattern, (b) in a peak area.

FIG. 15 shows X-ray diffraction patterns 1500 of the graphite anode before and after overcharge: (a) Full pattern, (b) in the (002) peak area. The XRD charts of the graphite anode at different COV are depicted in FIG. 15 (a) (full spectra) and FIG. 15 (b) (the 002 peak area). Compared to the initial fresh cell, the 002 peak position shifted to lower diffraction angles and the peak broadened with increased COV. A shift to lower angles results of larger graphene interlayers spacing coming from residual intercalated lithium in the graphite structure.

Figure 16:
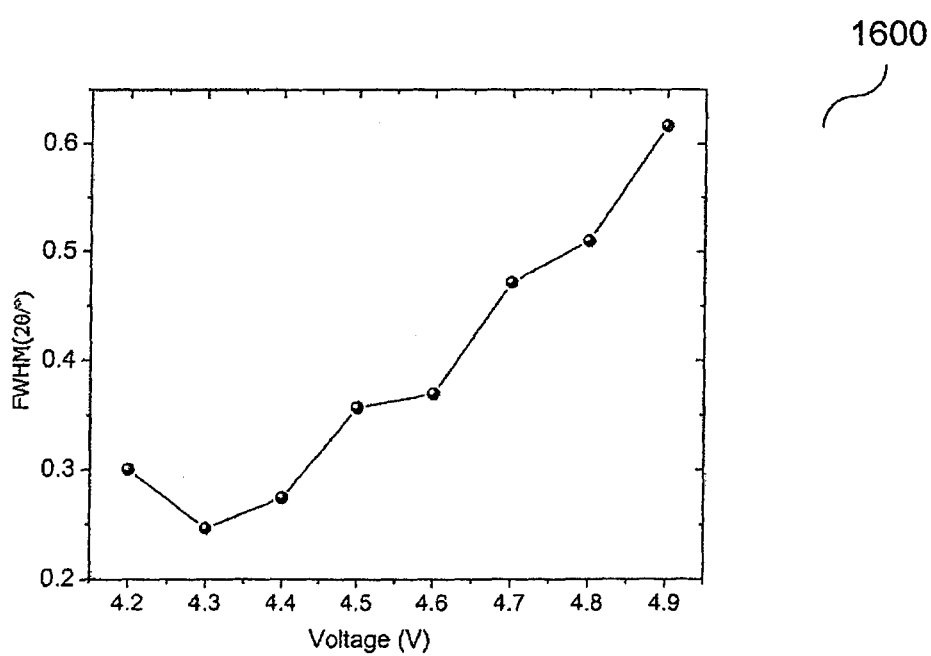
FIG. 16 shows an evolution of the graphite anode peak Full Width at Half-Maximum (FWHM) vs. cut-off-voltage.

FIG. 16 shows an evolution 1600 of the graphite anode 002 peak Full Width at Half-Maximum (FWHM) vs. COV. The 002 peak broadening as depicted in FIG. 16 may result from increased graphene layers stacking disorder. It may be interesting to note that the 002 peak position in the "fresh cell" falls at 2θ=26.48°, which may correspond to an interlayer spacing $d_{002}$=3.365 Å, and may be slightly higher than $d_{002}$=3.350 Å of high crystalline graphite. Accordingly, the graphite used in our test cells may still contain some residual turbostratic disorder.

Figure 17:
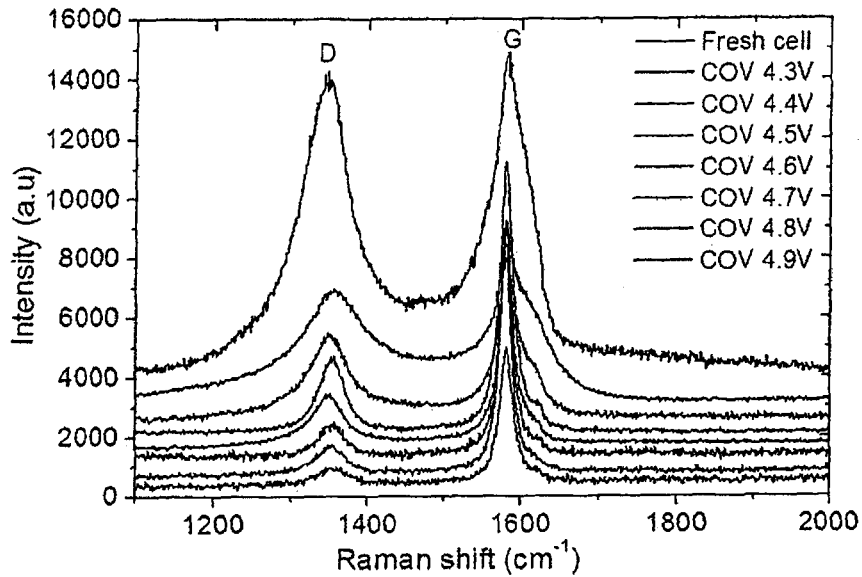
FIG. 17 shows Raman spectra of the graphite anode at different cut-off-voltages.

FIG. 17 shows Raman spectra 1700 of the graphite anode at different COV. The XRD results are consistent with the Raman Scattering ones displayed in FIG. 17. The two active modes at 1350 cm$^{-1}$ (D-mode) and 1590 cm$^{-1}$ (G-mode) may be typical of graphite materials with more or less amounts of crystal structure disorder. The presence of a weak D-mode peak in the anode material taken from a fresh cell may be consistent with XRD results discussed above.

Figure 18:
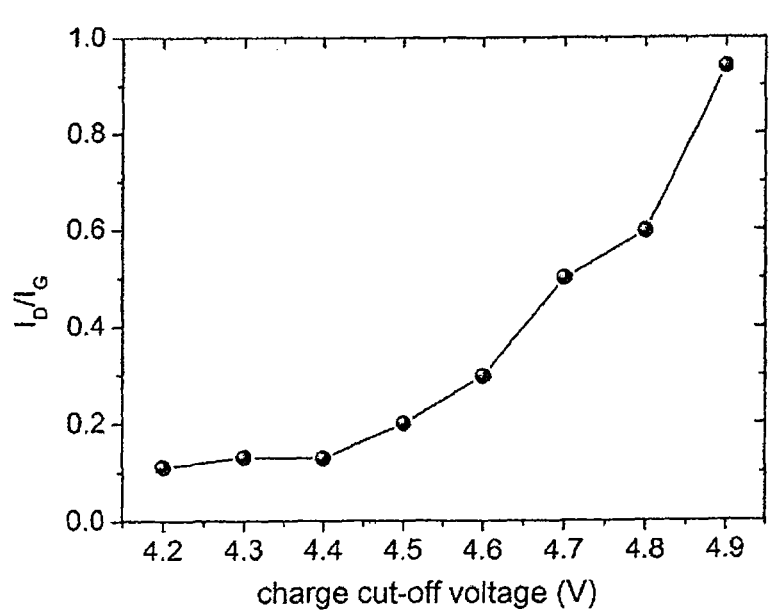
FIG. 18 shows an evolution of the $I_D/I_G$ intensity ratio of the Raman D band and the G band of the graphite anode with cut-off-voltage.

FIG. 18 shows an evolution 1800 of the $I_D/I_G$ intensity ratio of the Raman D band and the G band of the graphite anode with COV. The Raman active modes intensity ratio $I_D/I_G$ depicted in FIG. 18 may increase with COV indicating an increase in the graphene layers disorder upon high voltage ageing.

According to various embodiments, a thermodynamics study on aged lithium ion cells at their discharge state reveals drastic changes in the entropy and the enthalpy profiles may be used. A particular state of charge domains may be found where changes in thermodynamics properties may be more pronounced; in particular at zero SOC and around 80% SOC. Furthermore, a steep increase in capacity loss between 4.5V and 4.6V COV may be found, indicating accelerated electrode and/or electrolyte degradation in the 4.5V-4.6V COV range. Changes in thermodynamics properties may tentatively be related to crystal structure deterioration at the anode (zero SOC) and the cathode (80% SOC), which may be confirmed by x-situ XRD and Raman scattering analyses. On the graphite anode side, a shift in the 002 XRD peak may be found towards lower angles indicating residual intercalated lithium in the graphite structure together with peak broadening resulting from graphene layers stacking disorder, a result confirmed by RS. On the LCO side, a shift towards lower angles of the 003 diffraction peak may be found, suggesting a sizeable amount of lithium vacancies in LCO and also peak broadening and splitting as COV increased. The occurrence of lithiated graphite and delithiated LCO in the cells discharge state may account for the higher observed OCV at "zero" SOC. The cells at their theoretical full discharge state may still partly be charged although, as a paradox that charge is not available.

According to various embodiments, advanced thermodynamics measurements (which may also be referred to as DEET (Differential Entropy and Differential Enthalpy Technology), like will be described below), may be provided.

A thermodynamics based technology (ETMS, Electrochemical Thermodynamics Measurements System) that enables better knowledge on battery operation status, including SOH, has been developed. According to various embodiments, DEET (which may be considered as a next generation ETMS technology) may be provided.

According to various embodiments, devices and methods (which may be referred to as DEET) may be provided, that enable electrochemical cells properties and behaviors to be more accurately assessed and analyzed.

The method may be based on processing of thermodynamics data, including derivative and differential state functions such as free energy, entropy and enthalpy.

Derivative and differential thermodynamics data may be used in different applications related to electrochemical systems including, but not limited to:
- battery state of health (SOH);
- battery safety risk assessment;
- battery degradation rate; and
- electrode materials analytical characterization.

In the following, measurements according to various embodiments will be described.

According to various embodiments, lithium ion batteries (in other words: cells) may be tested as follows: The lithium ion batteries may be 1. cycled several times at the ambient temperature up to 4.2V;
2. then exposed to:
   a) high voltage (which may be also referred to as HV, or high-voltage ageing) up to 4.5V;
   b) high temperature (which may be also referred to as HT) ageing at initial charged state at about 62° C. for 1 to 4 weeks;
3. then tested using ETMS (for example using a BA-1000) to measure entropy and enthalpy during charge and discharge.
4. The results may be compared to the initial batteries before exposition using differential entropy and differential enthalpy techniques.

In the following, principles of differential entropy and differential enthalpy technology (DEET) according to various embodiments will be described.

1. Entropy (and enthalpy) during charge and discharge may be measured:
   a) on initial batteries before exposing them to HV and HT. Results may be plotted vs. state of charge (x in %) to yield entropy and enthalpy: $\Delta S_0(x)$ (for the entropy) and $\Delta H_0(x)$ (for the enthalpy), respectively.

b) on the batteries after exposure (exp.) to HV and HT to give: $\Delta S_{Exp}(x)$ (for the entropy) and $\Delta H_{exp}(x)$ (for the enthalpy).

2. Differential entropy dS(x) and differential enthalpy dH(x) may be defined, respectively as:

$$dS(x)=\Delta S_{Exp}(x)-\Delta S_0(x) \qquad \text{Eq. 6}$$

and $$dH(x)=\Delta H_{Exp}(x)-\Delta H_0(x) \qquad \text{Eq. 7}$$

Figure 19:
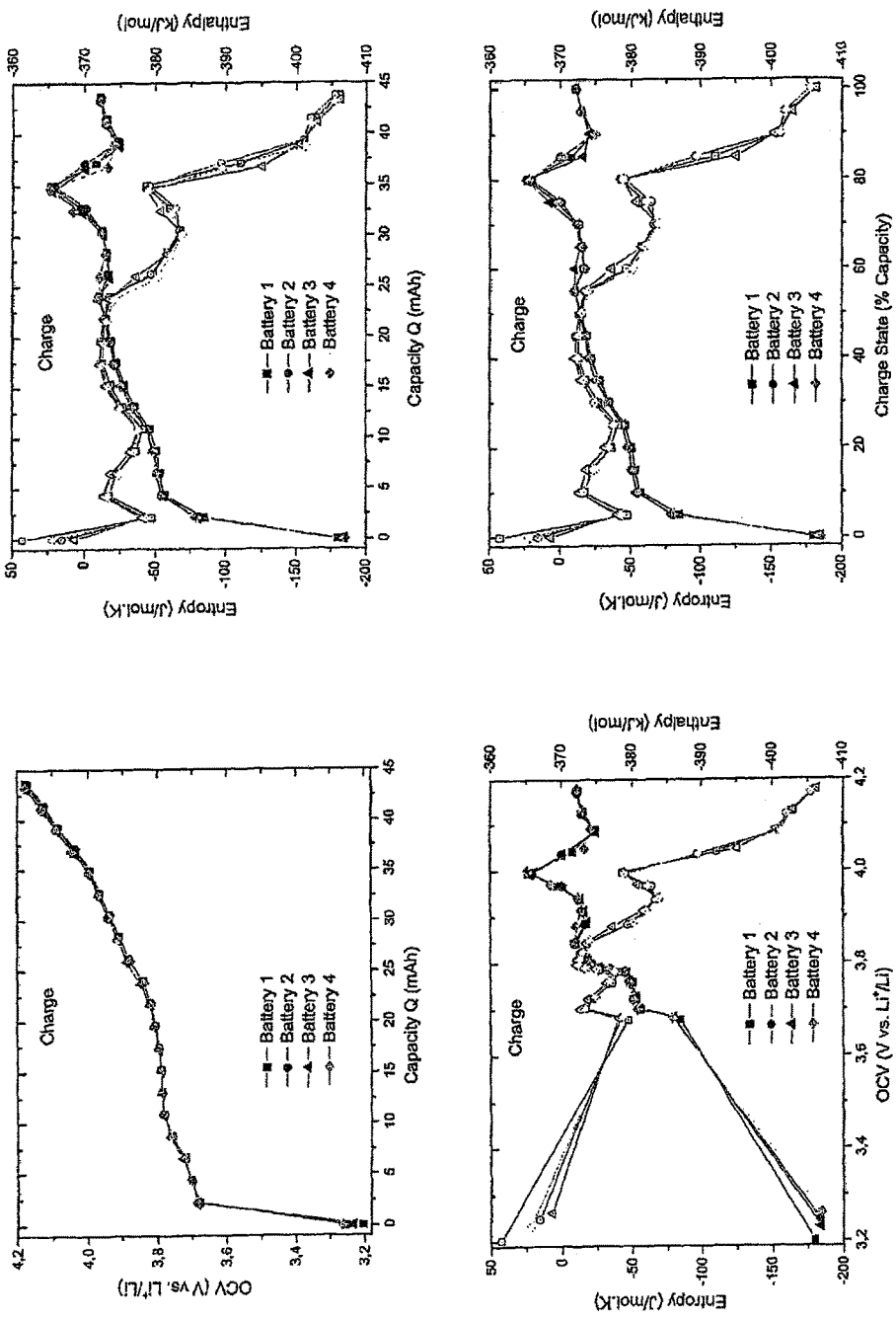
FIG. 19 shows diagrams illustrating initial tests before high-voltage ageing and high-temperature ageing for batteries cycled between 2.75 V and 4.2 V for charging.

FIG. 19 shows diagrams 1900 illustrating initial tests before HV and HT for batteries cycled between 2.75 V and 4.2 V for charging.

Figure 20:
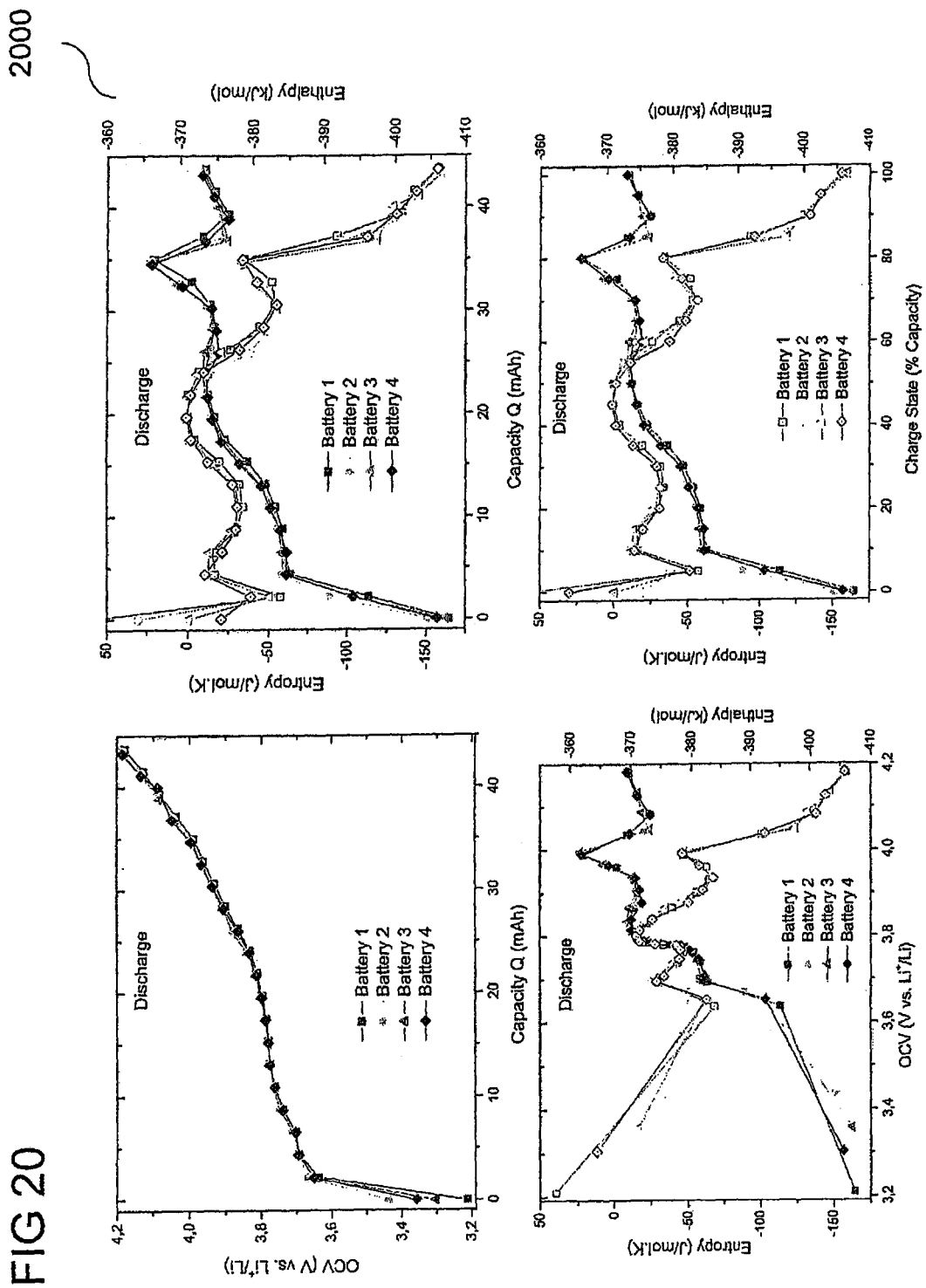
FIG. 20 shows diagrams illustrating initial tests before high-voltage ageing and high-temperature ageing for batteries cycled between 2.75 V and 4.2 V for discharging.

FIG. 20 shows diagrams 2000 illustrating initial tests before HV and HT for batteries cycled between 2.75 V and 4.2 V for discharging.

Figure 21:
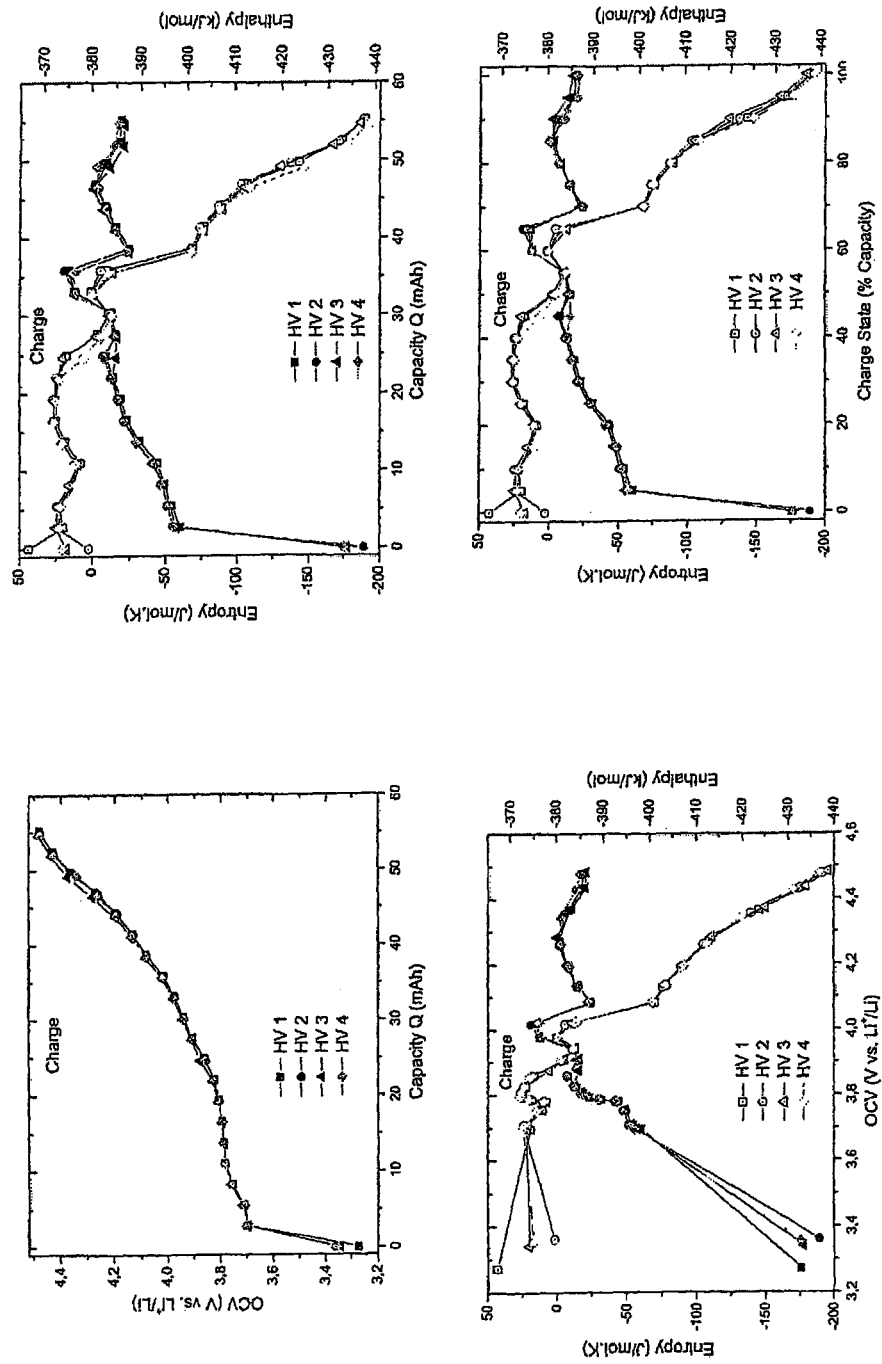
FIG. 21 shows diagrams illustrating tests after high-voltage ageing for batteries cycled between 2.75 V and 4.5 V for charging.

FIG. 21 shows diagrams 2100 illustrating tests after HV for batteries cycled between 2.75 V and 4.5 V for charging.

Figure 22:
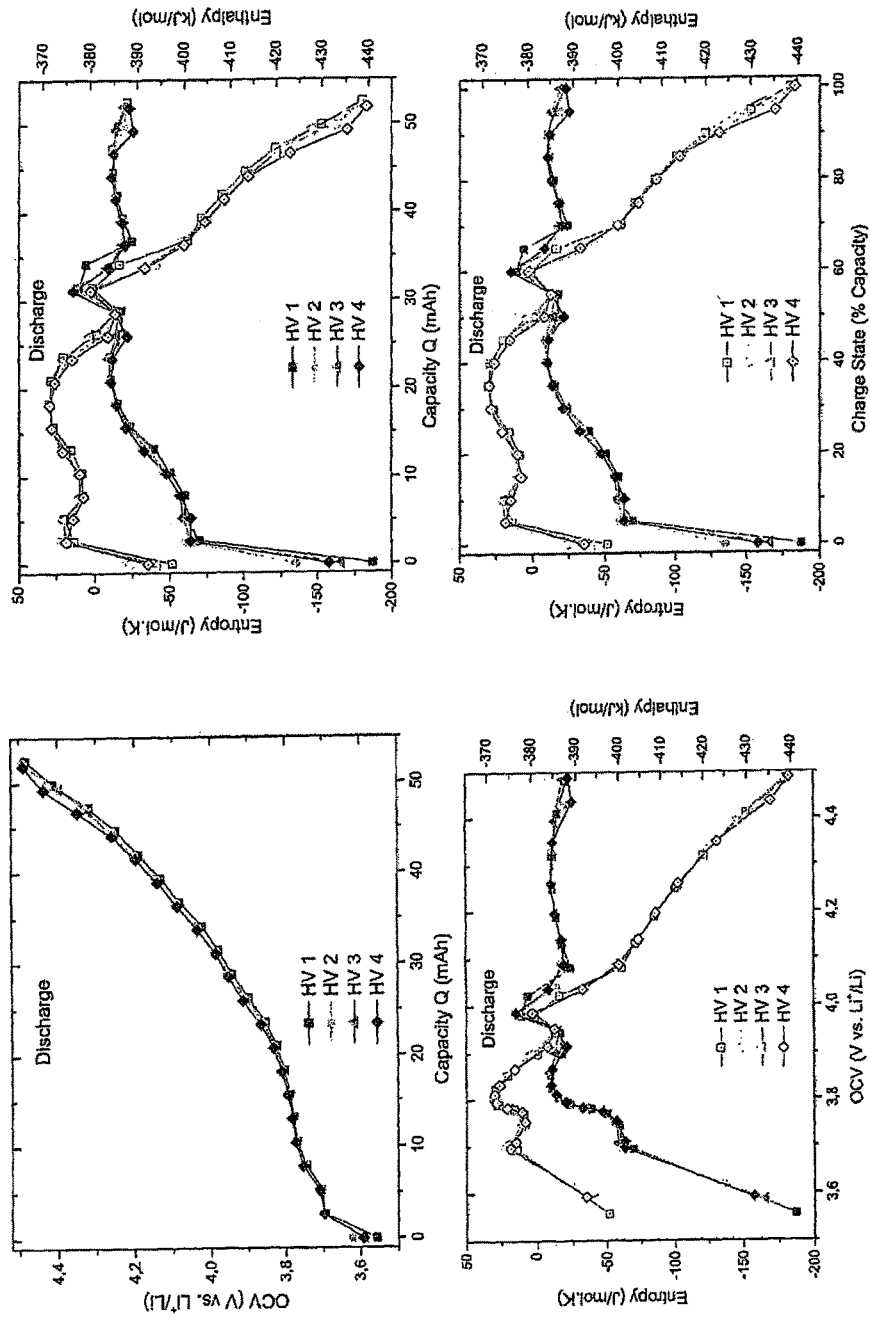
FIG. 22 shows diagrams illustrating tests after high-voltage ageing for batteries cycled between 2.75 V and 4.5 V for discharging.

FIG. 22 shows diagrams 2200 illustrating tests after HV for batteries cycled between 2.75 V and 4.5 V for discharging.

Figure 23:
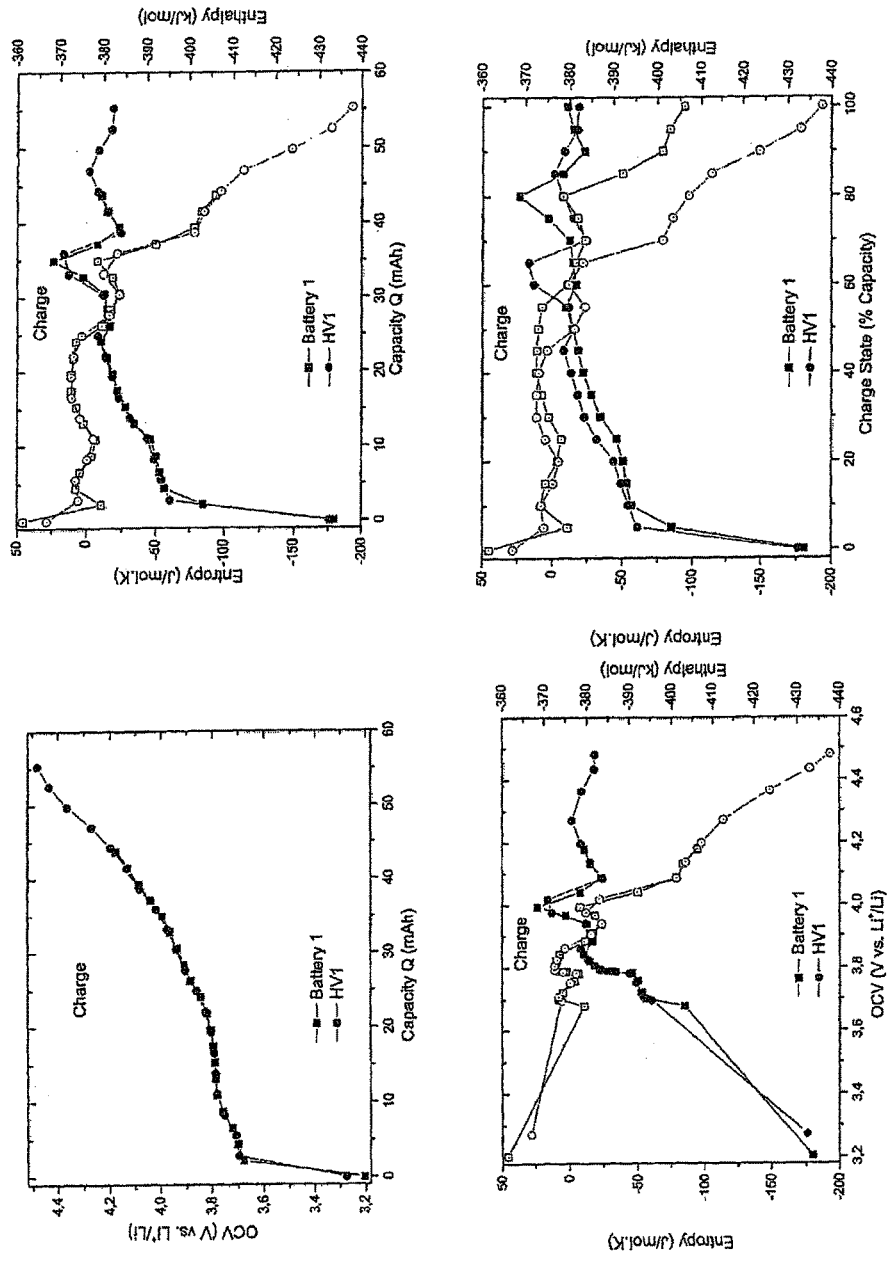
FIG. 23 shows diagrams illustrating tests after high-voltage ageing for a comparison of batteries for charging.

FIG. 23 shows diagrams 2300 illustrating tests after HV for a comparison of battery 1 and HV 1 for charging.

Figure 24:
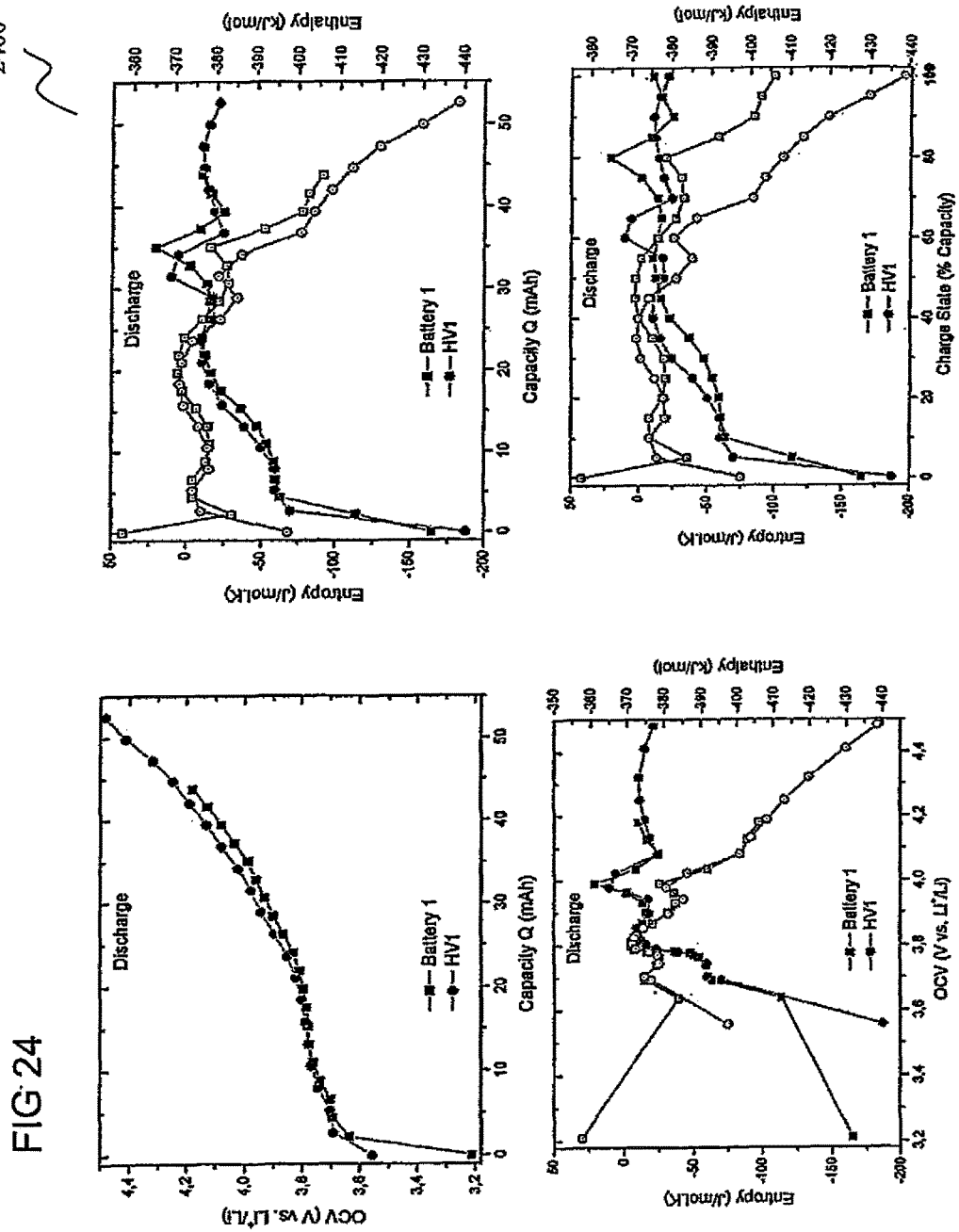
FIG. 24 shows diagrams illustrating tests after high-voltage ageing for a comparison of batteries for discharging.

FIG. 24 shows diagrams 2400 illustrating tests after HV for a comparison of battery 1 and HV 1 for discharging.

Figure 25:
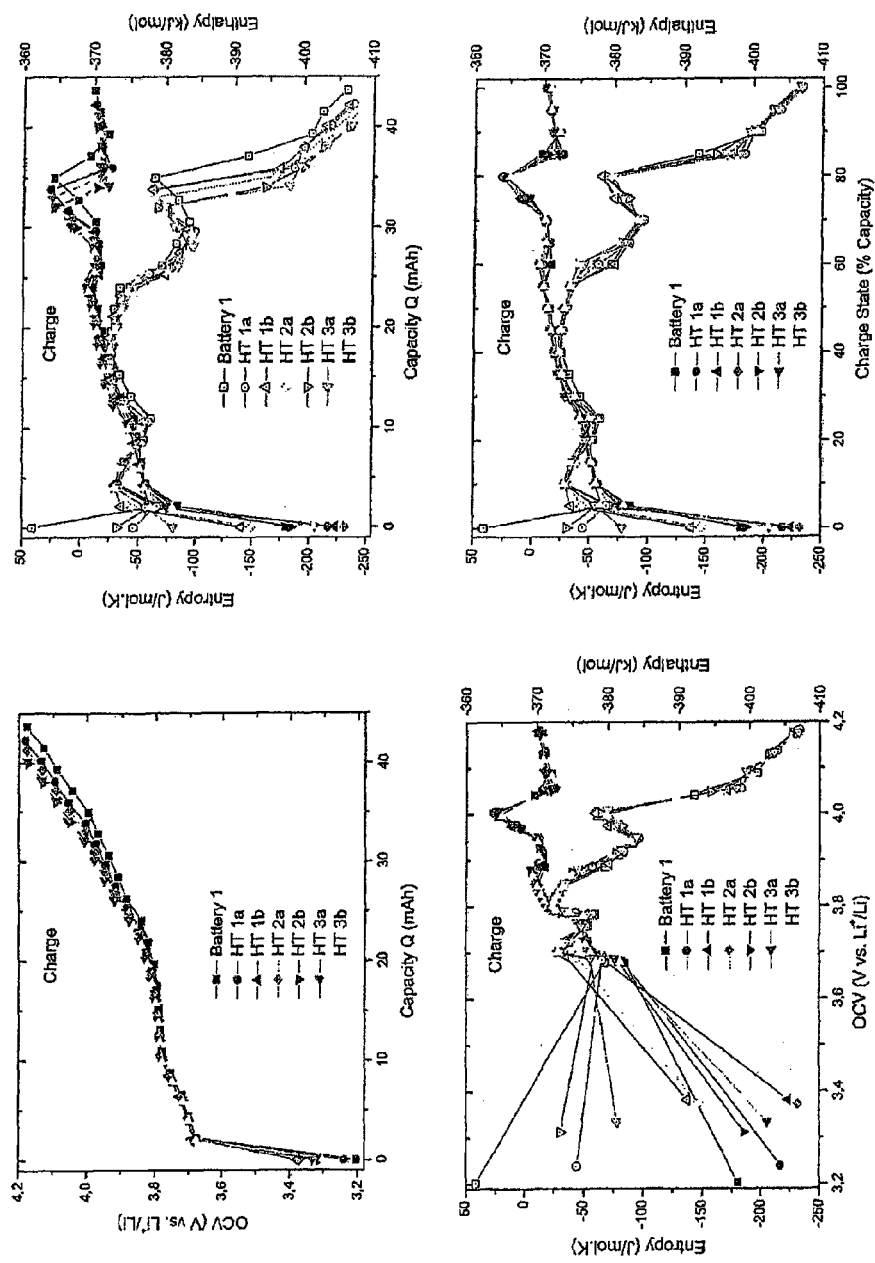
FIG. 25 shows diagrams illustrating tests after high-temperature ageing of 62° C. for several weeks and a comparison between batteries for charging.

FIG. 25 shows diagrams 2500 illustrating tests after HT of 62° C. for several weeks and a comparison between battery 1 and HT batteries (1, 2 and 3 weeks of ageing) for charging.

Figure 26:
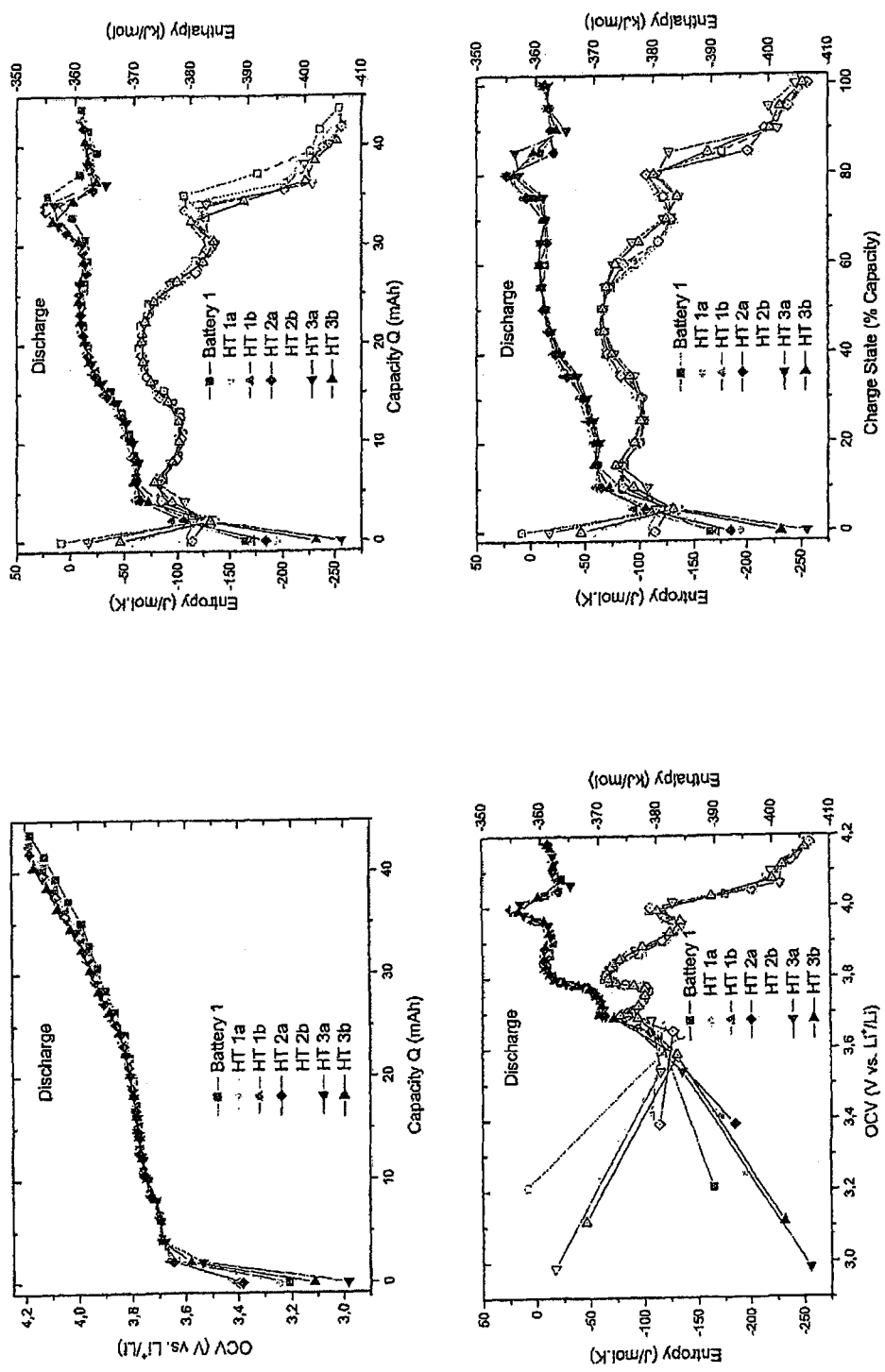
FIG. 26 shows diagrams illustrating tests after high-temperature ageing of 62° C. for several weeks and a comparison between batteries for discharging.

FIG. 26 shows diagrams 2600 illustrating tests after HT of 62° C. for several weeks and a comparison between battery 1 and HT batteries (1, 2 and 3 weeks of ageing) for discharging.

Figure 27:
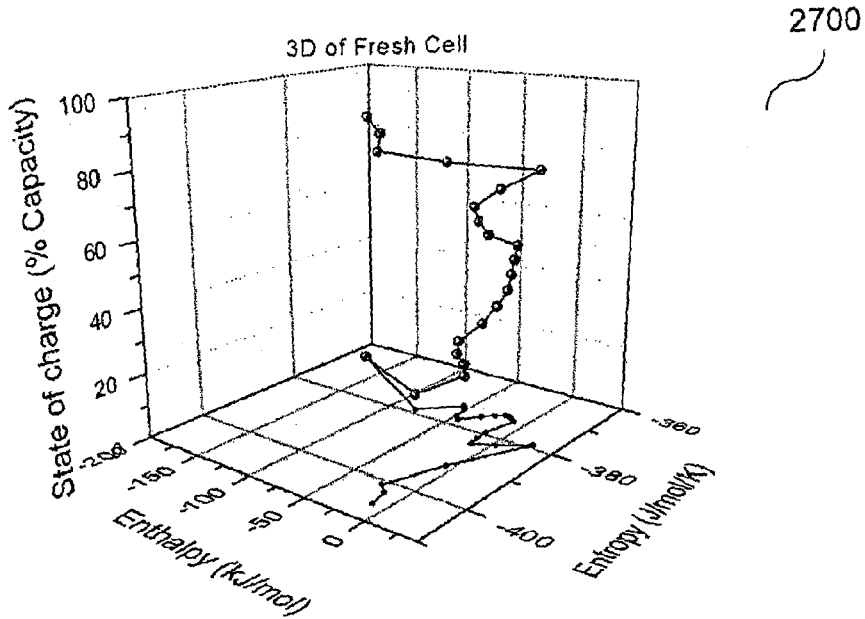
FIG. 27 shows 3D plots.

FIG. 27 shows 3D plots 2700 illustrating SOC-$\Delta S$-$\Delta H$ plots.

Figure 28:
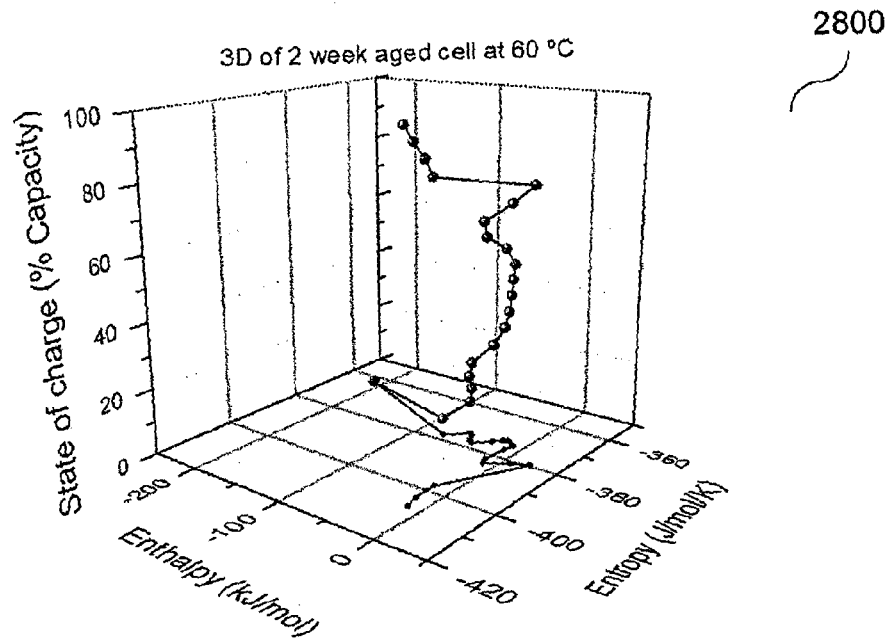
FIG. 28 shows 3D plots.

FIG. 28 shows 3D plots 2800 illustrating SOC-$\Delta S$-$\Delta H$ plots.

Figure 29:
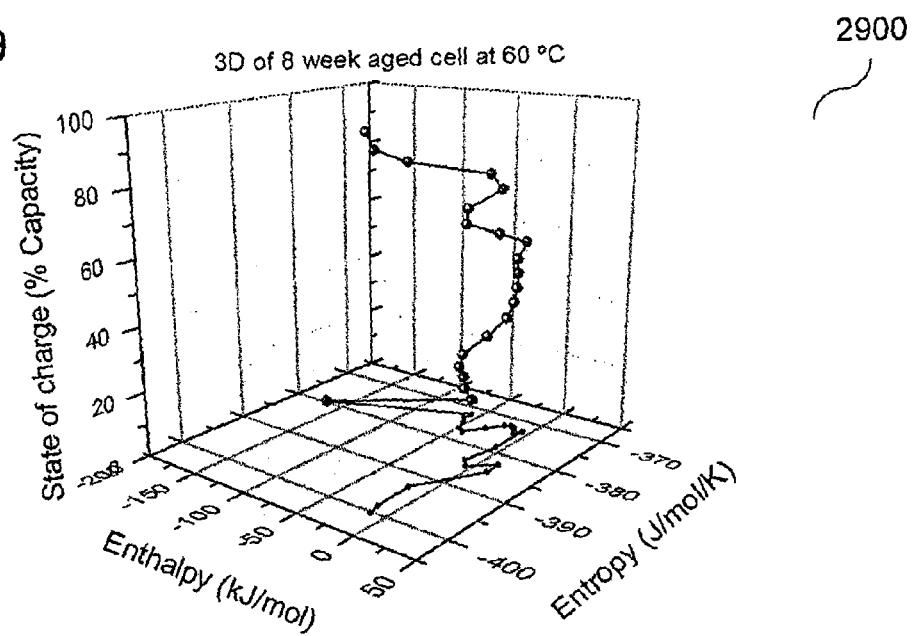
FIG. 29 shows 3D plots.

FIG. 29 shows 3D plots 2900 illustrating SOC-$\Delta S$-$\Delta H$ plots.

It may be found that the 3D representation (entropy, enthalpy, SOC) may provide an higher resolution in the battery SOC assessment compared to methods based on OCV measurement and on coulometry. The latters may not take into account the battery SOH, which may affects the SOC determination.

The projection of the 3D curve in the entropy-enthalpy plan may allow to "blow" the SOC curve therefore increasing the resolution.

3D plots may be more convenient to visualize the thermodynamics data evolution with respect to the SOC. 3D plots may allow higher resolution of the SOC assessment owing to projection of SOC in the $\Delta S$-$\Delta H$ plan. No "loop" may be observed in the SOC projection curve, which may mean that no different SOC states of a battery may have simultaneously the same entropy and enthalpy.

Derivative entropy and derivative enthalpy may be expressed respectively as $$\delta S(x) = \frac{\partial \Delta S(x)}{\partial x} \qquad \text{Eq. 8}$$

and $$\delta H(x) = \frac{\partial \Delta H(x)}{\partial x} \qquad \text{Eq. 9}$$

Figure 30:
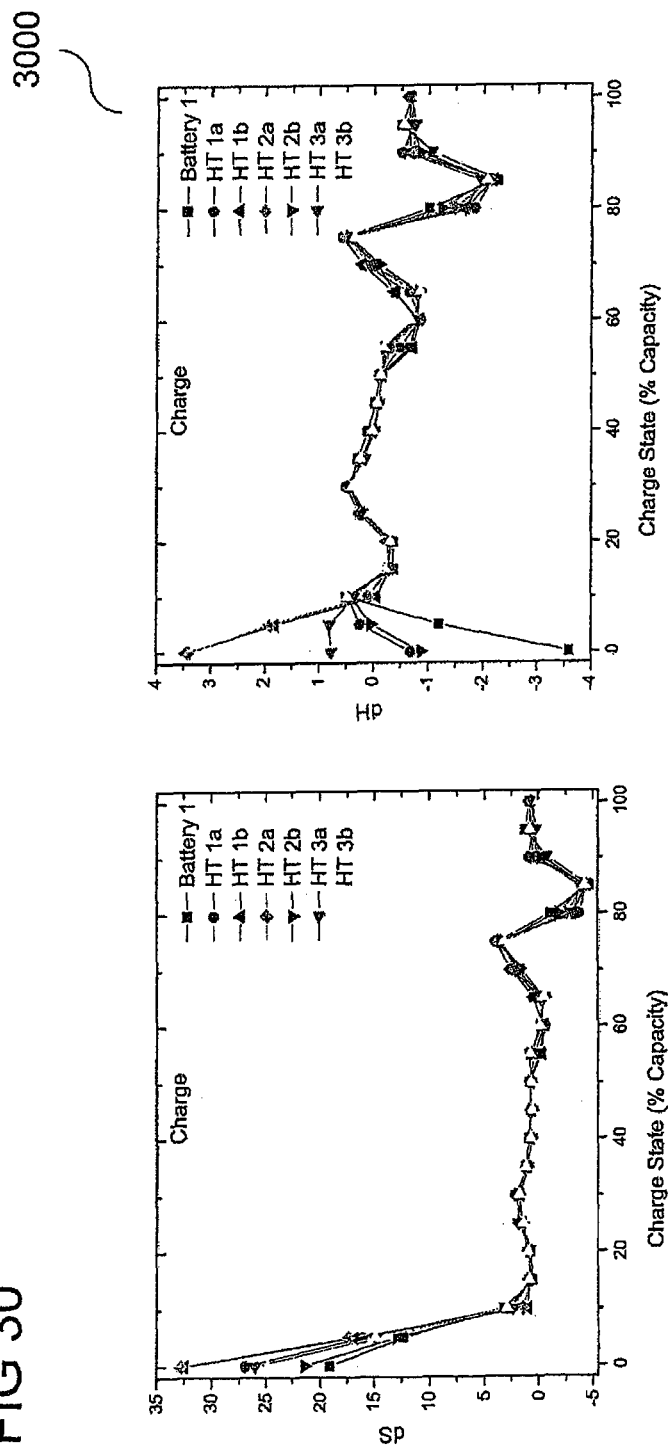
FIG. 30 shows diagrams illustrating derivative entropy and derivative enthalpy of different batteries for 1, 2 and 3 weeks of ageing for charging.

FIG. 30 shows diagrams 3000 illustrating derivative entropy and derivative enthalpy of battery 1 and HT batteries for 1, 2 and 3 weeks of ageing for charging.

Figure 31:
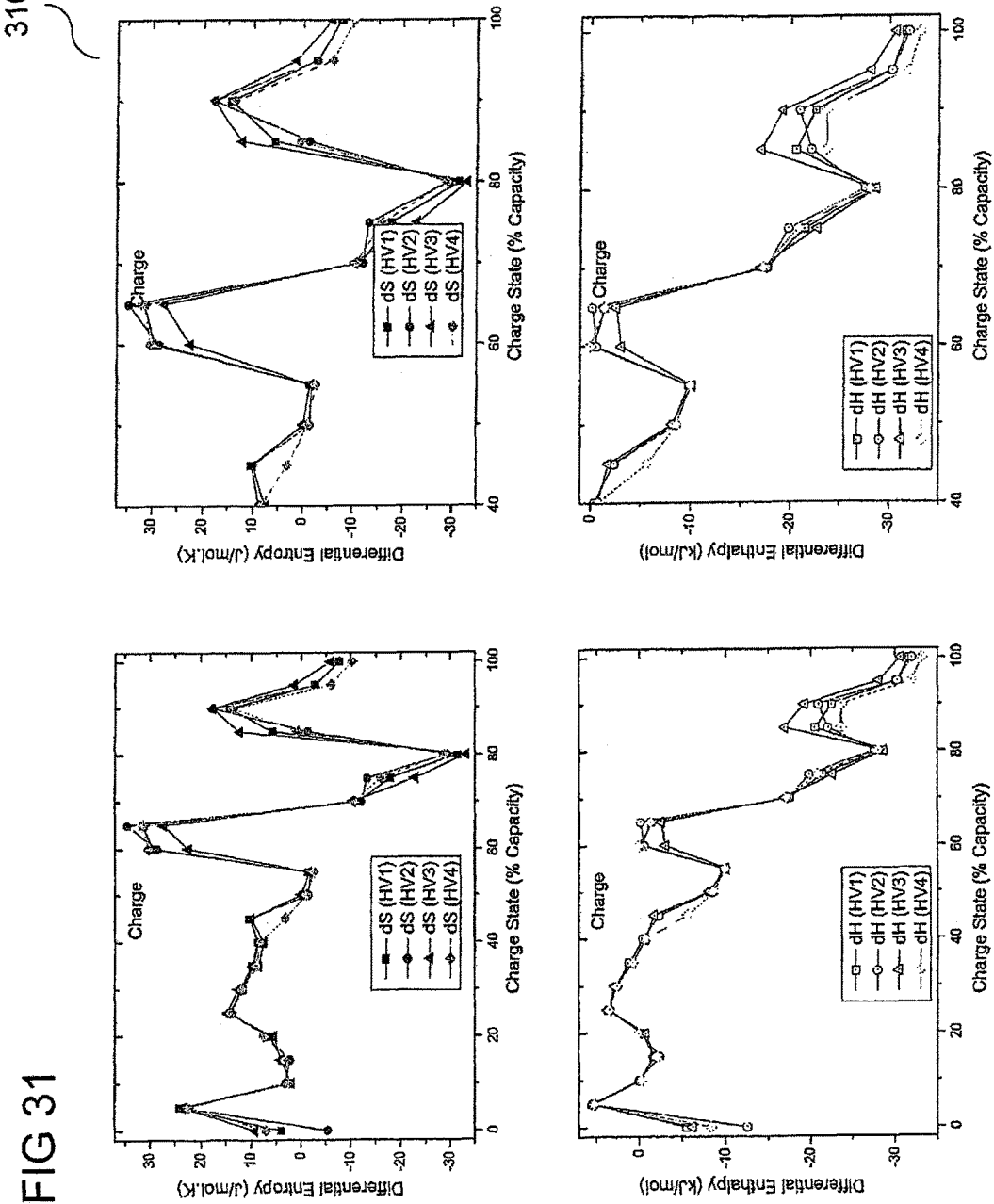
FIG. 31 shows diagrams illustrating differential entropy and differential enthalpy for high-voltage ageing tests of four batteries cycled between 2.75 V and 4.5 V for charging.

FIG. 31 shows diagrams 3100 illustrating differential entropy and differential enthalpy for HV tests of four batteries cycled between 2.75 V and 4.5 V for charging.

Figure 32:
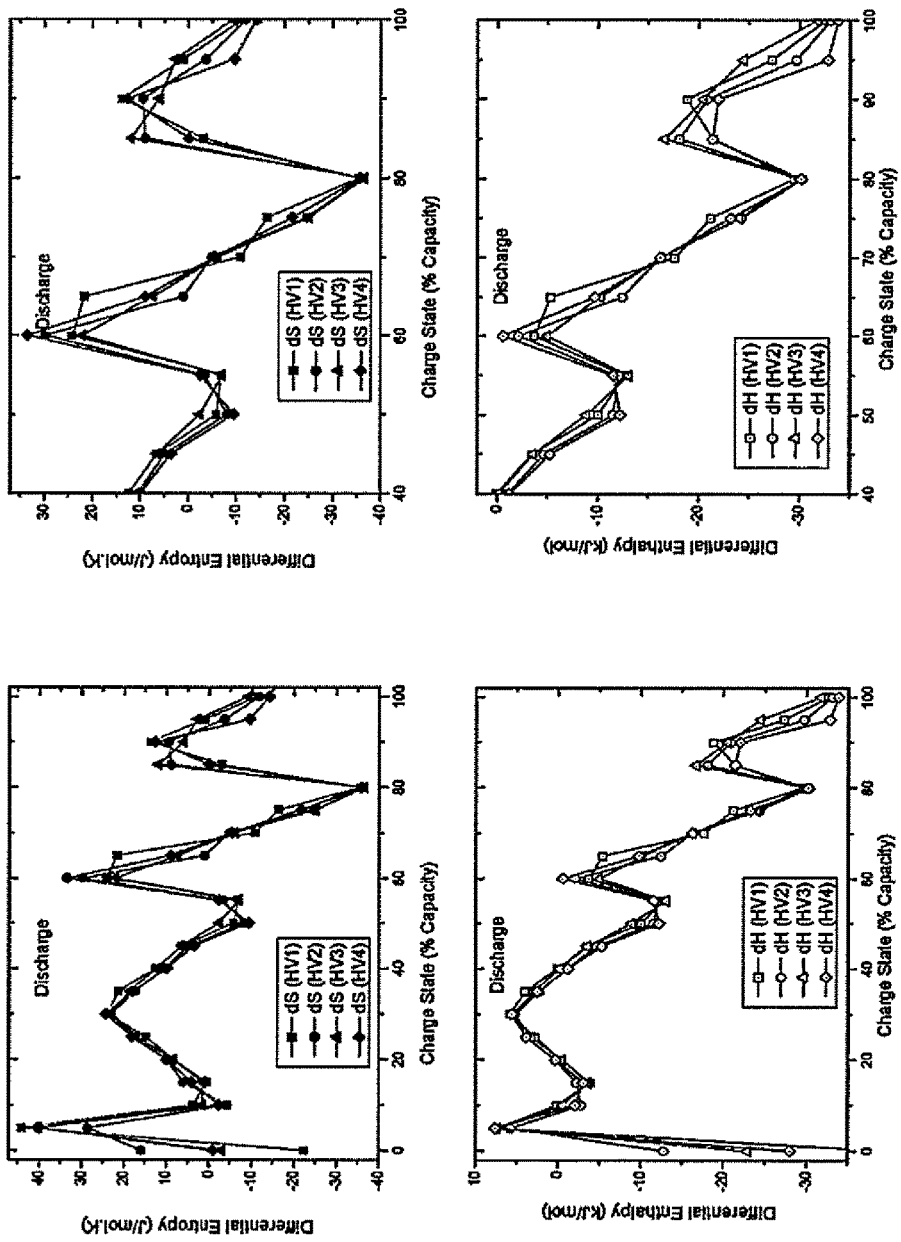
FIG. 32 shows diagrams illustrating differential entropy and differential enthalpy for high-voltage ageing tests of four batteries cycled between 2.75 V and 4.5 V for discharging.

FIG. 32 shows diagrams 3200 illustrating differential entropy and differential enthalpy for HV tests of four batteries cycled between 2.75 V and 4.5 V for discharging.

Figure 33:
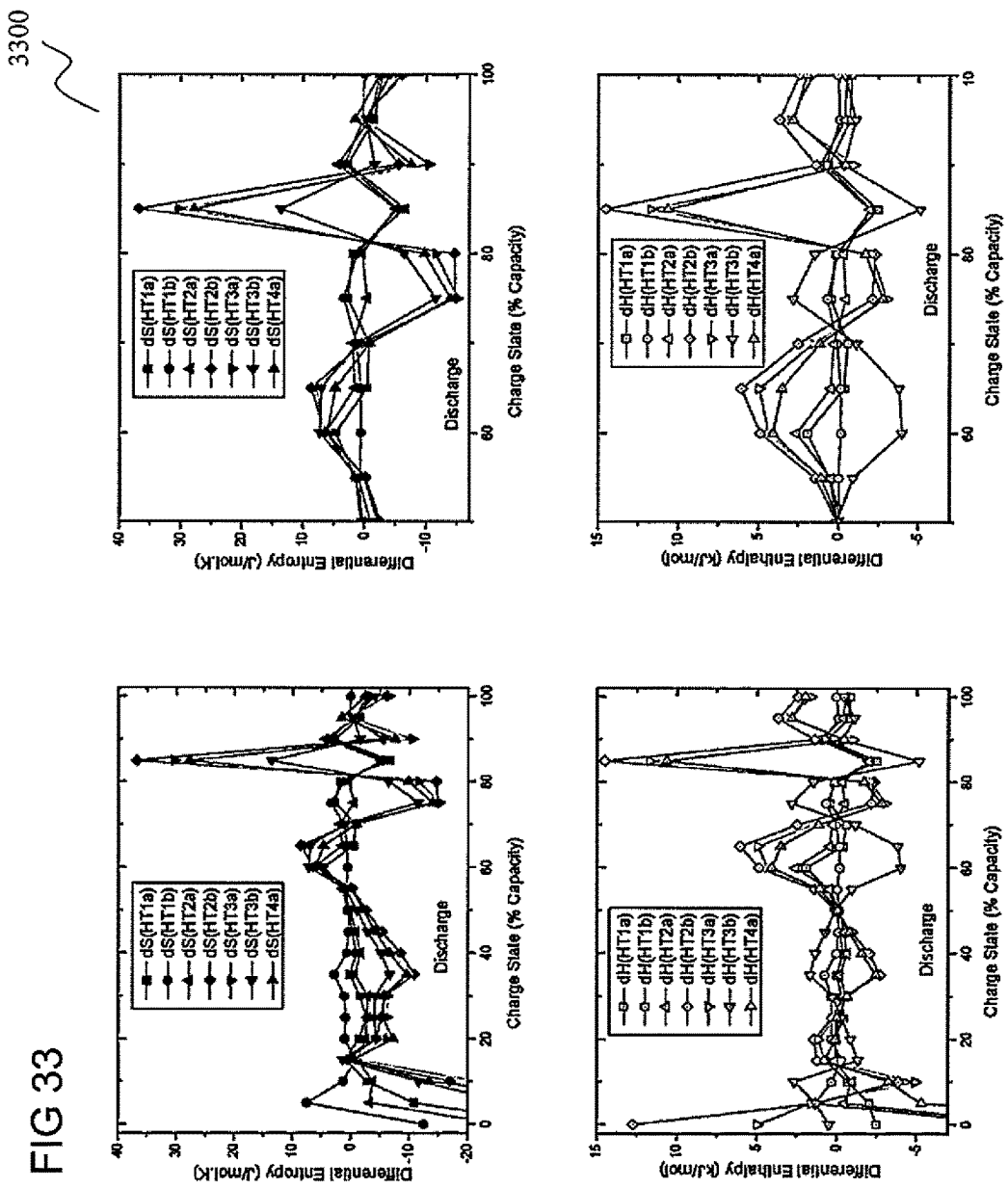
FIG. 33 shows diagrams illustrating differential entropy and differential enthalpy for high-temperature ageing for discharging.

FIG. 33 shows diagrams 3300 illustrating differential entropy and differential enthalpy for HT (of 1, 2, 3 and 4 weeks of ageing for discharging.

Figure 34:
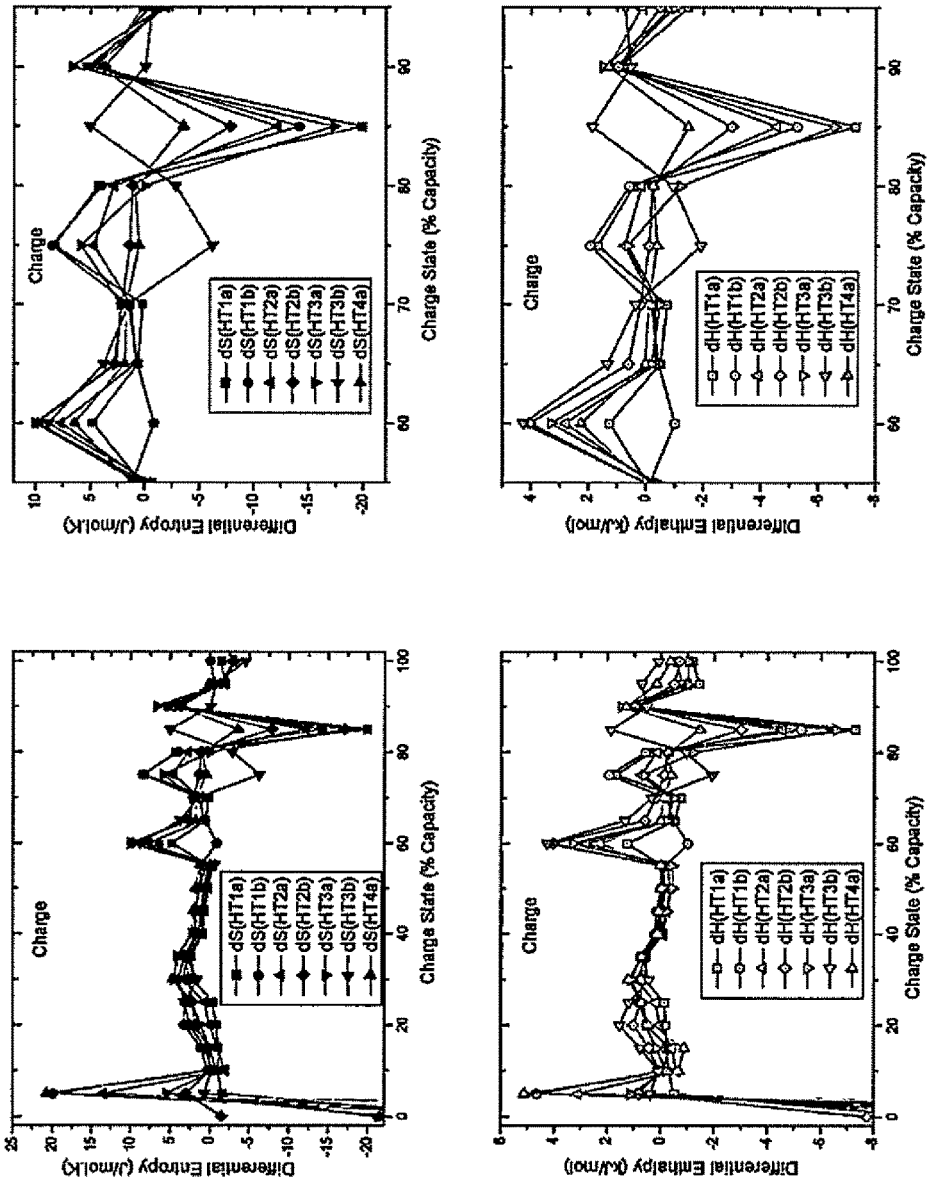
FIG. 34 shows diagrams illustrating differential entropy and differential enthalpy for high-temperature ageing for charging.

FIG. 34 shows diagrams 3400 illustrating differential entropy and differential enthalpy for HT (of 1, 2, 3 and 4 weeks of ageing for charging.

Figure 35:
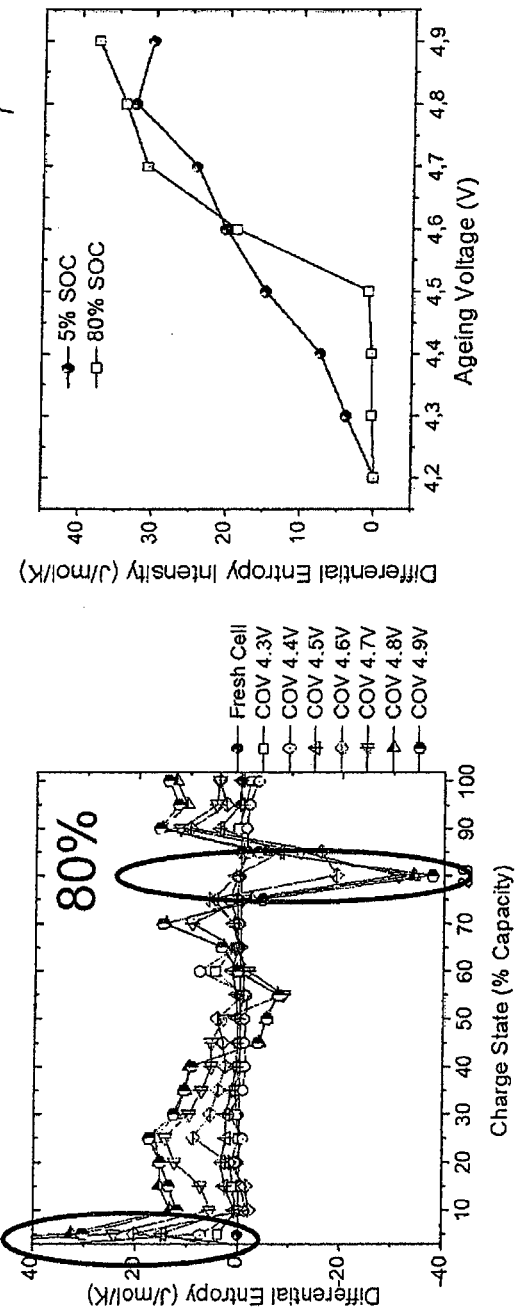
FIG. 35 shows a diagram illustrating evolution of differential entropy peaks intensity at about 5% and about 80% state of charge with the SOC (state of charge).

FIG. 35 shows a diagram 3500 illustrating evolution of differential entropy peaks intensity at about 5% and about 80% state of charge with the SOC (state of charge). In FIG. 35, a comparison of differential entropy at 5% and 80% SOC peaks after high voltage ageing is shown.

According to various embodiments, the stage of health (SOH) may be determined by measuring the evolution of differential entropy peaks at ~5% and ~80% SOC of cells after accelerated ageing such as by high voltage charging. The two peaks intensity may increase with the COV indicating more anode (5% peak) and cathode (80% peak) degradation The battery performance decay coming from the anode and the cathode may be decoupled. Also the anode and the cathode degradation may not follow the same time profile. This is shown in FIG. 35.

In summary selected peaks intensity in the differential entropy (and enthalpy) profiles provide an indicator of the battery state of health in relation to anode and cathode materials degradation.

Devices and methods according to various embodiments may be applied to all types of batteries, including rechargeable batteries, and LIBs are described above as an example only.

Differential entropy and enthalpy techniques (DEET) according to various embodiments may allow to magnify changes taking place in a battery during ageing such as after long cycling, high voltage overcharge and high temperature exposure.

DEET according to various embodiments may be complementary to ETMS, like described above.

Results achieved by methods and device according to various embodiments may be highly reproducible, highly accurate and highly resolved.

DEET according to various embodiments may apply to assess the following:
state of health of a battery (SOH);
state of risk of a battery; and
rate of electrode materials degradation.

DEET main market applications may include research labs, both academia, public, private and industry. Battery user industry may include mobile electronics (for example cell phone, laptop PCs, remote meters), e-mobility (for example HEV (hybrid electric vehicle), BEV (battery electric vehicle), E-bike, E-scooter, E-boat), stationary energy storage (for example buildings, smart grid, green energy), space, aerospace, medical, and UPS (uninterruptible power supply).

In the following, further measurement results according to various embodiments will be described.

Ageing Effect on thermodynamic proprieties of LIB will be described.

The effect of thermal ageing on entropy and enthalpy of LIB will be described.

Figure 36:
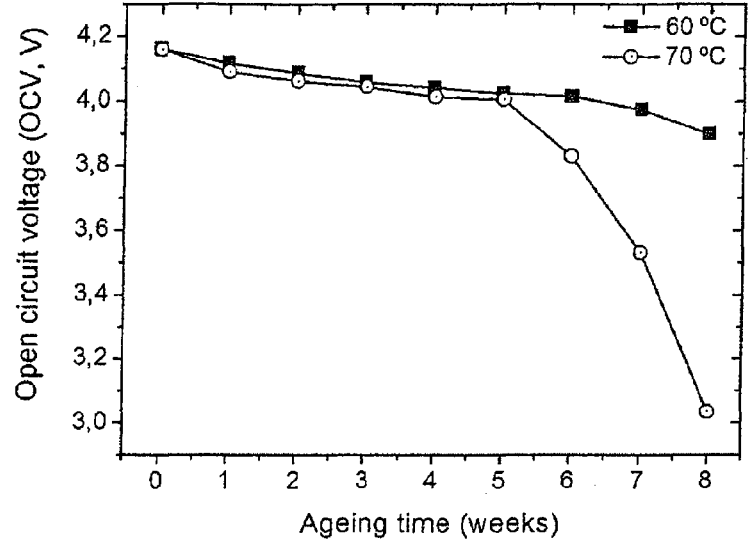
FIG. 36 shows a diagram illustrating a comparison of OCV (open circuit voltage) voltages ageing time at 60° C. and 70° C.

FIG. 36 shows a diagram 3600 illustrating a comparison of OCV (open circuit voltage) voltages ageing time at 60° C. and 70° C.

Figure 37:
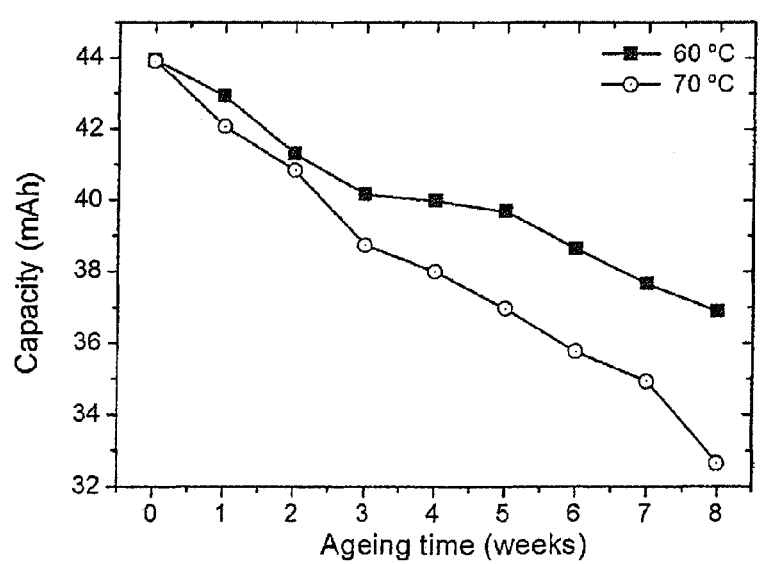
FIG. 37 shows a diagram illustrating a comparison of the capacity vs. ageing time at 60° C. and 70° C.

FIG. 37 shows a diagram 3700 illustrating a comparison of the capacity vs. ageing time at 60° C. and 70° C.

Figure 38:
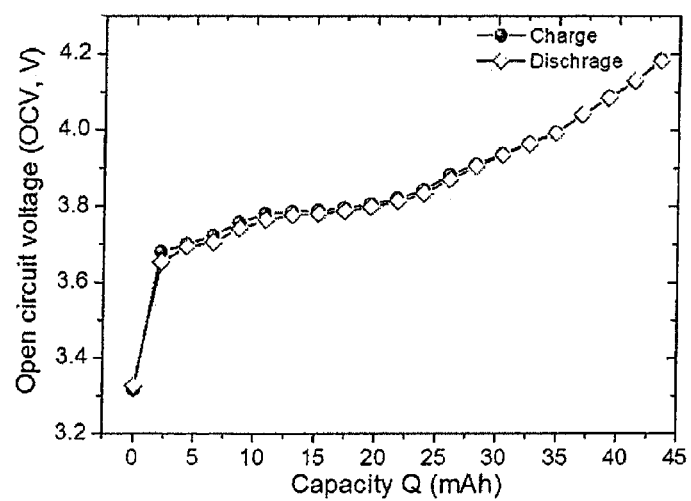
FIG. 38 shows a diagram illustrating OCV of fresh cell Vs (voltages) capacity during charge and discharge.

FIG. 38 shows a diagram 3800 illustrating OCV of fresh cell Vs (voltages) capacity during charge and discharge.

Figure 39:
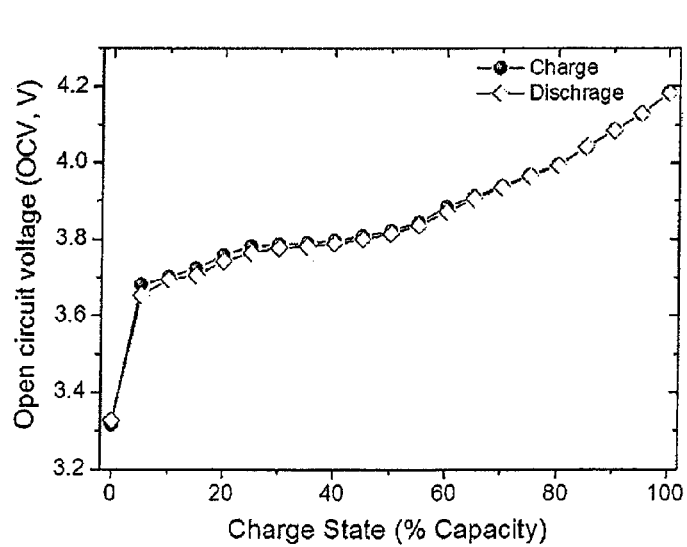
FIG. 39 shows a diagram illustrating OCV of fresh cell Vs SOC during charge and discharge.

FIG. 39 shows a diagram 3900 illustrating OCV of fresh cell Vs SOC during charge and discharge.

Figure 40:
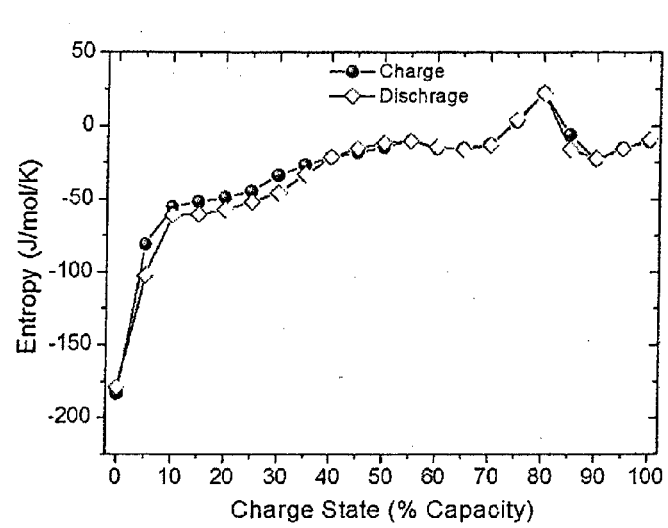
FIG. 40 shows a diagram illustrating entropy of fresh cell Vs SOC during charge and discharge.

FIG. 40 shows a diagram 4000 illustrating entropy of fresh cell Vs SOC during charge and discharge.

Figure 41:
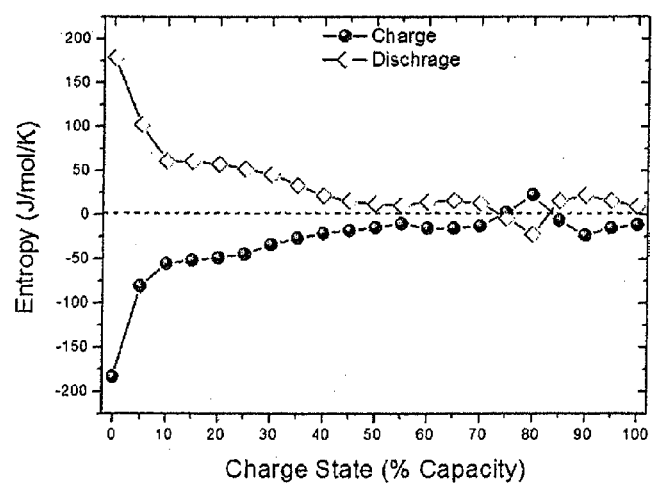
FIG. 41 shows a diagram illustrating entropy of fresh cell Vs SOC during charge and discharge.

FIG. 41 shows a diagram 4100 illustrating entropy of fresh cell Vs SOC during charge and discharge.

Figure 42:
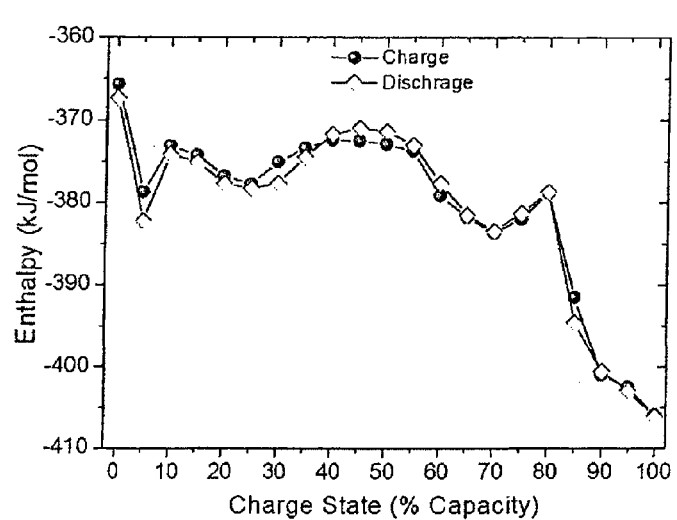
FIG. 42 shows a diagram illustrating enthalpy of fresh cell Vs SOC during charge and discharge.

FIG. 42 shows a diagram 4200 illustrating enthalpy of fresh cell Vs SOC during charge and discharge.

Figure 43:
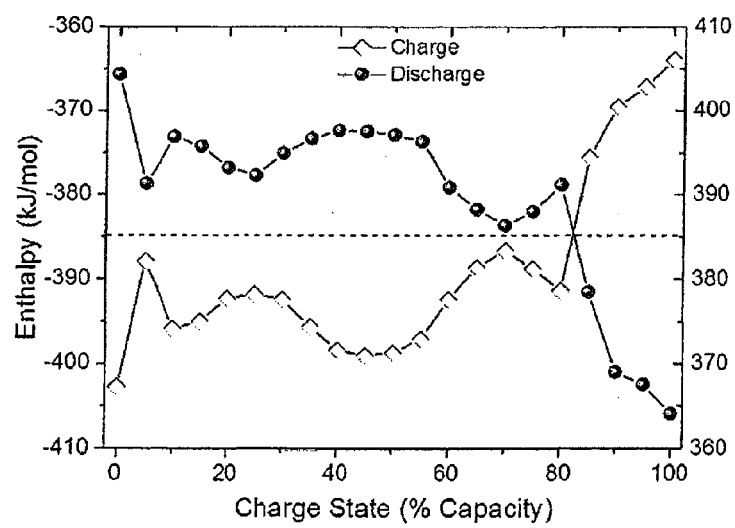
FIG. 43 shows a diagram illustrating enthalpy of fresh cell Vs SOC during charge and discharge.

FIG. 43 shows a diagram 4300 illustrating enthalpy of fresh cell Vs SOC during charge and discharge.

Figure 44:
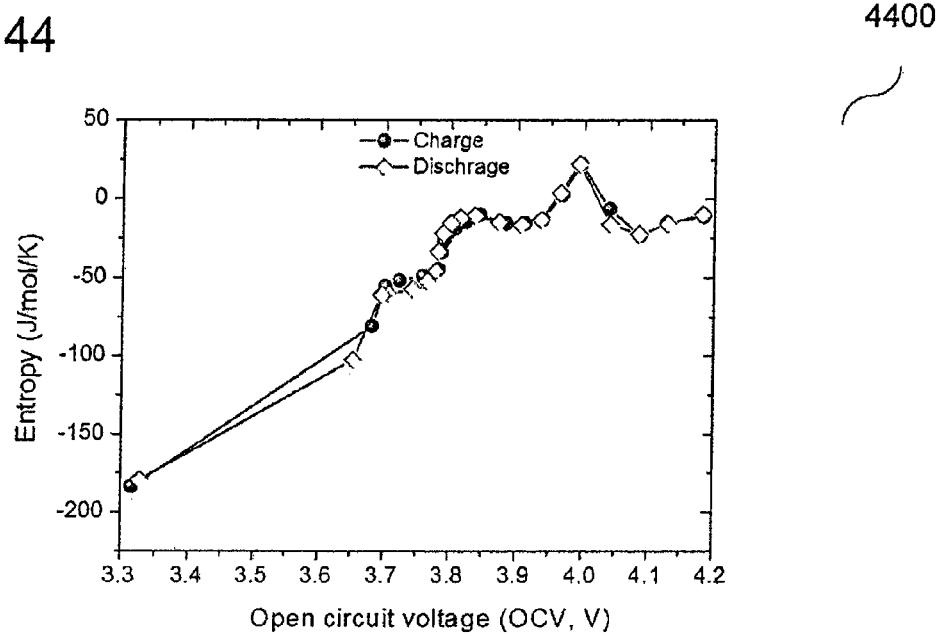
FIG. 44 shows a diagram illustrating entropy of fresh cell Vs OCV during charge and discharge.

FIG. 44 shows a diagram 4400 illustrating entropy of fresh cell Vs OCV during charge and discharge.

Figure 45:
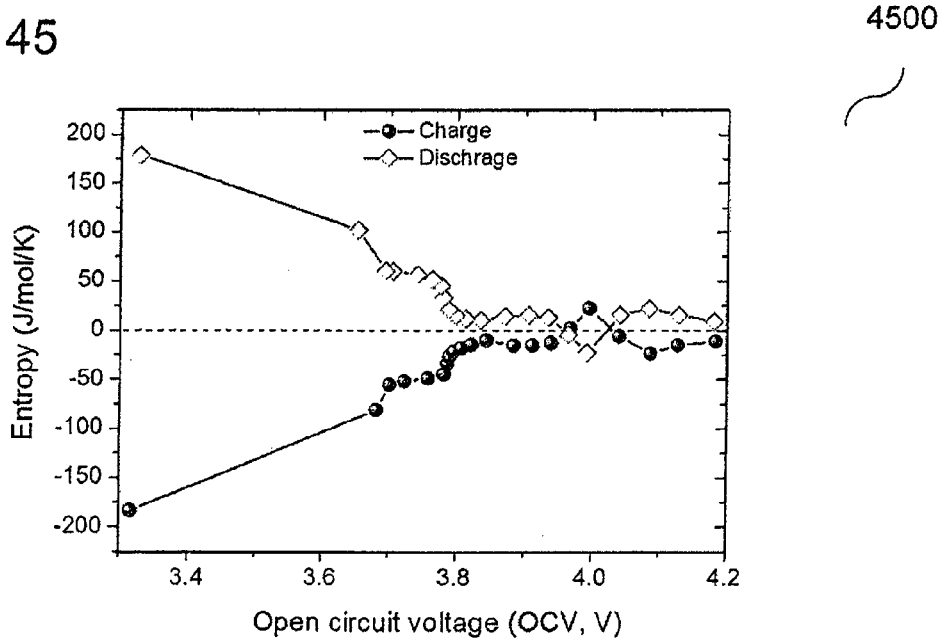
FIG. 45 shows a diagram illustrating entropy of fresh cell Vs OCV during charge and discharge.

FIG. 45 shows a diagram 4500 illustrating entropy of fresh cell Vs OCV during charge and discharge.

Figure 46:
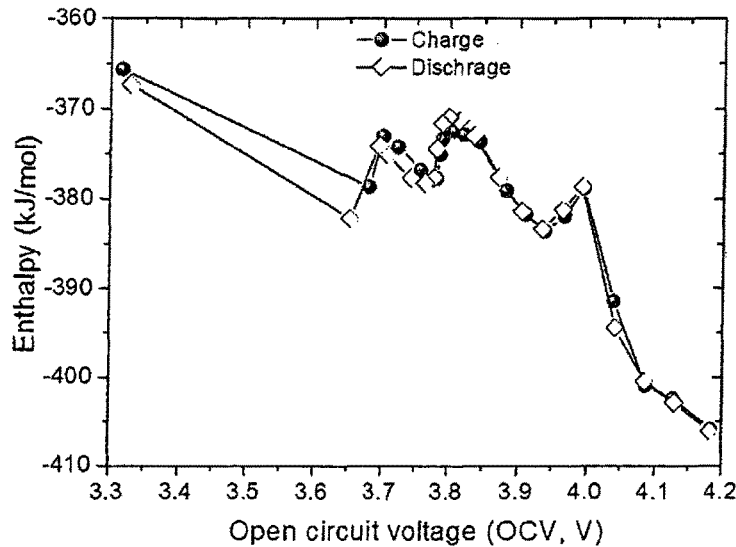
FIG. 46 shows a diagram illustrating enthalpy of fresh cell Vs OCV during charge and discharge.

FIG. 46 shows a diagram 4600 illustrating enthalpy of fresh cell Vs OCV during charge and discharge.

Figure 47:
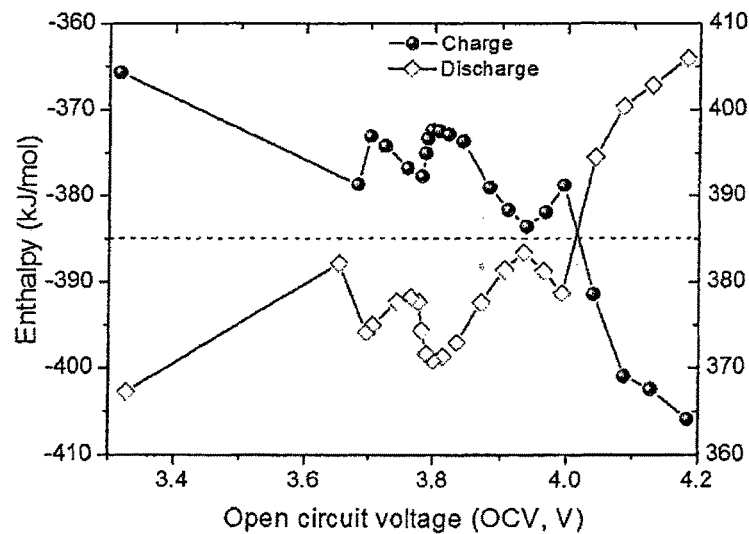
FIG. 47 shows a diagram illustrating enthalpy of fresh cell Vs OCV during charge and discharge.

FIG. 47 shows a diagram 4700 illustrating enthalpy of fresh cell Vs OCV during charge and discharge.

Figure 48:
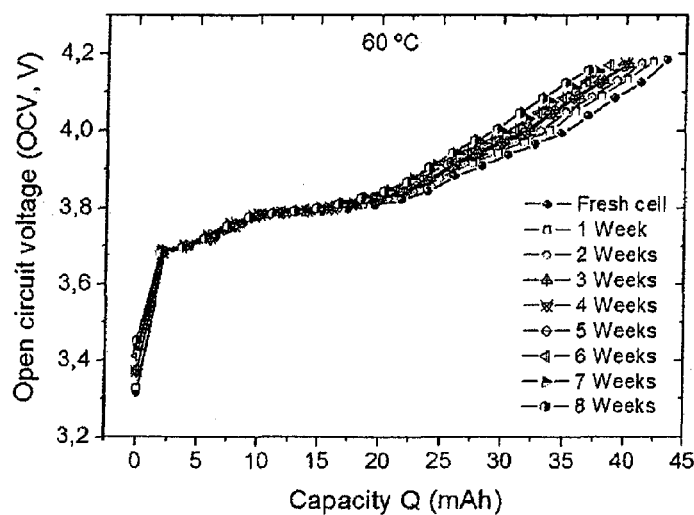
FIG. 48 shows a diagram illustrating OCV profiles of LIB aged at 60° C. Vs capacity during charge.

FIG. 48 shows a diagram 4800 illustrating OCV profiles of LIB aged at 60° C. Vs capacity during charge.

Figure 49:
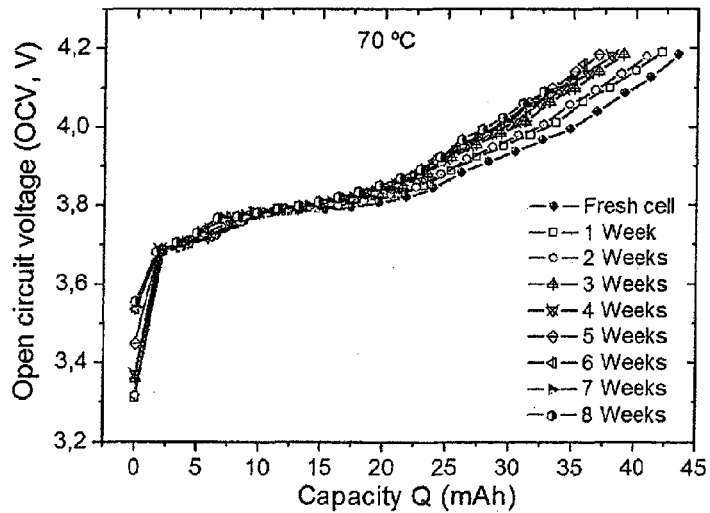
FIG. 49 shows a diagram illustrating OCV profiles of LIB aged at 70° C. Vs capacity during charge.

FIG. 49 shows a diagram 4900 illustrating OCV profiles of LIB aged at 70° C. Vs capacity during charge.

In the following, entropy vs. SOC for the same cells will be described.

Figure 50:
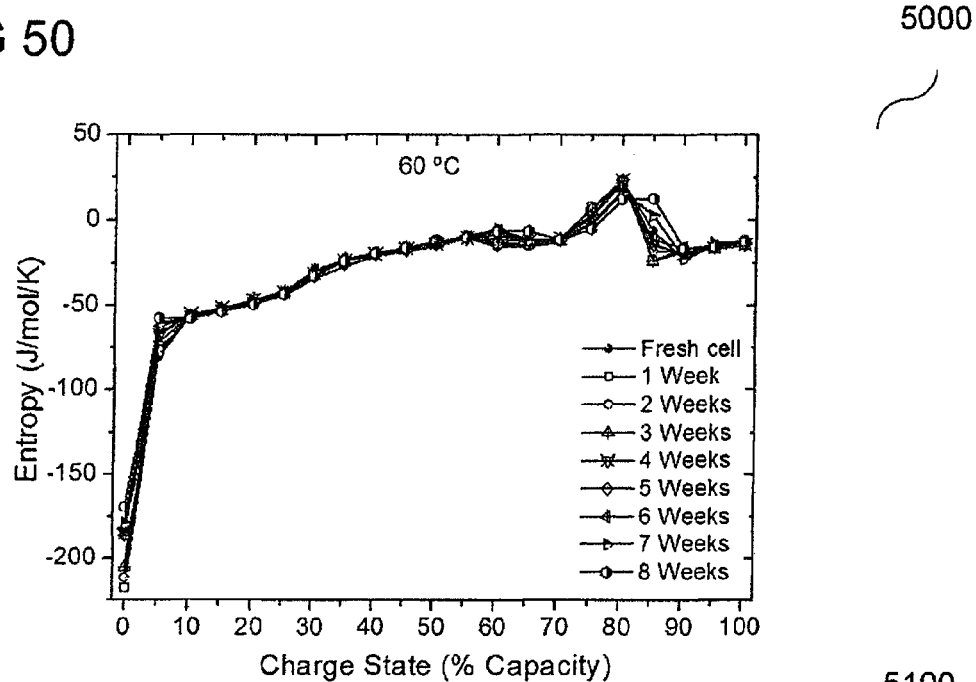
FIG. 50 shows a diagram illustrating entropy profiles of LIB aged at 60° C. Vs SOC during charge.

FIG. 50 shows a diagram 5000 illustrating entropy profiles of LIB aged at 60° C. Vs SOC during charge.

Figure 51:
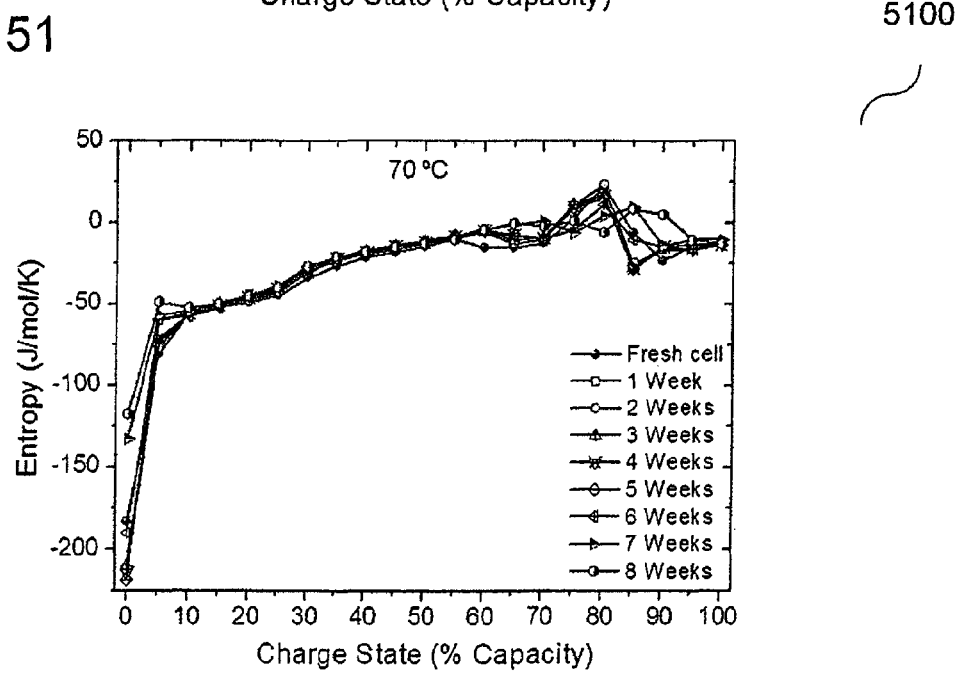
FIG. 51 shows a diagram illustrating entropy profiles of LIB aged at 70° C. Vs SOC during charge.

FIG. 51 shows a diagram 5100 illustrating entropy profiles of LIB aged at 70° C. Vs SOC during charge.

Figure 52:
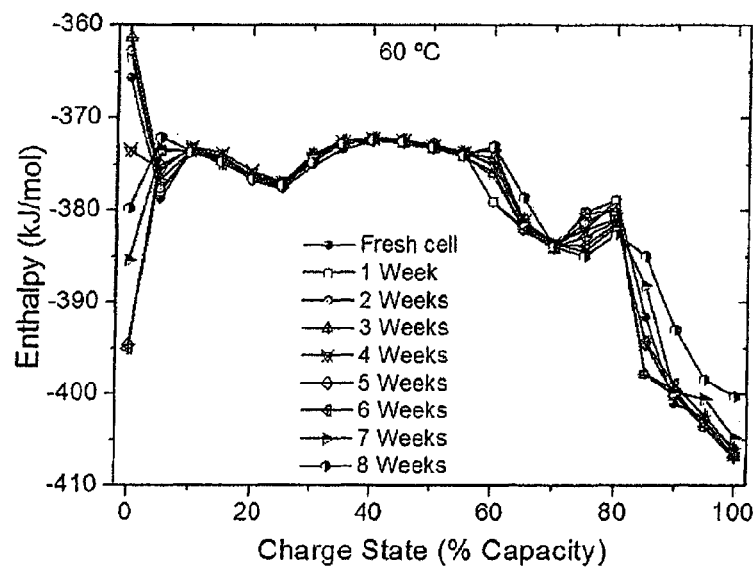
FIG. 52 shows a diagram illustrating enthalpy profiles of LIB aged at 60° C. Vs SOC during charge.

FIG. 52 shows a diagram 5200 illustrating enthalpy profiles of LIB aged at 60° C. Vs SOC during charge.

Figure 53:
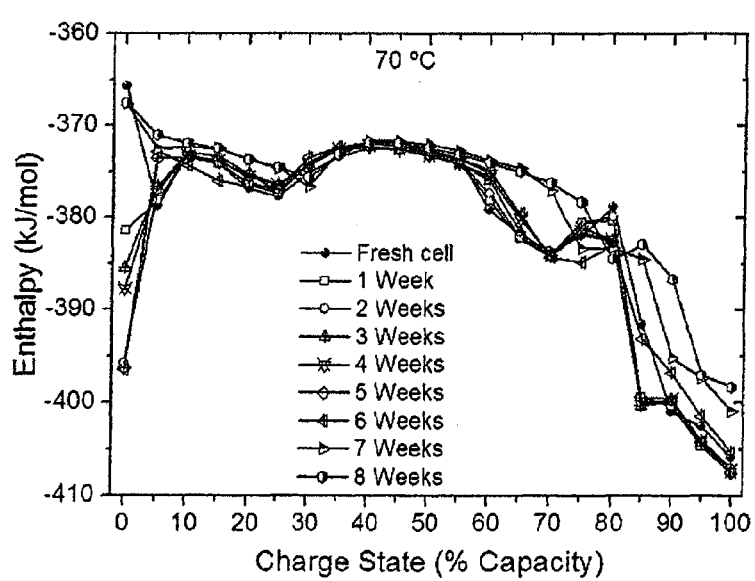
FIG. 53 shows a diagram illustrating enthalpy profiles of LIB aged at 70° C. Vs SOC during charge.

FIG. 53 shows a diagram 5300 illustrating enthalpy profiles of LIB aged at 70° C. Vs SOC during charge.

Figure 54:
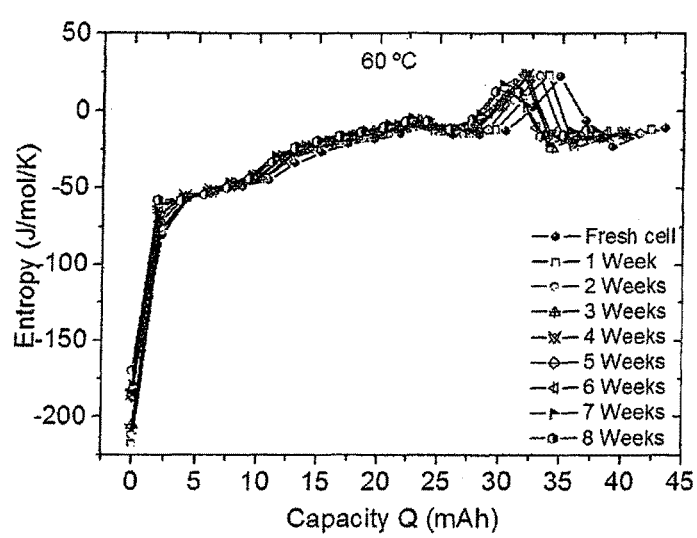
FIG. 54 shows a diagram illustrating entropy profiles of LIB aged at 60° C. Vs capacity during charge.

FIG. 54 shows a diagram 5400 illustrating entropy profiles of LIB aged at 60° C. Vs capacity during charge.

Figure 55:
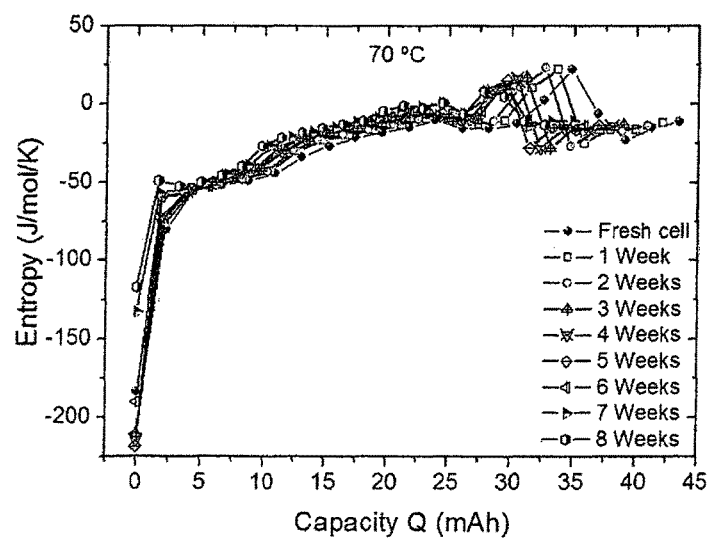
FIG. 55 shows a diagram illustrating entropy profiles of LIB aged at 70° C. Vs capacity during charge.

FIG. 55 shows a diagram 5500 illustrating entropy profiles of LIB aged at 70° C. Vs capacity during charge.

Figure 56:
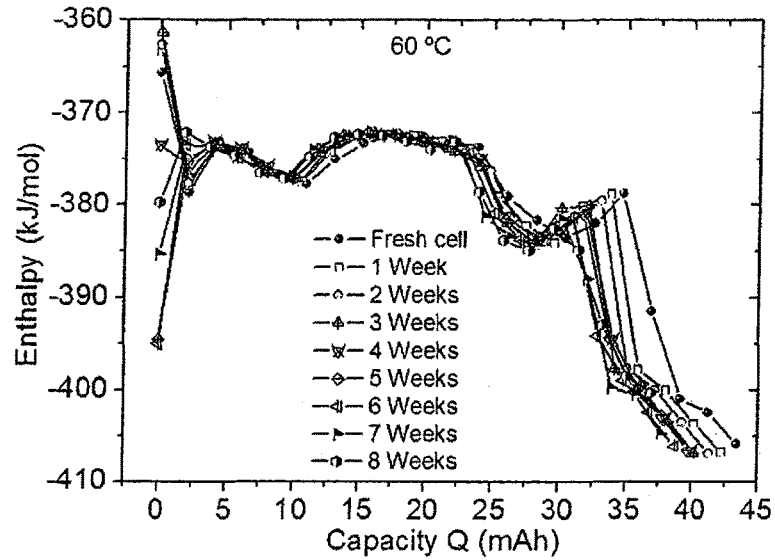
FIG. 56 shows a diagram illustrating enthalpy profiles of LIB aged at 60° C. Vs capacity during charge.

FIG. 56 shows a diagram 5600 illustrating enthalpy profiles of LIB aged at 60° C. Vs capacity during charge.

Figure 57:
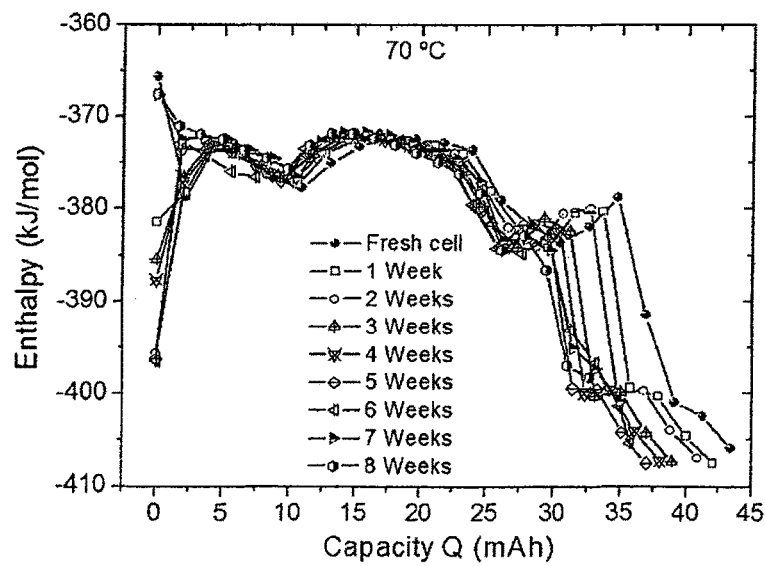
FIG. 57 shows a diagram illustrating enthalpy profiles of LIB aged at 70° C. Vs capacity during charge.

FIG. 57 shows a diagram 5700 illustrating enthalpy profiles of LIB aged at 70° C. Vs capacity during charge.

Figure 58:
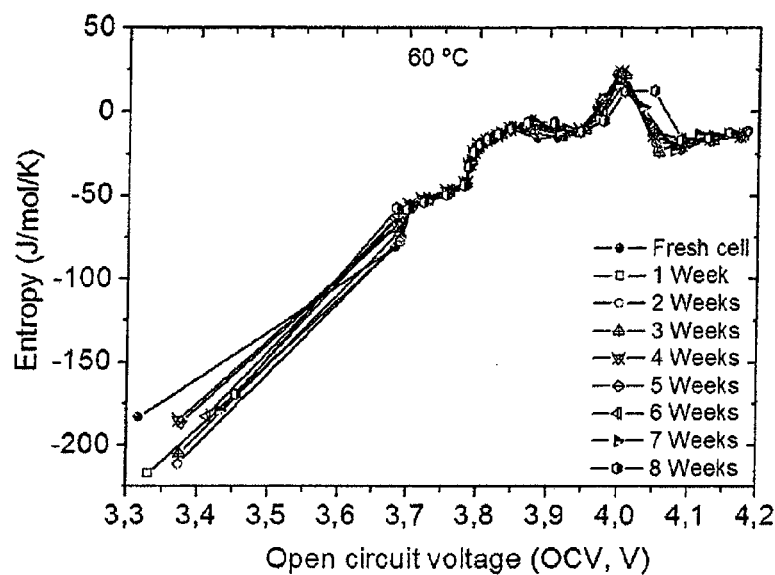
FIG. 58 shows a diagram illustrating entropy profiles of LIB aged at 60° C. Vs OCV during charge.

FIG. 58 shows a diagram 5800 illustrating entropy profiles of LIB aged at 60° C. Vs OCV during charge.

Figure 59:
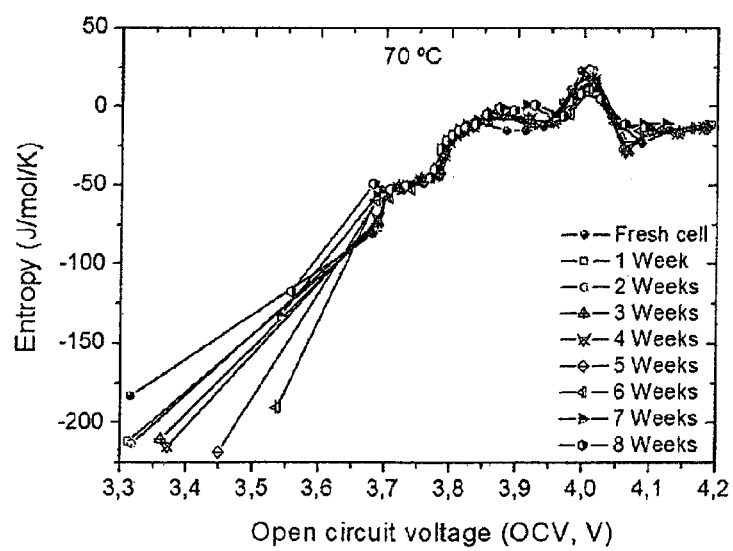
FIG. 59 shows a diagram illustrating entropy profiles of LIB aged at 70° C. Vs OCV during charge.

FIG. 59 shows a diagram 5900 illustrating entropy profiles of LIB aged at 70° C. Vs OCV during charge.

Figure 60:
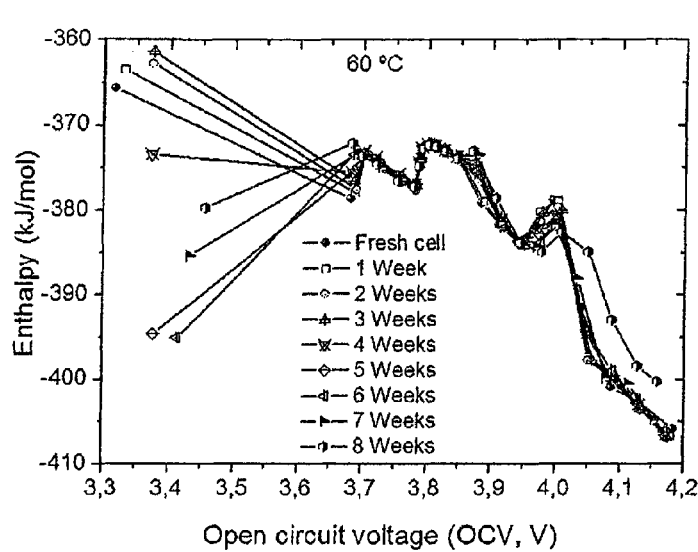
FIG. 60 shows a diagram illustrating enthalpy profiles of LIB aged at 60° C. Vs OCV during charge.

FIG. 60 shows a diagram 6000 illustrating enthalpy profiles of LIB aged at 60° C. Vs OCV during charge.

Figure 61:
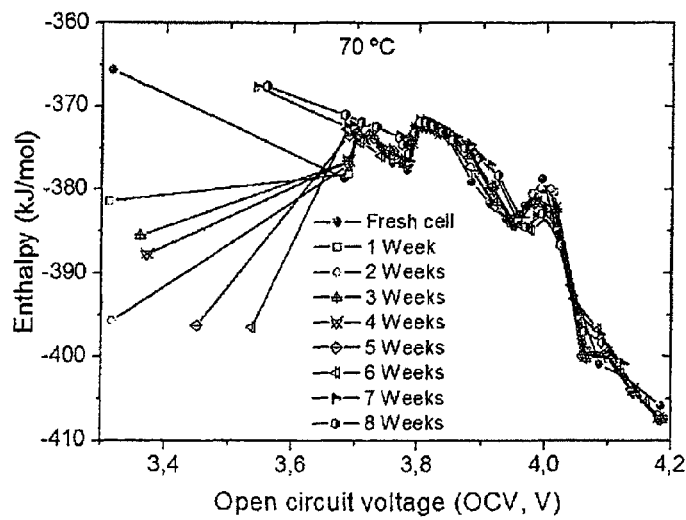
FIG. 61 shows a diagram illustrating enthalpy profiles of LIB aged at 70° C. Vs OCV during charge.

FIG. 61 shows a diagram 6100 illustrating enthalpy profiles of LIB aged at 70° C. Vs OCV during charge.

Figure 62:
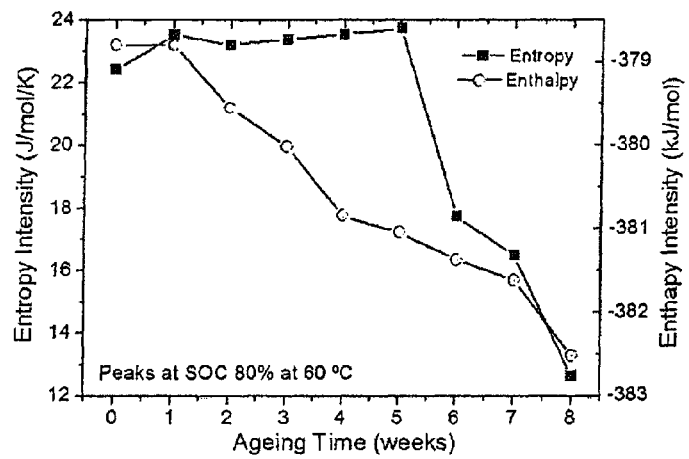
FIG. 62 shows a diagram illustrating evolution of the entropy and enthalpy peaks intensity at 80% SOC with ageing time for cells aged at 60° C.

FIG. 62 shows a diagram 6200 illustrating evolution of the entropy and enthalpy peaks intensity at 80% SOC with ageing time for cells aged at 60° C.

Figure 63:
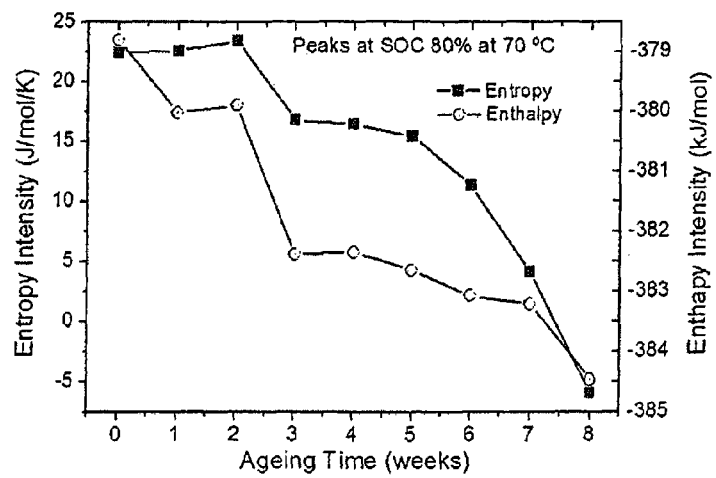
FIG. 63 shows a diagram illustrating evolution of the entropy and enthalpy peaks intensity at 80% SOC with ageing time for cells aged at 70° C.

FIG. 63 shows a diagram 6300 illustrating evolution of the entropy and enthalpy peaks intensity at 80% SOC with ageing time for cells aged at 70° C.

Figure 64:
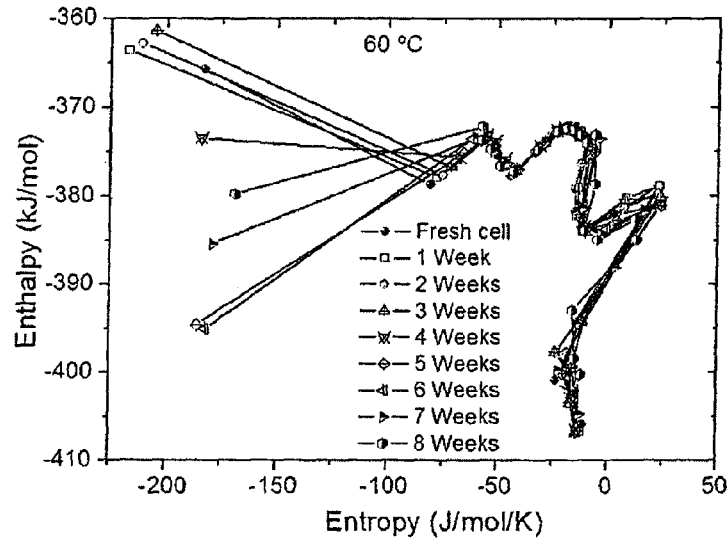
FIG. 64 shows a diagram illustrating enthalpy profiles of LIB aged at 60° C. Vs Entropy during charge.

FIG. 64 shows a diagram 6400 illustrating enthalpy profiles of LIB aged at 60° C. Vs Entropy during charge.

Figure 65:
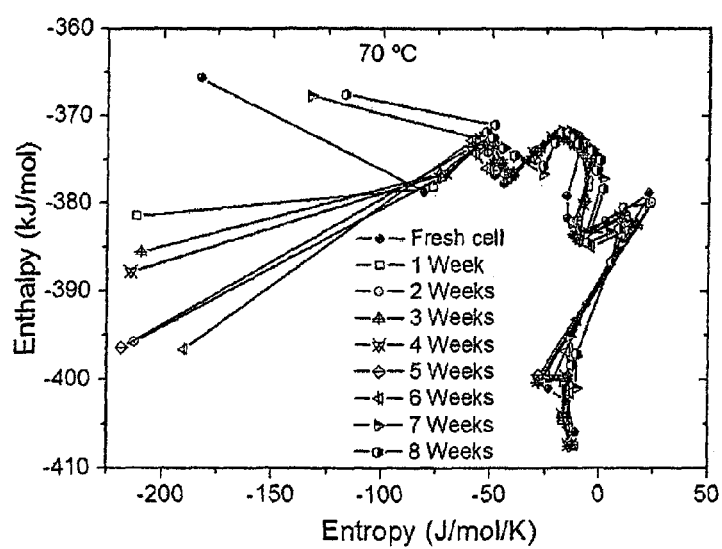
FIG. 65 shows a diagram illustrating enthalpy profiles of LIB aged at 60° C. Vs Entropy during charge.

FIG. 65 shows a diagram 6500 illustrating enthalpy profiles of LIB aged at 60° C. Vs Entropy during charge.

Figure 66:
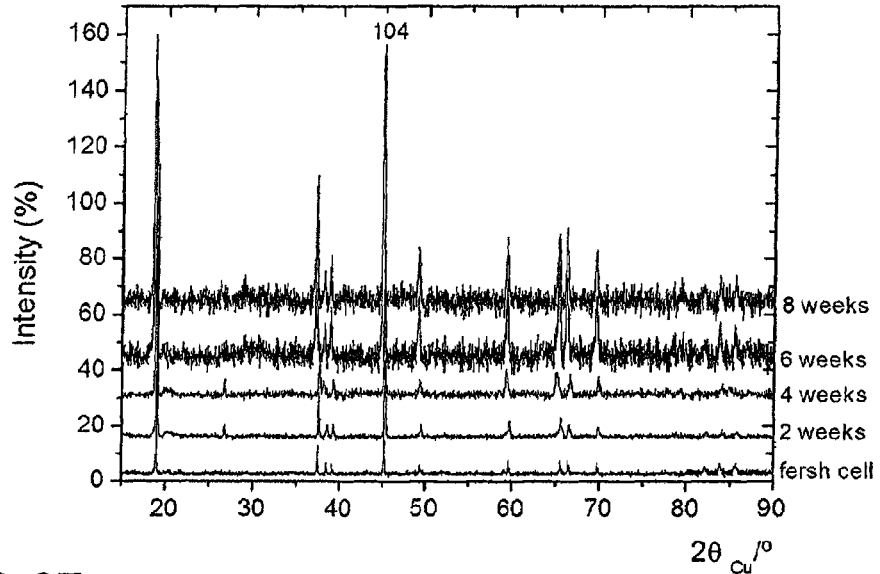
FIG. 66 shows a diagram illustrating X-ray diffraction (XRD) patterns of LiCoO2 (LCO) of the cells aged at 60° C.

FIG. 66 shows a diagram 6600 illustrating X-ray diffraction (XRD) patterns of LiCoO2 (LCO) of the cells aged at 60° C.

Figure 67:
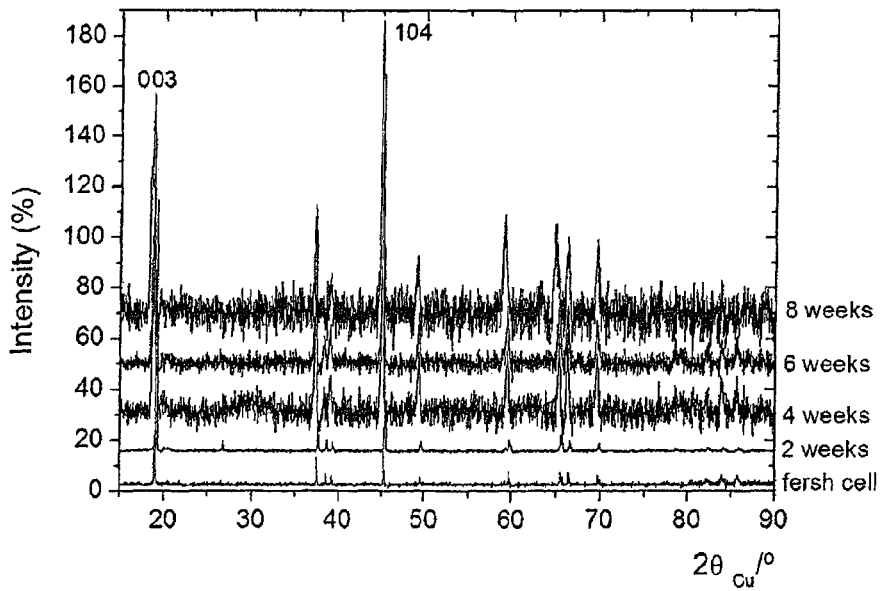
FIG. 67 shows a diagram illustrating X-ray diffraction patterns of LiCoO2 of the cells aged at 70° C.

FIG. 67 shows a diagram 6700 illustrating X-ray diffraction patterns of LiCoO2 of the cells aged at 70° C.

In the following, XRD for graphite will be described.

Figure 68:
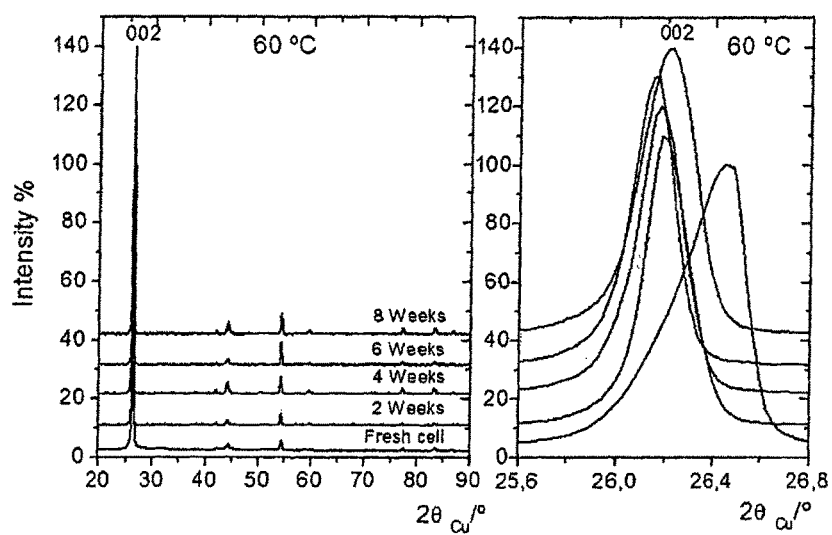
FIG. 68 shows a diagram illustrating X-ray diffraction patterns of the graphite anode of the cells aged at 60° C.

FIG. 68 shows a diagram 6800 illustrating X-ray diffraction patterns of the graphite anode of the cells aged at 60° C.

Figure 69:
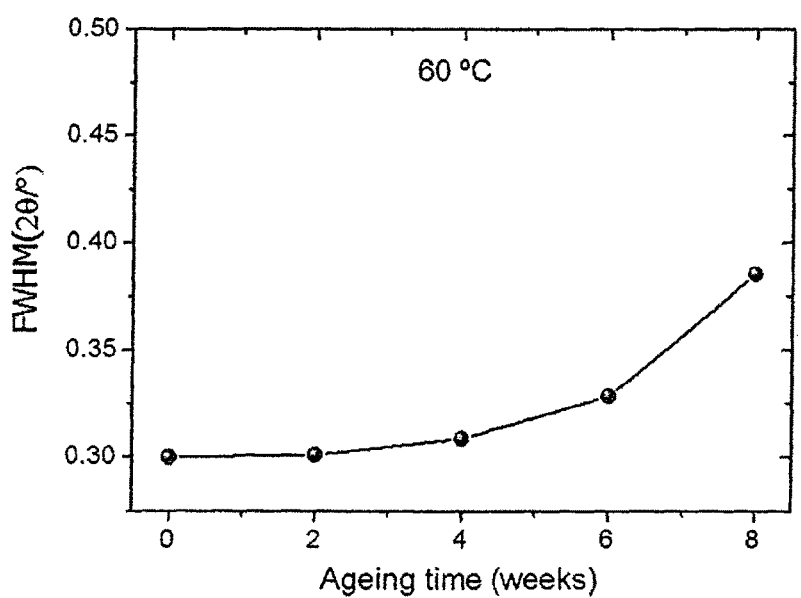
FIG. 69 shows a diagram illustrating evolution of the graphite anode 002 peak Full Width at Half-Maximum (FWHM) vs ageing time for cells aged at 60° C.

FIG. 69 shows a diagram 6900 illustrating evolution of the graphite anode 002 peak Full Width at Half-Maximum (FWHM) vs ageing time for cells aged at 60° C.

Figure 70:
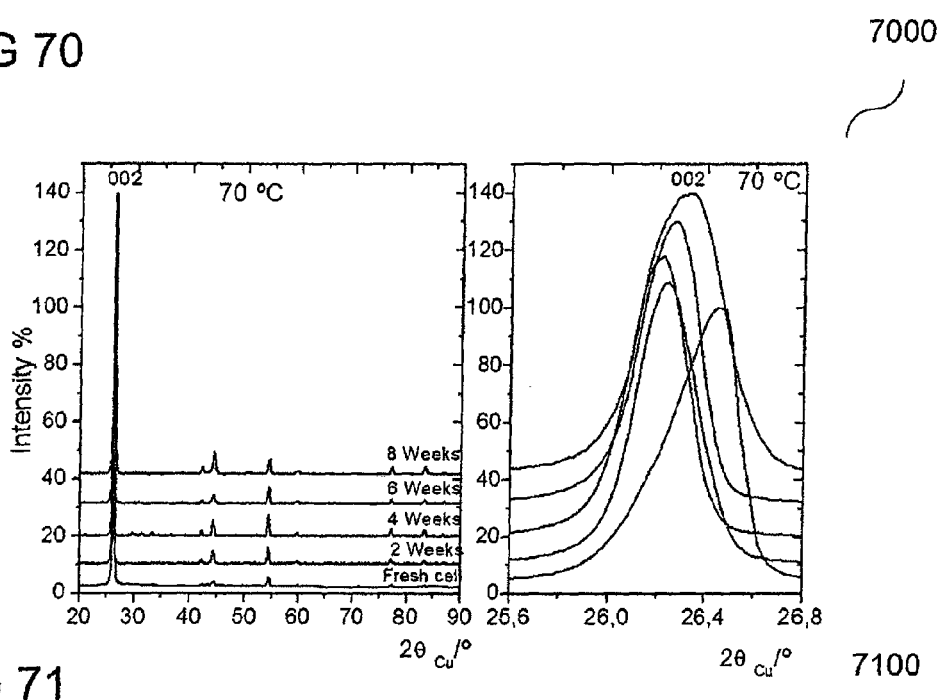
FIG. 70 shows a diagram illustrating X-ray diffraction patterns of the graphite anode of the cells aged at 70° C.

FIG. 70 shows a diagram 7000 illustrating X-ray diffraction patterns of the graphite anode of the cells aged at 70° C.

Figure 71:
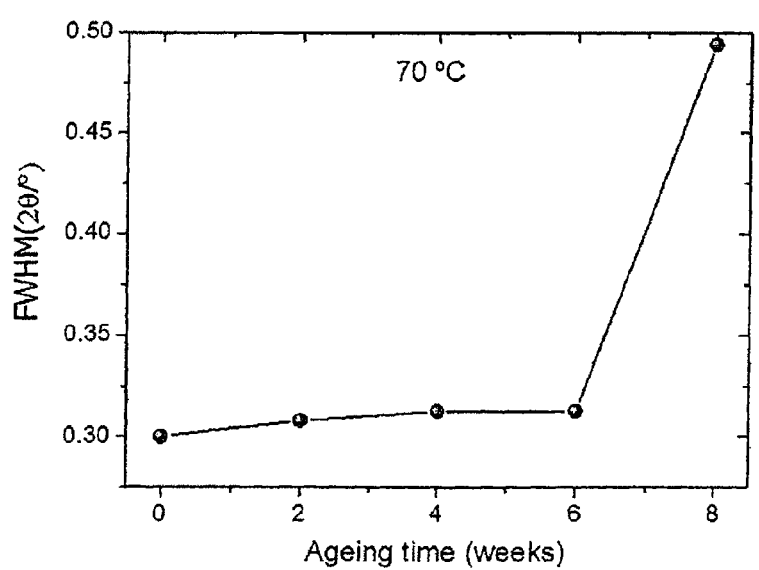
FIG. 71 shows a diagram illustrating evolution of the graphite anode 002 peak Full Width at Half-Maximum (FWHM) vs ageing time for cells aged at 70° C.

FIG. 71 shows a diagram 7100 illustrating evolution of the graphite anode 002 peak Full Width at Half-Maximum (FWHM) vs ageing time for cells aged at 70° C.

In the following, a differential thermodynamic method according to various embodiments will be further described.

The differential properties may be given (with S relating to entropy and H relating to enthalpy) by:

$$d(\Delta S) = \Delta S(\text{After Ageing}) - \Delta S(\text{Before Ageing}) \text{ and}$$

$$d(\Delta H) = \Delta H(\text{After Ageing}) - \Delta H(\text{Before Ageing}).$$

Figure 72:
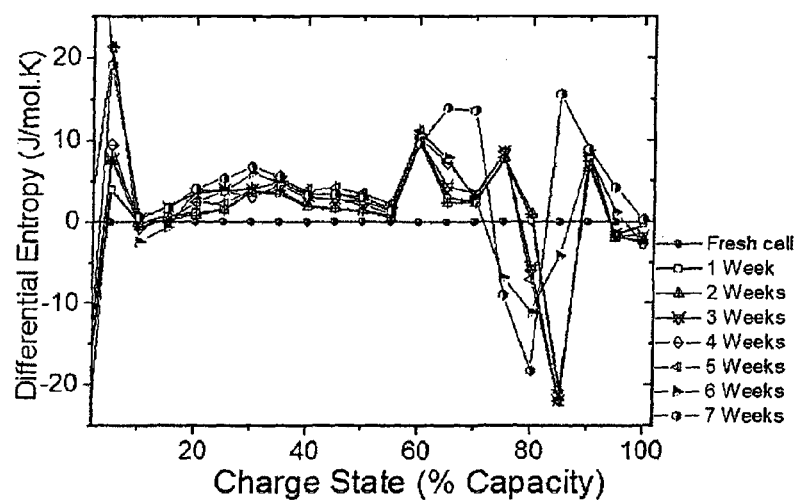
FIG. 72 shows a diagram illustrating differential Entropy of LIB aged at 70° C. Vs SOC during charge.

FIG. 72 shows a diagram 7200 illustrating differential Entropy of LIB aged at 70° C. Vs SOC during charge.

Figure 73:
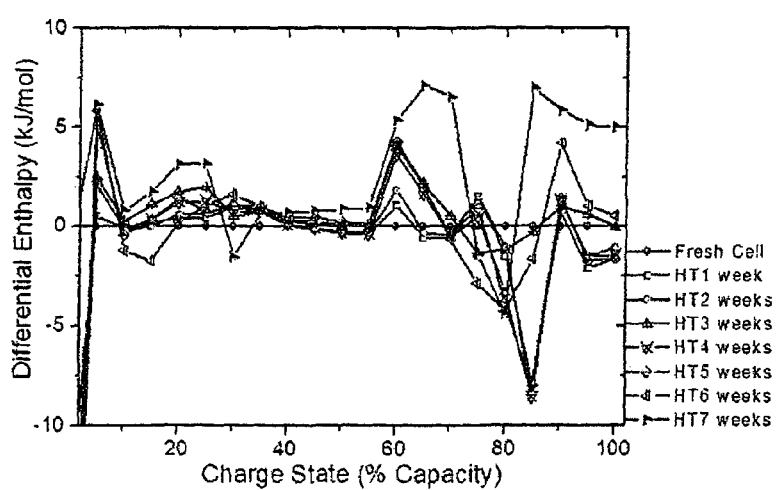
FIG. 73 shows a diagram illustrating differential Enthalpy of LIB aged at 70° C. Vs SOC during charge.

FIG. 73 shows a diagram 7300 illustrating differential Enthalpy of LIB aged at 70° C. Vs SOC during charge.

Figure 74:
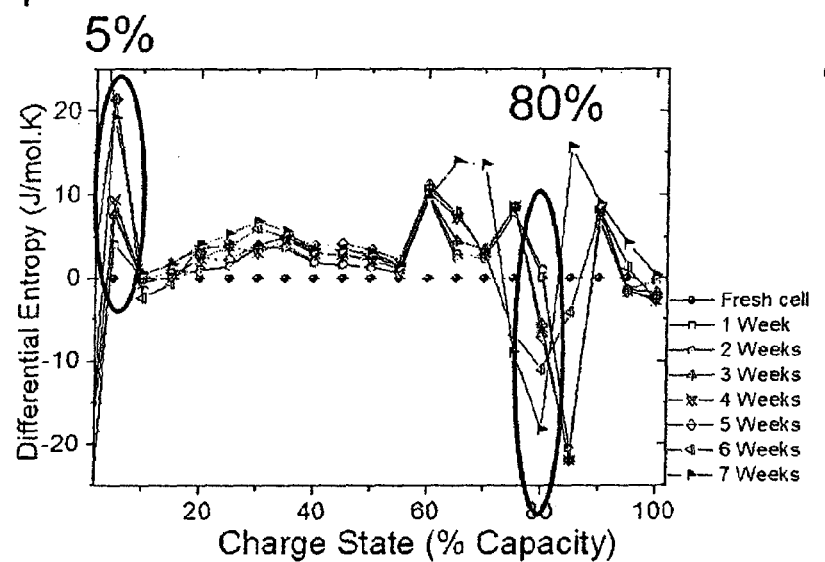
FIG. 74 shows a diagram illustrating a comparison of differential entropy at 5% and 80% SOC peaks.

FIG. 74 shows a diagram 7400 illustrating a comparison of differential entropy at 5% and 80% SOC peaks.

Figure 75:
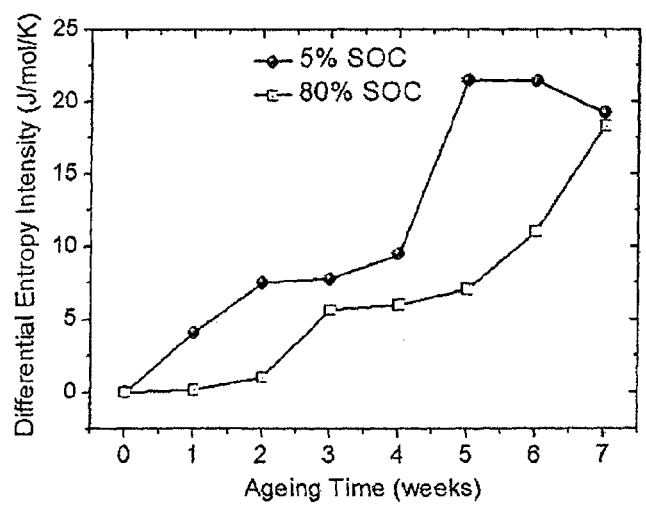
FIG. 75 shows a diagram illustrating a comparison of differential entropy at 5% and 80% SOC peaks.

FIG. 75 shows a diagram 7500 illustrating a comparison of differential entropy at 5% and 80% SOC peaks.

In the following, effects of high voltage ageing on entropy and enthalpy of LIB will be further described.

Figure 76:
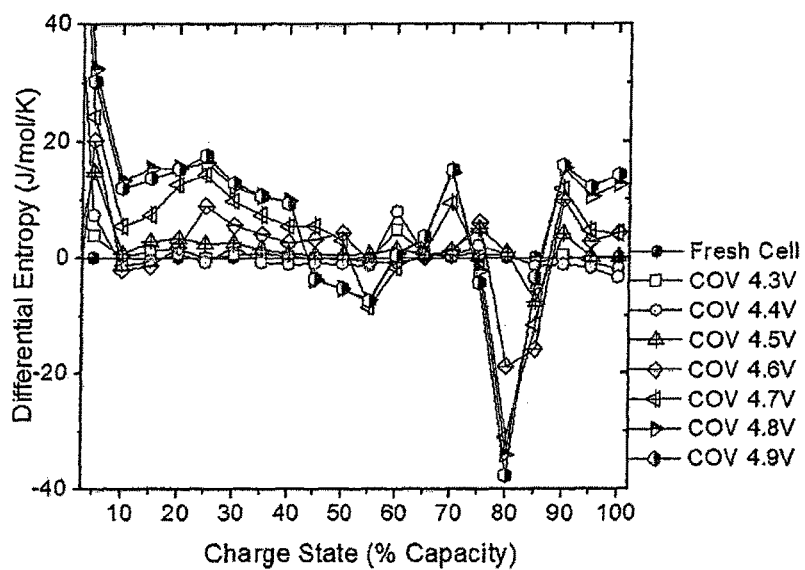
FIG. 76 shows a diagram illustrating differential Entropy of LIB after overcharge Vs SOC during charge.

FIG. 76 shows a diagram 7600 illustrating differential Entropy of LIB after overcharge Vs SOC during charge.

In the following, differential entropymetry and enthalpymetry will be described.

Figure 77:
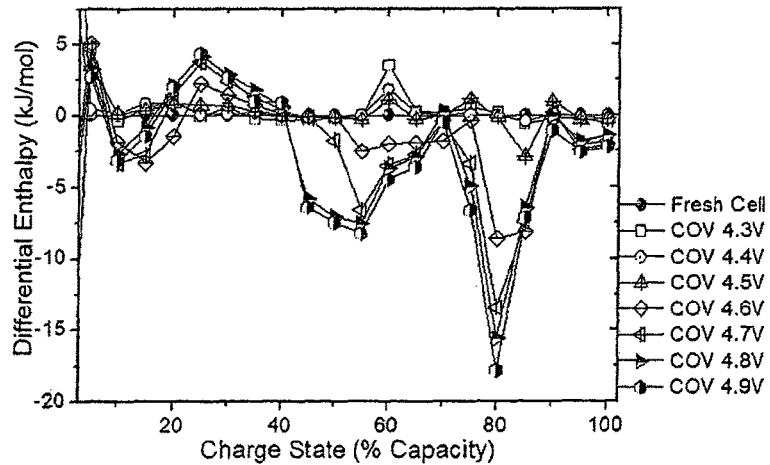
FIG. 77 shows a diagram illustrating differential Enthalpy of LIB after overcharge Vs SOC during charge.

FIG. 77 shows a diagram 7700 illustrating differential Enthalpy of LIB after overcharge Vs SOC during charge.

Figure 78:
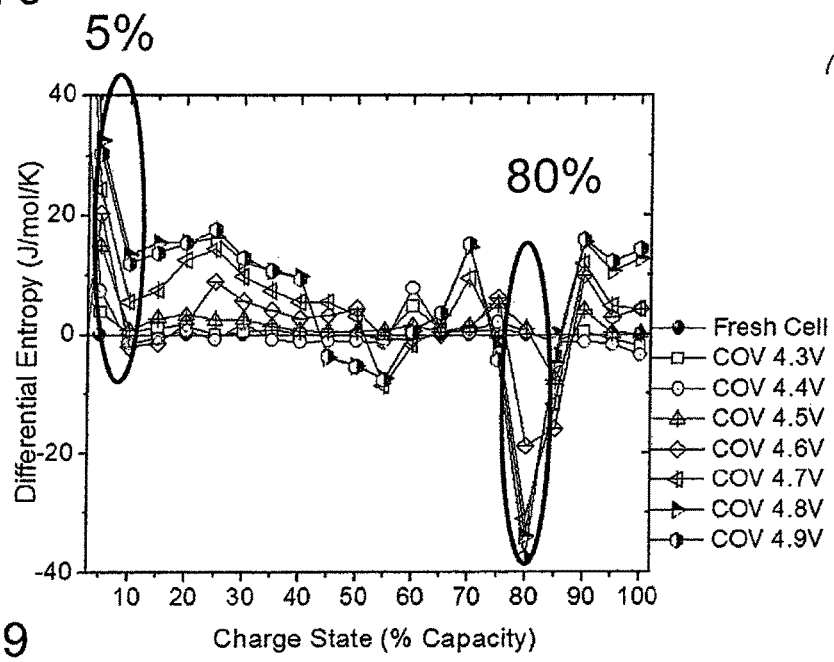
FIG. 78 shows a diagram illustrating a comparison of differential entropy at 5% and 80% SOC peaks.

FIG. 78 shows a diagram 7800 illustrating a comparison of differential entropy at 5% and 80% SOC peaks.

Figure 79:
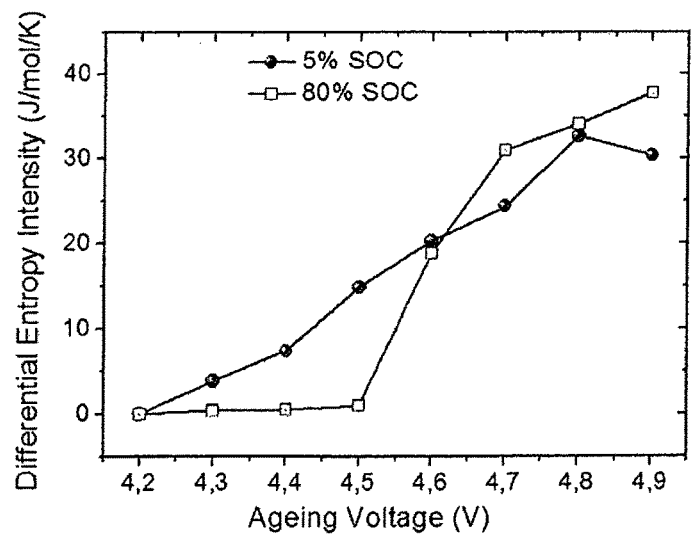
FIG. 79 shows a diagram illustrating a comparison of differential entropy at 5% and 80% SOC peaks.

FIG. 79 shows a diagram 7900 illustrating a comparison of differential entropy at 5% and 80% SOC peaks.

In the following, an effect of cycling ageing on entropy and enthalpy of LIB will be described.

Figure 80:
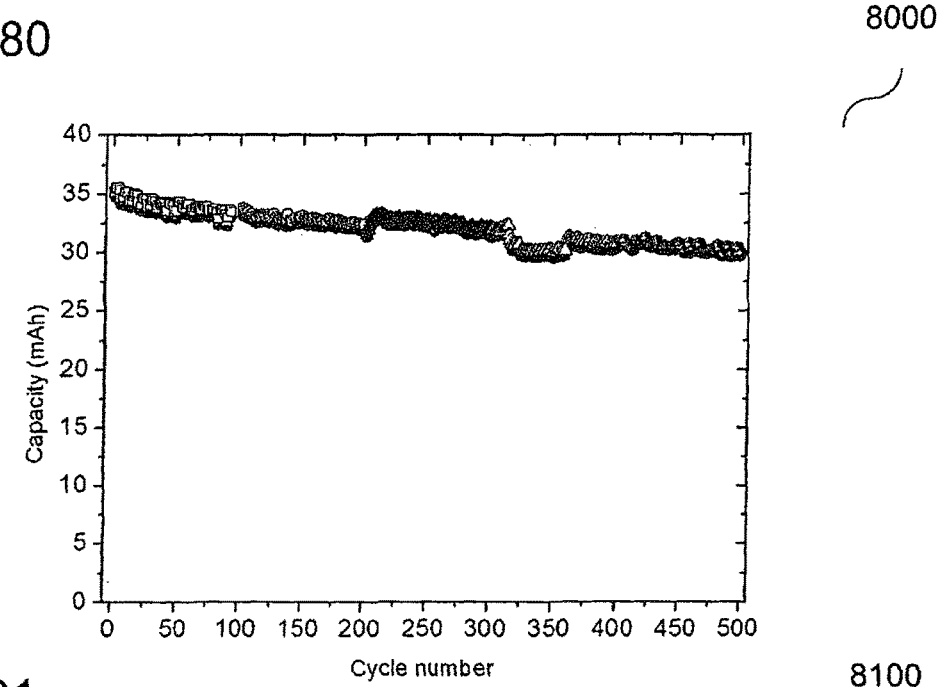
FIG. 80 shows a diagram illustrating capacity vs. cycle number of LIB cells cycled at C/2 rate.

FIG. 80 shows a diagram 8000 illustrating capacity vs. cycle number of LIB cells cycled at C/2 rate.

Figure 81:
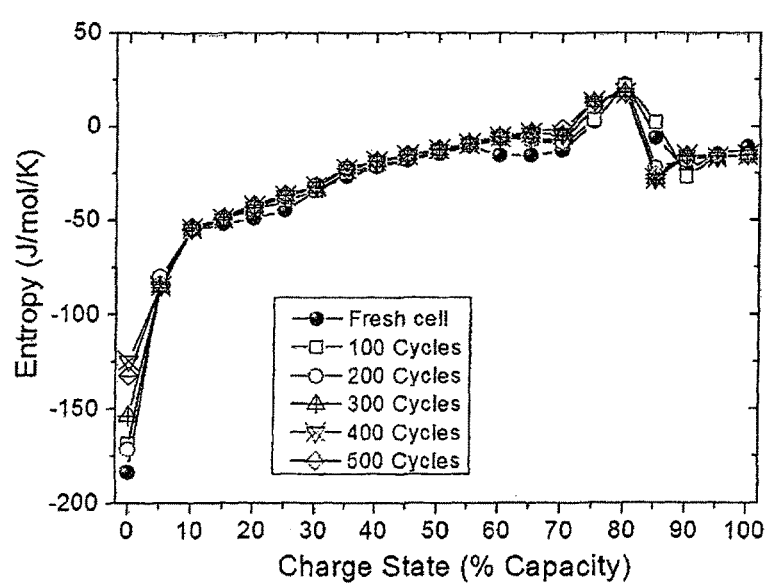
FIG. 81 shows a diagram illustrating entropy profiles of LIB cells cycled at a C/2 rate for up to 500 cycles.

FIG. 81 shows a diagram 8100 illustrating entropy profiles of LIB cells cycled at a C/2 rate for up to 500 cycles.

Figure 82:
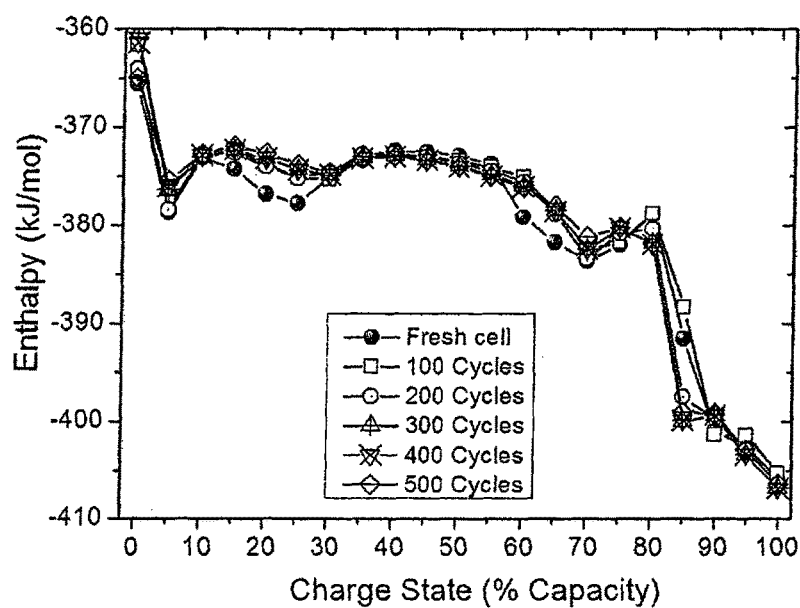
FIG. 82 shows a diagram illustrating enthalpy profiles of LIB cells cycled at a C/2 rate for 500 cycles.

FIG. 82 shows a diagram 8200 illustrating enthalpy profiles of LIB cells cycled at a C/2 rate for 500 cycles.

Figure 83:
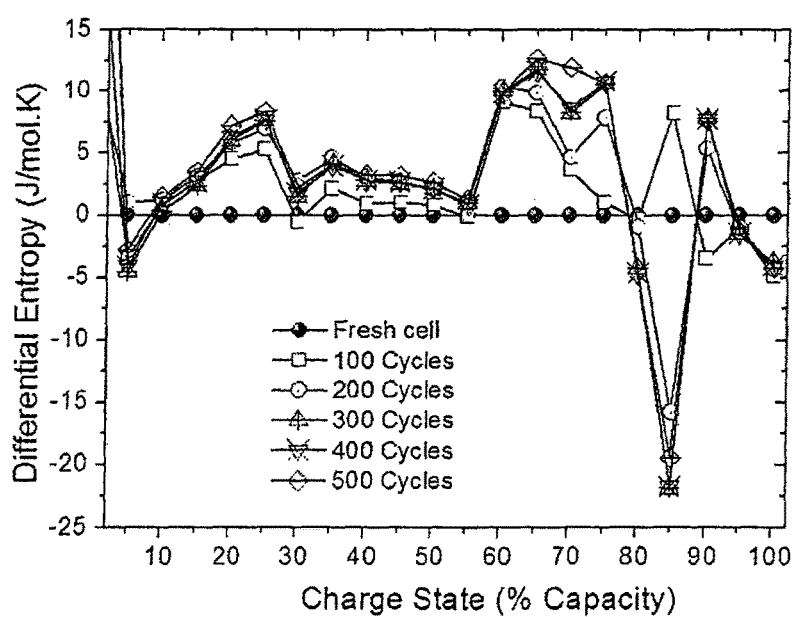
FIG. 83 shows a diagram illustrating differential entropy of LIB cells cycled at a C/2 rate for 500 cycles.

FIG. 83 shows a diagram 8300 illustrating differential entropy of LIB cells cycled at a C/2 rate for 500 cycles.

Figure 84:
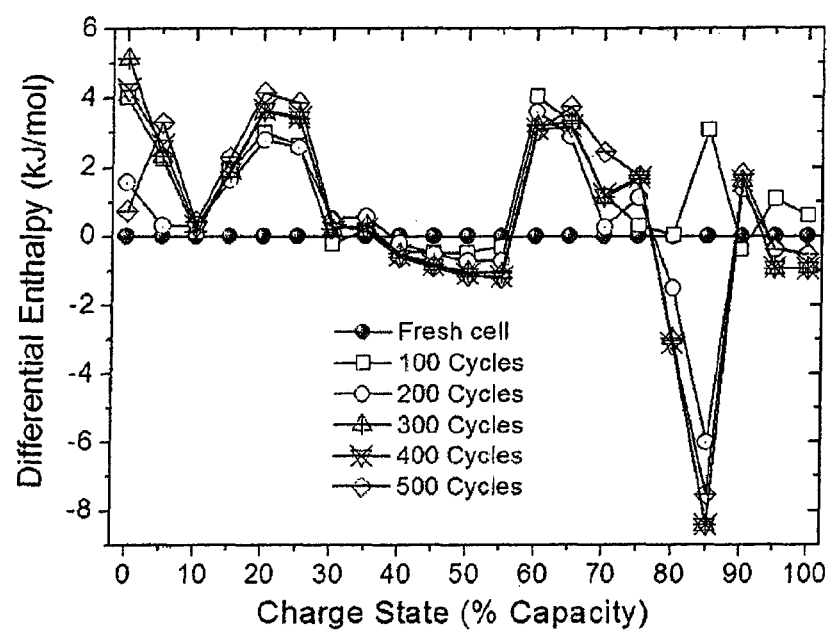
FIG. 84 shows a diagram illustrating differential enthalpy of LIB cells cycled at a C/2 rate for 500 cycles.

FIG. 84 shows a diagram 8400 illustrating differential enthalpy of LIB cells cycled at a C/2 rate for 500 cycles.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A device for testing a battery, the device comprising:
a determination circuit configured to determine for a plurality of charging states of the battery at least one of a derivative entropy of the battery and a differential entropy of the battery; and
an evaluation circuit configured to evaluate a health state of the battery based on the determined at least one of the derivative entropy and the differential entropy of the battery for the plurality of charging states of the battery, wherein:
the derivative entropy of the battery is based on an entropy state function of the battery and at least one of a lithium stoichiometry in an anode of the battery and a lithium stoichiometry in a cathode of the battery; and
the differential entropy of the battery is based on the entropy state function of the battery before exposure to at least one of a substantial voltage and a substantial temperature and on the entropy state function of the battery after exposure to the at least one of the substantial voltage and the substantial temperature.

2. The device of claim 1, further comprising:
a charging circuit configured to charge the battery.

3. The device of claim 1, further comprising:
a discharging circuit configured to discharge the battery.

4. The device of claim 1, further comprising:
at least one of a heating circuit configured to heat the battery and a cooling circuit configured to cool the battery.

5. The device of claim 1, further comprising:
an entropy measuring circuit configured to measure an entropy of the battery.

6. The device of claim 1, further comprising:
an enthalpy measuring circuit configured to measure an enthalpy of the battery.

7. The device of claim 1, further comprising:
an entropy measuring circuit configured to measure an entropy of a new battery and to measure an entropy of a used battery;
wherein the determination circuit is further configured to determine the differential entropy of the battery based on the measurement of the entropy of the new battery and the measurement of the entropy of the used battery.

8. The device of claim 1, further comprising:
an enthalpy measuring circuit configured to measure an enthalpy of a new battery and to measure an enthalpy of a used battery;
wherein the determination circuit is further configured to determine a differential enthalpy of the battery based on the measurement of the enthalpy of the new battery and the measurement of the enthalpy of the used battery.

9. The device of claim 1,
wherein the determination circuit is further configured to determine derivative enthalpies of the battery for a plurality of charging states of the battery; and
wherein the evaluation circuit is configured to evaluate the health state of the battery based on the determined derivative enthalpies of the battery for the plurality of charging states of the battery.

10. The device of claim 1,
wherein the determination circuit is configured to determine derivative entropies of the battery for a plurality of charging states of the battery; and
wherein the evaluation circuit is configured to evaluate the health state of the battery based on the determined derivative entropies of the battery for the plurality of charging states of the battery.

11. The device of claim 1,
wherein the determination circuit is configured to determine differential enthalpies of the battery for a plurality of charging states of the battery; and
wherein the evaluation circuit is configured to evaluate the health state of the battery based on the determined differential enthalpies of the battery for the plurality of charging states of the battery.

12. The device of claim 1,
wherein the determination circuit is configured to determine differential entropies of the battery for a plurality of charging states of the battery; and
wherein the evaluation circuit is configured to evaluate the health state of the battery based on the determined differential entropies of the battery for the plurality of charging states of the battery.

13. The device of claim 1, wherein the device is a chip.

14. The device of claim 13, wherein the chip is embedded in the battery.

15. The device of claim 13, wherein the chip is embedded in a battery module.

16. The device of claim 13, wherein the chip is embedded in a battery pack.

17. The device of claim 1, wherein the derivative entropy of the battery is at least substantially equal to:
a derivative of an entropy state function of the battery with respect to at least one of the lithium stoichiometry in the anode of the battery and the lithium stoichiometry in the cathode of the battery.

18. The device of claim 1, wherein the derivative entropy of the battery is at least substantially equal to:

$$\delta S(x) = \frac{\partial \Delta S(x)}{\partial x};$$

wherein "$\Delta S(x)$" refers to an entropy state of the battery as a function of x;
wherein "x" refers to the at least one of the lithium stoichiometry in the anode of the battery and the lithium stoichiometry in the cathode of the battery;
wherein "$\delta S(x)$" refers to a derivative entropy state of the battery as a function of "x";
wherein $$"\frac{\partial \Delta S(x)}{\partial x}"$$

refers to a derivative entropy state function of the battery with respect to "x".

19. The device of claim 1, wherein the differential entropy of the battery is at least substantially equal to:
a difference between the entropy state function of the battery before exposure to the at least one of the substantial voltage and the substantial temperature and the entropy state function of the battery after exposure to the at least one of substantial voltage and the substantial temperature.

20. The device of claim 1, wherein the differential entropy of the battery is at least substantially equal to:

$$dS(x) = \Delta S_{Exp}(x) - \Delta S_0(x);$$

wherein "x" refers to the at least one of the lithium stoichiometry in the anode of the battery and the lithium stoichiometry in the cathode of the battery;

wherein "dS(x)" refers to a differential entropy state of the battery as a function of "x";

wherein "$\Delta S_{Exp}(x)$" refers to an entropy state of the battery as a function of x, after exposure to the at least one of the substantial voltage and the substantial temperature;

wherein "$\Delta S_0(x)$" refers to the entropy state of the battery as a function of x, before exposure to the at least one of the substantial voltage and the substantial temperature.

21. A method for testing a battery using a device for testing a battery, the method comprising:

determining, using a determination circuit of the device, for a plurality of charging states of the battery at least one of a derivative entropy of the battery, a differential entropy of the battery, a derivative enthalpy of the battery, and a differential enthalpy of the battery; and evaluating, using an evaluation circuit of the device, a health state of the battery based on the determined at least one of the derivative entropy, the differential entropy, the derivative enthalpy, and the differential enthalpy of the battery for the plurality of charging states of the battery, wherein:

the derivative entropy of the battery is based on an entropy state function of the battery and at least one of a lithium stoichiometry in an anode of the battery and a lithium stoichiometry in a cathode of the battery;

the differential entropy of the battery is based on the entropy state function of the battery before exposure to at least one of a substantial voltage and a substantial temperature and the entropy state function of the battery after exposure to the at least one of the substantial voltage and the substantial temperature;

the derivative enthalpy of the battery is based on an enthalpy state function of the battery and at least one of the lithium stoichiometry in the anode of the battery and the lithium stoichiometry in the cathode of the battery; and the differential enthalpy of the battery is based on the enthalpy state function of the battery before exposure to the at least one of the substantial voltage and the substantial temperature and the enthalpy state function of the battery after exposure to the at least one of the substantial voltage and the substantial temperature.

22. A device for testing a battery, the device comprising:

a determination circuit configured to determine for a plurality of charging states of the battery at least one of a derivative enthalpy of the battery and a differential enthalpy of the battery; and an evaluation circuit configured to evaluate a health state of the battery based on the determined at least one of the derivative enthalpy and the differential enthalpy of the battery for the plurality of charging states of the battery, wherein:

the derivative enthalpy of the battery is based on an enthalpy state function of the battery and at least one of a lithium stoichiometry in an anode of the battery and a lithium stoichiometry in a cathode of the battery; and the differential enthalpy of the battery is based on the enthalpy state function of the battery before exposure to at least one of a substantial voltage and a substantial temperature and the enthalpy state function of the battery after exposure to the at least one of the substantial voltage and the substantial temperature.

23. The device of claim 22, further comprising:

an entropy measuring circuit configured to measure an entropy of a new battery and to measure an entropy of a used battery;

wherein the determination circuit is further configured to determine a differential entropy of the battery based on the measurement of the entropy of the new battery and the measurement of the entropy of the used battery.

24. The device of claim 22, further comprising:

an enthalpy measuring circuit configured to measure an enthalpy of a new battery and to measure an enthalpy of a used battery;

wherein the determination circuit is further configured to determine the differential enthalpy of the battery based on the measurement of the enthalpy of the new battery and the measurement of the enthalpy of the used battery.

25. The device of claim 22, wherein the derivative enthalpy of the battery is at least substantially equal to:

a derivative of the enthalpy state function of the battery with respect to the at least one of the lithium stoichiometry in the anode of the battery and the lithium stoichiometry in the cathode of the battery.

26. The device of claim 22, wherein the derivative enthalpy of the battery is at least substantially equal to:

$$\delta H(x) = \frac{\partial \Delta H(x)}{\partial x};$$

wherein "$\Delta H(x)$" refers to an enthalpy state of the battery as a function of x;

wherein "x" refers to the at least one of the lithium stoichiometry in the anode of the battery and the lithium stoichiometry in the cathode of the battery;

wherein "$\delta H(x)$" refers to a derivative enthalpy state of the battery as a function of "x";

wherein $$\text{"}\frac{\partial \Delta H(x)}{\partial x}\text{"}$$

refers to a derivative enthalpy state function of the battery with respect to "x".

27. The device of claim 22, wherein the differential enthalpy of the battery is at least substantially equal to:

a difference between the enthalpy state function of the battery before exposure to the at least one of the substantial voltage and the substantial temperature and the enthalpy state function of the battery after exposure to the at least one of the substantial voltage and the substantial temperature.

28. The device of claim 22, wherein the differential enthalpy of the battery is at least substantially equal to:

$$dH(x) = \Delta H_{Exp}(x) - \Delta H_0(x);$$

wherein "x" refers to at the least one of the lithium stoichiometry in the anode of the battery and the lithium stoichiometry in the cathode of the battery;

wherein "dH(x)" refers to a differential enthalpy state of the battery as a function of "x";

wherein "$\Delta H_{Exp}(x)$" refers to an enthalpy state of the battery as a function of x, after exposure to the at least one of the substantial voltage and the substantial temperature;

wherein "$\Delta H_0(x)$" refers to an enthalpy state of the battery as a function of x, before exposure to the at least one of the substantial voltage and the substantial temperature.

29. A device for testing a battery, the device comprising:
a determination circuit configured to determine a plurality of differential or derivative entropies for plural charging states, respectively, of the battery; and
an evaluation circuit configured to evaluate a health state of the battery based on the determined plurality of derivative or differential entropies of the battery for the plural charging states of the battery, wherein:
the derivative entropies of the battery are based on an entropy state function of the battery and at least one of a lithium stoichiometry in an anode of the battery and a lithium stoichiometry in a cathode of the battery; and
the differential entropies of the battery are based on the entropy state function of the battery before exposure to at least one of a substantial voltage and a substantial temperature and the entropy state function of the battery after exposure to the at least one of the substantial voltage and the substantial temperature.

30. A device for testing a battery, the device comprising:
a determination circuit configured to determine a plurality of differential or derivative enthalpies for plural charging states, respectively, of the battery; and
an evaluation circuit configured to evaluate a health state of the battery based on the determined plurality of derivative or differential enthalpies of the battery for the plural charging states of the battery, wherein:
the derivative enthalpies of the battery are based on an enthalpy state function of the battery and at least one of a lithium stoichiometry in an anode of the battery and a lithium stoichiometry in a cathode of the battery; and
the differential enthalpies of the battery are based on the enthalpy state function of the battery before exposure to at least one of a substantial voltage and a substantial temperature and the enthalpy state function of the battery after exposure to the at least one of the substantial voltage and the substantial temperature.

* * * * *